US007481902B2

(12) United States Patent
Shinriki et al.

(10) Patent No.: US 7,481,902 B2
(45) Date of Patent: Jan. 27, 2009

(54) SUBSTRATE PROCESSING APPARATUS AND METHOD, HIGH SPEED ROTARY VALVE AND CLEANING METHOD

(75) Inventors: Hiroshi Shinriki, Matsudo (JP); Junichi Arami, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 322 days.

(21) Appl. No.: 10/946,511

(22) Filed: Sep. 20, 2004

(65) Prior Publication Data

US 2005/0074983 A1    Apr. 7, 2005

Related U.S. Application Data

(63) Continuation-in-part of application No. PCT/JP03/03655, filed on Mar. 25, 2003.

(30) Foreign Application Priority Data

Mar. 26, 2002  (JP)  ............................. 2002-086774

(51) Int. Cl.
*H01L 21/00* (2006.01)
*C23C 16/00* (2006.01)
*C23C 14/00* (2006.01)

(52) U.S. Cl. .................... 156/345.29; 156/345.51; 251/129.11; 251/161; 251/248; 251/56; 251/474; 118/715; 118/334

(58) Field of Classification Search ................ 137/334; 251/129.11, 161, 248, 56, 474; 392/474
See application file for complete search history.

(56) References Cited

U.S. PATENT DOCUMENTS

| | | | | | |
|---|---|---|---|---|---|
| 5,137,063 | A | * | 8/1992 | Foster et al. | 141/98 |
| 5,634,593 | A | * | 6/1997 | Jenkins | 239/69 |
| 5,994,676 | A | * | 11/1999 | Dutartre | 219/497 |
| 6,013,155 | A | * | 1/2000 | McMillin et al. | 156/345.33 |

(Continued)

FOREIGN PATENT DOCUMENTS

JP     56-120130     9/1981

(Continued)

OTHER PUBLICATIONS

Perry's Chemical Engineers' Handbook, 7th ed. (1994), p. 8-65.*

(Continued)

*Primary Examiner*—Ram N. Kackar
(74) *Attorney, Agent, or Firm*—Ladas & Parry LLP

(57) ABSTRACT

A substrate processing apparatus includes a processing vessel provided with a stage holding thereon a substrate to be processed and evacuated at an evacuation port, and a source gas supplying system that supplies plural source gases to the processing vessel separately in the form of a laminar flow, wherein the evacuation port has a slit-form shape extending in a direction generally intersecting perpendicularly to a direction of the laminar flow, the evacuation port is engaged with a valve having a valve body formed with a slit-form opening corresponding to the slit-form shape of the evacuation port, the slit-form opening being provided so as to cause a displacement with respect to the evacuation port in a direction generally intersecting perpendicularly to an extending direction of the evacuation port, the valve changing a degree of valve opening thereof via displacement of said slit-form opening.

2 Claims, 50 Drawing Sheets

U.S. PATENT DOCUMENTS 6,076,482 A * 6/2000 Ding et al. .............. 118/723 R
6,206,029 B1 * 3/2001 Onodera ..................... 137/334

FOREIGN PATENT DOCUMENTS

| JP | 02-074587 | | | 3/1990 |
|---|---|---|---|---|
| JP | 4-8872 | | | 1/1992 |
| JP | 06-089873 | | | 3/1994 |
| JP | 2000068209 | A | * | 3/2000 |
| JP | 2002-151489 | | | 5/2002 |
| WO | 99/10558 | | | 3/1999 |
| WO | 99/20925 | | | 4/1999 |
| WO | 02/09166 | A1 | | 1/2002 |
| WO | 02/15243 | A | | 2/2002 |

OTHER PUBLICATIONS

English Translation of Abstract of WO 02/15243 Dated Feb. 21, 2002.
English Translation of Abstract of WO 02/09166 Dated Jan. 31, 2002.
Patent Abstracts of Japan of JP 06-089873 Dated Mar. 29, 1994.
Patent Abstracts of Japan of JP 02-074587 Dated Mar. 14, 1990.
Patent Abstracts of Japan of JP 2002-151489 Dated May 249, 2002.
English Abstract of JP 56-120130 dated Sep. 21, 1981.

* cited by examiner

W=6mm OPEN

W=8mm OPEN

FULL OPEN
W=40mm

CLOSE
W=0mm

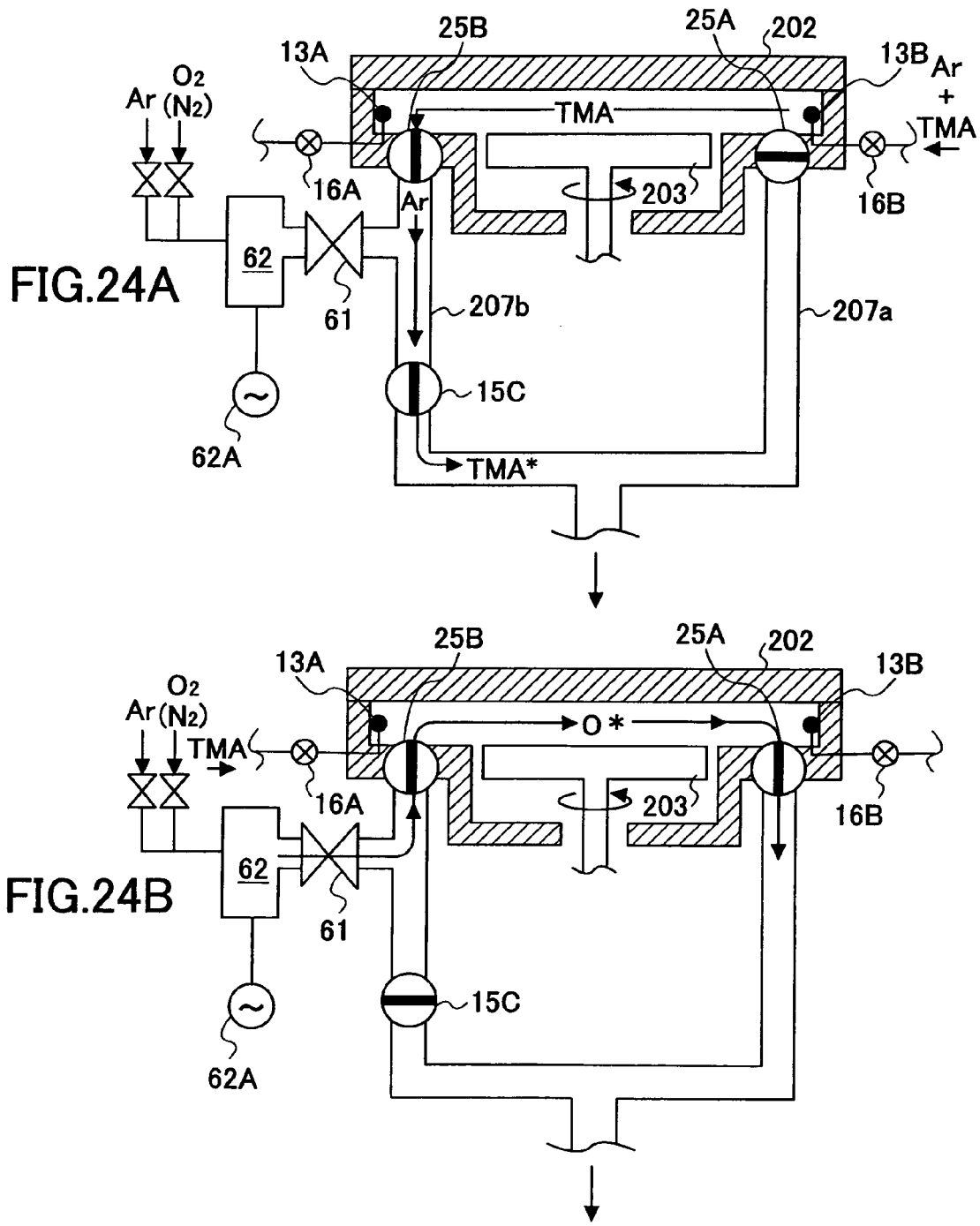

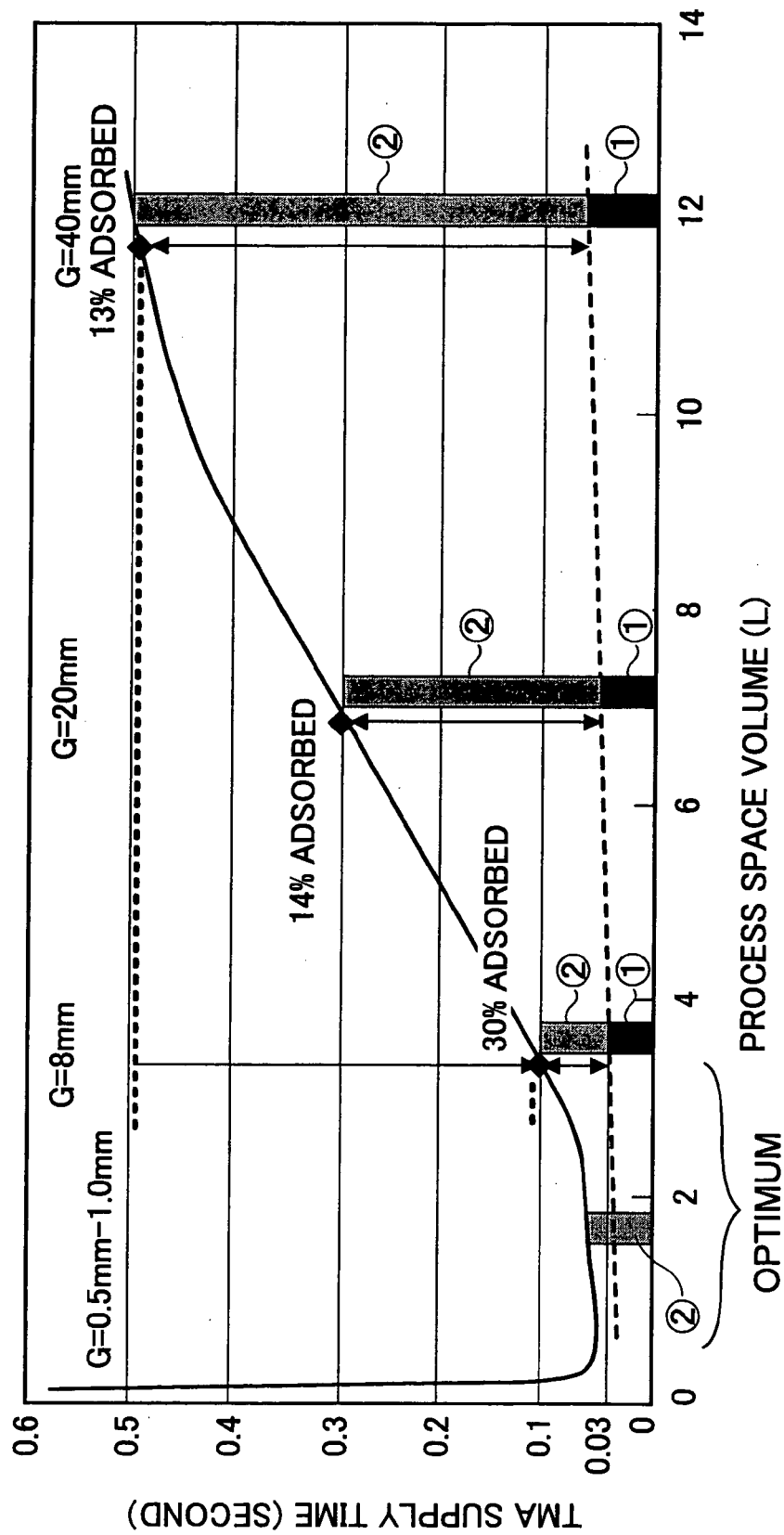

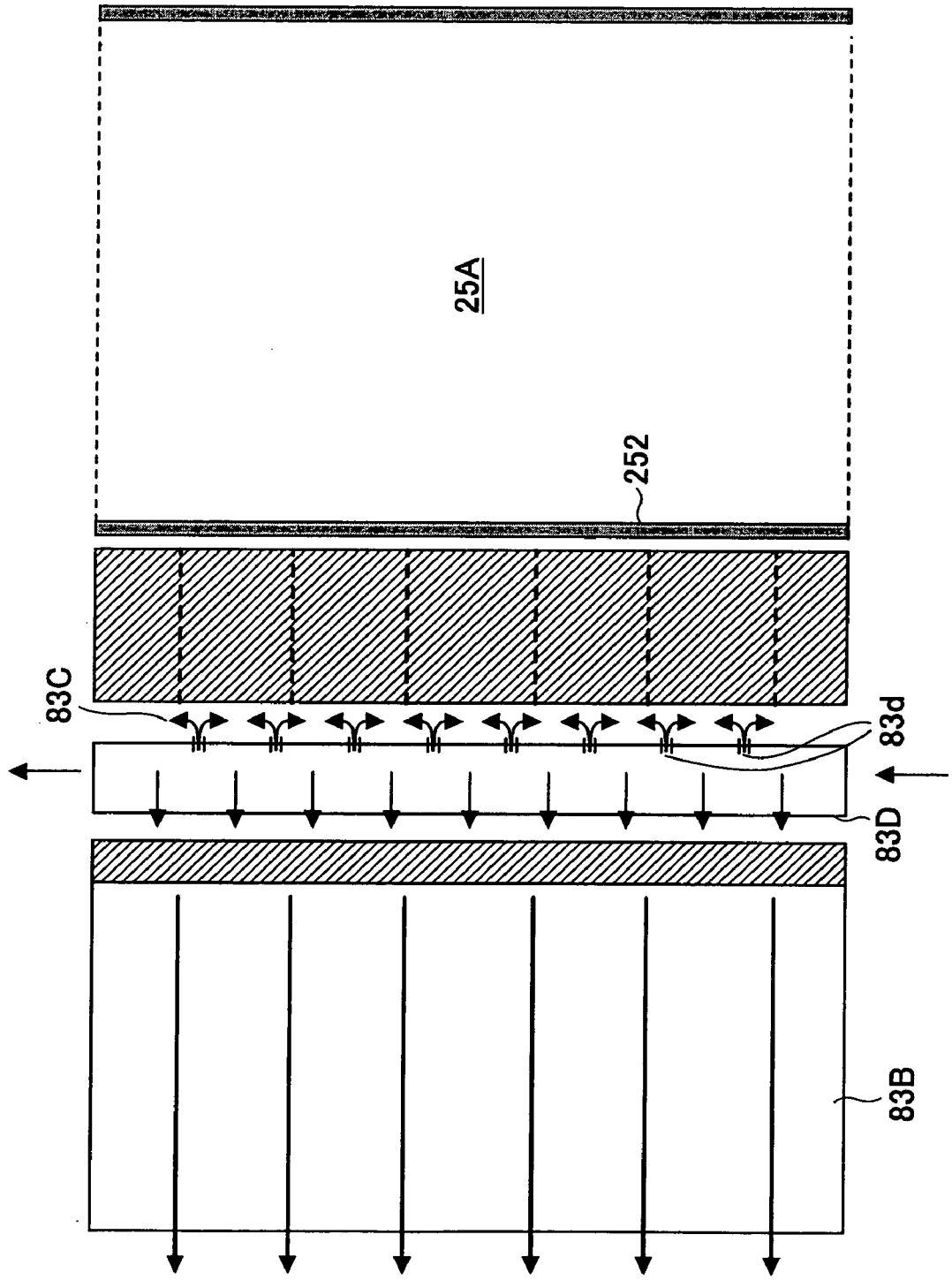

SUBSTRATE PROCESSING APPARATUS AND METHOD, HIGH SPEED ROTARY VALVE AND CLEANING METHOD

CROSS-REFERENCE TO RELATED APPLICATIONS

The present invention is a continuation-in-part application of PCT/JP03/03655 filed on Mar. 25, 2003 based on Japanese priority application 2002-086774 and Japanese non-priority basic application 2003-79501 respectively filed on Mar. 26, 2002 and Mar. 24, 2003, the entire contents of each are incorporated by reference.

BACKGROUND OF THE INVENTION

The present invention relates to semiconductor devices and particularly to a substrate processing apparatus and a substrate processing method used for production of ultrafine high-speed semiconductor devices having a high-K dielectric film.

With the progress of miniaturization process, a gate length of 0.1 μm or less is becoming possible in ultra high-speed semiconductor devices of these days. Generally, the operational speed of a semiconductor device increases with miniaturization thereof, while there is a need, in such highly miniaturized semiconductor devices, of decreasing the thickness of the gate insulation film with the decrease of the gate length achieved by device miniaturization, in accordance with a scaling law.

When the gate length has become 0.1 μm or less, on the other hand, it becomes necessary to set the thickness of the gate insulation film to 1-2 nm or less in the case of using $SiO_2$, while with such a gate insulation film of extremely small thickness, there occurs an increase of tunneling current, and the problem of increases of the gate leakage current is unavoidable.

Under such circumstances, there has been a proposal of using a high-K dielectric material such as $Ta_2O_5$, $Al_2O_3$, $ZrO_2$, $HfO_2$, $ZrSiO_4$, $HfSiO_4$, and the like, having a much larger specific dielectric constant as compared with an $SiO_2$ film and thus providing a characteristically small film thickness when converted to the film thickness of an $SiO_2$ film, in spite of the fact that the film itself has a large actual film thickness, for the gate insulation film. By using such a high-K dielectric material, it becomes possible to use a gate insulation film having the film thickness of 1-2 nm or less, even in the case the semiconductor device is an extremely minute ultra high-speed semiconductor device having a gate length of 0.1 μm or less. Thereby, gate leakage current caused by tunneling effect can be suppressed.

In order to form such a high-K dielectric gate insulation film on a Si substrate, there is a need of forming an $SiO_2$ film having a thickness 1 nm or less, typically 0.8 nm or less, on the Si substrate as a base oxide film so as to suppress diffusion of metal elements constituting a high-K dielectric gate insulation film into the Si substrate, and then form a high-K dielectric gate insulation film on such extremely thin $SiO_2$ base oxide film. Thereby, the high-K dielectric gate insulation film has to be formed such that the film does not contain defects such as interface states. Further, at the time of forming such a high-K dielectric gate insulation film on the base oxide film, it is preferable to change the composition thereof gradually from the composition primarily of $SiO_2$ to the composition primarily of the high-K dielectric, from the side thereof contacting with the base oxide film toward the principal surface of the high-K dielectric gate insulation film.

In order to form the high-K dielectric gate insulation film such that it does not contain defects, it is not possible to use plasma process that involves the process of charged particles. For example, when such a high-K dielectric gate insulation film is formed by a plasma CVD process, there are formed defects that function as the trap of hot carriers within the film as a result of the plasma damages.

On the other hand, when an attempt is made to form such a high-K dielectric gate insulation film by a thermal CVD process, there is a need of setting the substrate temperature to a high temperature, and the film easily undergoes crystallization. Thereby, there is caused an increase of surface roughness. Further, it is discovered by the inventor of the present invention that the film formation rate changes easily by the temperature of the substrate and it is difficult to achieve uniform film thickness distribution by the uniformity of the substrate temperature. In other words, there is a tendency that the roughness of the film surface increases easily when such a high-K dielectric gate insulation film is formed with a conventional CVD process. Also, it is difficult to secure uniformity of the film thickness. Thus, in the case a thermal CVD process is applied to a gate insulation film of a MOS transistor in which it is required to control the film thickness with high-precision, there is invoked a serious influence upon the operational characteristics of the semiconductor device.

PRIOR ART

Thereupon, the inventor of the present invention has proposed previously a substrate processing method and a processing apparatus to be explained below in Patent Reference 3 for overcoming the above problem.

FIG. 1 shows the construction of a substrate processing apparatus (atomic layer deposition apparatus; ALD apparatus) 10 proposed previously by the inventor of the present invention for carrying out an ALD film formation process. In the ALD film formation process, a first source gas and a second source gas are supplied to the substrate to be processed alternately in the form of laminar flow that flows along a surface of the substrate to be processed. Thereby, source gas molecules in the first source gas are adsorbed upon the substrate surface to be processed, and the adsorbed gas molecules are caused to react with source gas molecules in the second source gas. Thereby, there is formed a film with thickness of one molecular layer. By repeating this process, a high quality dielectric film, especially a high-K dielectric film, usable for a gate insulation film is formed on the surface of the substrate to be processed.

Referring to FIG. 1, the substrate processing apparatus 10 includes a processing vessel 11 provided with processing gas inlet ports 13A and 13B so as to oppose with each other across a substrate 12 to be processed, and elongated evacuation openings 14A and 14B of a slit-form shape are provided so as to oppose the processing gas inlet ports 13A and 13B respectively across the substrate 12 to be processed. The evacuation openings 14A and 14B are connected to a trap 100 respectively via conductance valves 15A and 15B, and the processing vessel 11 is evacuated through the trap 100.

Furthermore, another processing gas inlet port 13C is provided to the processing vessel 11 adjacent to the processing gas inlet port 13A so as to oppose with the evacuation opening 14A.

The processing gas inlet port 13A is connected to a first exit of a switching valve 16A, while the switching valve 16A is connected a source vessel 20A that holds $ZrCl_2$, via a first source supply line 16a, wherein the supply line 16a includes a valve 17A, a mass flow controller 18A and another valve 19A. Further, a purge line 21a including valves 21A and 22A and supplying an inert gas such as Ar is provided adjacent to the first source supply line 16a.

Furthermore, a valve purge line 23a including mass flow controllers 23A and 24A and connected to an inert gas resource of Ar, and the like, is connected to the switching valve 16A, and the second exit of the switching valve 16A is connected to the trap 100 via a purge line 100a.

Similarly, the processing gas inlet port 13B is connected to a first exit of the switching valve 16B, and the switching valve 16B is connected to a source vessel 20B holding $H_2O$ via the first source supply line 16b that includes a valve 17B, a mass flow controller 18B and another valve 19B. Further, a purge line 21b that includes valves 21B and 22B and supplies the inert gas of Ar, and the like, is provided adjacent to the first source supply line 16b.

Further, a purge line 23b including mass flow controllers 23B and 24B and connected to an inert gas resource of Ar, and the like, is connected to the switching valve 16B. The second exit of the switching valve 16B is connected to the trap 100 via a purge line 100b.

Further, the processing gas inlet port 13C is connected to the first exit of the switching valve 16C and the switching valve 16C is connected to a source vessel 20C that holds $SiCl_4$ via a first source supply line 16c, wherein the source supply line 16c includes a valve 17C, a mass flow controller 18C and another valve 19C. Further, a purge line 21c including valves 21C and 22C and supplying an inert gas of Ar, and the like, is provided adjacent to the first source supply line 16c.

Furthermore, a valve purge line 23c including mass flow rate controllers 23C and 24C and connected to an inert gas resource of Ar, and the like, is connected to the switching valve 16C. The second exit of the switching valve 16C is connected to the trap 100 via a purge line 100c.

Further, the substrate processing apparatus 10 of FIG. 1 is provided with a control unit 10A for controlling the film formation process, wherein the control unit 10A controls the switching valves 16A-16C and further the conductance valves 15A and also 15B as will be explained later with reference to FIGS. 4-7.

FIG. 2 shows details of the part that includes the processing vessel 11 of FIG. 1, wherein those parts of FIG. 2 corresponding to the parts of FIG. 1 are shown with the same reference numerals.

Referring to FIG. 2, the processing vessel 11 has an outer vessel 201 of Al, and the like, and an inner reaction vessel 202 of a quartz glass is provided therein, wherein the inner reaction vessel 202 is accommodated in a depression defined inside the outer vessel 201 and is covered by a cover plate 201A that forms a part of the outer vessel 201.

The inner reaction vessel 202 is formed of a quartz bottom plate 202A covering a bottom surface of the outer vessel 201 in correspondence to the depression and a quartz cover 202B that covers the quartz bottom plate 202A in the depression, wherein there is formed a circular opening 201D at the bottom of the outer vessel for accommodating a disk-shaped stage 203 used for holding a substrate W to be processed. Further, a heating mechanism not illustrated is provided inside the stage 203.

It should be noted that the stage 203 is held rotatably and at the same time movably in the up-and-down directions by a substrate transportation part 204 provided at a lower part of the outer processing vessel 201. Thereby, the stage 203 is held movably up and down between an uppermost processing position and a lowermost substrate in/out position, wherein the processing position is determined such that the surface of the substrate W on the stage 203 to be processed generally coincides with a surface of the quartz bottom plate 202A.

On the other hand, the foregoing substrate in/out position is set in correspondence to a substrate in/out opening 204A formed on the sidewall surface of the substrate transportation part 204, and a transportation arm 204B is inserted from the substrate in/out opening 204A in the case the stage 203 has descended to the substrate in/out position. Thereby, the arm holds the substrate W to be processed and lifted up from the surface of the stage 203 to a lifted state by lifter pins (not shown), and takes out. The arm further forwards the substrate thus taken out to a next process. Further, the transportation arm 204B introduces a new substrate W to be processed into the substrate transportation part 204 via the substrate in/out opening 204A and places the same upon the stage 203.

The stage 203 thus carrying a new substrate W to be processed is held rotatably and at the same time movably up and down by a rotary shaft 205B held by a bearing part 205 in a magnetic seal 205A, wherein the space in which the rotary shaft 205B moves up and down is hermetically sealed by a compartment wall such as bellows 206, and the like. Further, the space is evacuated to high vacuum state higher than the interior of the vessel 202 via an evacuation opening not illustrated, and the contamination to the substrate processing process carried out in the inner vessel 202 is successfully avoided.

In order to ensure such differential evacuation, the stage 203 is provided with a guard ring 203A of quartz glass such that the guard ring 203A surrounds the substrate W to be processed. It should be noted that such a guard ring 203A restricts the conductance between the stage 203 and the sidewall surface of the opening 201D formed so as to accommodate the stage in the outer vessel 201. With this, a differential pressure is formed positively with respect to the inner reaction vessel 202 in the case the space defined by the bellows 206 is evacuated to a high vacuum state.

The sidewall surface of the opening 201D formed at the bottom part of the outer vessel 201 is covered with a quartz liner 201d, wherein the quartz liner 201d extends further in the downward direction and covers the inner wall of the substrate transportation part 204.

At the bottom part of the outer vessel 201, there are formed evacuation grooves 201a and 201b connected to the respective evacuation apparatuses at both sides of the opening 201D, wherein the evacuation groove 201a is evacuated via a conduit 207a and a conductance valve 15A, while the evacuation groove 201b is evacuated via a conduit 207b and a conductance valve 15B. In the state of FIG. 2A, the conductance valve 15A is set to an opened state while the conductance valve 15B is set to a nearly closed state. In order to realize the opened and closed states with reliability, it is preferable that the conductance valves 15A and 15B are not closed completely in the closed state and maintain a degree of valve opening of about 3%.

The evacuation grooves 201a and 201b are covered with a liner 208 of a quartz glass, and there are formed slit-form openings 209A and 209B in the quartz bottom plate 202A in correspondence to the evacuation grooves 201a and 201b. In the embodiment of FIG. 2, rectification plates 209 formed with the evacuation opening 14A or 14B explained with reference to FIG. 1 are provided to such slit-form openings 209A and 209B for the purpose of facilitating the evacuation of the interior of the inner reaction vessel 202.

Further, quartz gas nozzles 13A and 13B are provided in the inner reaction vessel 202 respectively at the evacuation grooves 201a and 201b so as to face with each other across the wafer 12. Thus, the first processing gas introduced from the gas nozzle 13A flows along the surface of the substrate 12 to be processed through the inner reaction vessel 202 and is evacuated via the opposing evacuation opening 14A and through the conductance valve 15A. Similarly the second processing gas introduced from the gas nozzle 15B flows along the surface of the substrate W to be processed through the inner reaction vessel 202 and evacuated from the evacuation opening 14B via the conductance valve 15B. Thus, by flowing the first and second processing gases alternately from the gas nozzle 13A to the evacuation opening 14A or from the gas nozzle 13B to the evacuation opening 14B, it becomes possible to achieve the film formation one molecular layer by one molecular layer as explained previously.

FIG. 3 shows the construction of the quartz bottom plate 202A that constitutes the inner reaction vessel 202 in detail.

Referring to FIG. 3, there is formed an opening 202a in the quartz bottom plate 202A with a circular shape corresponding to the substrate W to be processed, and openings 209A and 209B corresponding to the evacuation grooves 201a and 201b are formed at both sides of the opening 202a. Further, in the example of FIG. 3, the rectification plates 209 having a slit constituting the evacuation opening 14A or 14B are provided in correspondence to the openings 209A and 209B. Further, the quartz bottom plate 202A is provided with an opening 210a in correspondence to the gas nozzle 13A, and an opening 210b is provided in correspondence to the gas nozzle 13B. By providing the opening 210a or 210b to the quartz bottom plate 202A with plural numbers, it becomes possible to provide the gas nozzle 13A or 13B in the inner processing vessel 202 with plural numbers.

FIG. 4 is a flowchart showing an ALD process sequence conducted in the substrate processing apparatus 10 of FIGS. 1 and 2 under control of the control unit 10A for the case of forming a $ZrO_2$ film on the substrate 12 to be processed one molecular layer by one molecular layer.

Referring to FIG. 4, the conductance valves 15A and 15B are opened in a first step 1, and the switching valves 16A and 16B are controlled to a first state, or purging state. In this state, the processing gases in the processing gas supply lines 16a and 16b are supplied to the trap 100 through the purge lines 100a and 100b, respectively, and as a result, the Ar gas in the purge line 23a and the Ar gas in the purge line 23b are supplied to the quartz reaction vessel 202 via the processing gas inlet ports 13A and 13B, respectively. The Ar purge gases thus supplied are then discharged to the trap 100 from the evacuation openings 14A and 14B.

Next, the degree of valve opening of the conductance valve 15A is increased in the step 2 and the degree of valve opening of the conductance valve 15B is decreased. As a result, there is formed a gas flow in the quartz reaction vessel 202 such that the gas flows from the gas inlet port 13A to the evacuation opening 14A.

Next, in the step 3, the switching valve 16A is switched from the first state to the second state, and the $ZrCl_4$ gas in the processing gas supply line 16a is introduced into the quartz reaction vessel 202 from the first processing gas inlet port 13A as a gas flow $LF_1$ as shown in FIG. 5. The $ZrCl_4$ gas flow $LF_1$ thus introduced forms a laminar flow flowing along the surface of the substrate 12 to be processed as explained previously and is discharged from the evacuation opening 14A. With this process, about one molecular layer of $ZrCl_4$ is absorbed upon the surface of the substrate 12 to be processed 12. In the foregoing step 3, it should be noted that the second switching valve 16B is in the first state, and thus, the Ar purge gas in the line 23a is introduced to the quartz reaction vessel 202 from the second processing gas inlet port 13B. As a result, the problem of the $ZrCl_4$ processing gas introduced from the first processing gas inlet port 13A invading into the second processing gas inlet port 13B and causing precipitation therein is avoided.

Next, the switching valve 16A is returned to the first state in the step 4 and the reaction vessel 202 is purged by the Ar gas.

Further, the degree of valve opening of the conductance valve 15A is decreased and the degree of valve opening of the conductance valve 15B is increased in the step 5. As a result, there is formed a gas flow in the quartz reaction vessel 202 from the gas inlet port 13B to the evacuation opening 14B.

Next, in the step 6, the switching valve 16B is switched from the first state to the second state, and the $H_2O$ gas in the processing gas supply line 16b is introduced into the quartz reaction vessel 202 from the second processing gas inlet port 13B as a gas flow $LF_2$ as shown in FIG. 6. The $H_2O$ gas flow $LF_2$ thus introduced forms a laminar flow flowing along the surface of the substrate 12 to be processed as explained before and is discharged from the evacuation opening 14B. With such a process, $ZrCl_4$ adsorbed to the surface of the substrate 12 to be processed 12 is subjected to hydrolysis, and the $ZrO_2$ film is formed with the thickness of about one molecular layer. In foregoing step 6, it should be noted that the first switching valve 16A is in the first state, and thus, the Ar purge gas in the line 23a is introduced into the quartz reaction vessel 202 from the second processing gas inlet port 13A. As a result, the problem of the $H_2O$ gas thus introduced from the second processing gas inlet port 13B invading into the first processing gas inlet port 13A and causing precipitation therein is successfully avoided.

It should be noted that the gas nozzles 13A and 13B are formed to have an elongate nozzle opening of the slit form and that the evacuation openings 14A and 14B are formed to have a corresponding elongate slit form, in view of the fact that it is desirable with such an ALD process to form a laminar flow of the source gas in the quartz reaction vessel 202.

Because of this, the purge gas is evacuated from the evacuation openings 14A and 14B at the time of purging the reaction vessel 202 in the step 1 of FIG. 4. On the other hand, it should be noted that the conductance of the evacuation openings 14A and 14B of the slit form is limited. Thus, in the case the substrate processing apparatus 10 is the one designed for processing a large diameter substrate such as a wafer of 30 cm diameter, for example, as the substrate 12 to be processed 12, a long time is needed for evacuating the reaction vessel 202 of large volume, even in the case the conductance valves 15A and 15B are fully opened. Thereby, the throughput of the substrate processing is deteriorated inevitably. On the other hand, in the case the opening area of the evacuation openings 14A and 14B, especially the width thereof in the gas flow direction, is increased for improving the efficiency of evacuation, the flow of the source gas in the reaction vessel 202 becomes turbulent, and there is a possibility that the adsorption of the source gas of one molecular layer may not be achieved with reliability.

Further, in the ALD process that uses $H_2O$ for the oxidation of the adsorbed metal molecule specie such as $ZrCl_4$, there is a tendency that $H_2O$ easily cause absorption upon the processing vessel inner wall or the switching valves 16A and 16B, and because of this, it becomes necessary to carry out a long purging process in the step S1 in the case $H_2O$ is introduced into the processing vessel from the switching valve 16B in the step S6 of FIG. 4. As a result, it has been difficult, in the film formation processing conducted by the so-called atomic layer ALD apparatus that relies upon adsorption of molecular layers, to improve the throughput of the substrate processing as compared with the film formation processing by a conventional CVD apparatus.

In United States Patent 516,365, there is disclosed a construction of a CVD apparatus that introduces a gaseous source from an end of the processing vessel holding the substrate to be processed horizontally and evacuating from the other end, wherein there is provided a radical source as one of the source supplies.

Thereupon, it is conceivable, in the substrate processing apparatus of FIG. 2, to oxidize the metal molecular layer absorbed on the surface of the substrate to be processed, by using oxygen radicals supplied from a radical source. With the apparatus of FIG. 2, however, the height of the reaction vessel 202 is very small in view of the need of forming a laminar flow of the gaseous source in the reaction vessel 202, and it is difficult to provide such a radical source.

Further, it should be noted that the foregoing United States Patent 516,365 has a construction in which such a radical source is connected to a part of the source supply line via a valve. Thus, when an attempt is made to use such a construction in the substrate processing apparatus of the type of the present invention in which the gaseous sources are supplied alternately, there arises a need of switching the processing gas and the radicals repeatedly in the processing vessel within a short time period, preferably 0.1 second or less. However, the technology enabling such high speed switching of gas has not been known conventionally.

Meanwhile, it is generally necessary in a deposition apparatus to remove precipitates deposited inside the processing vessel or reaction vessel at the time of film formation, by carrying out a cleaning process periodically. For the purpose of such a cleaning process, a gas of chlorine type or fluorine type has been used conventionally. Particularly, the efficiency of the cleaning process can be improved significantly by using radicals formed by activating such a cleaning gas by plasma.

In the substrate processing apparatus 10 designed for the ALD process of FIGS. 1 and 2, on the other hand, the height of the quartz reaction vessel 202 is limited to only about 5-20 mm at the largest in view of the need of forming a laminar flow in the reaction vessel 202, and it has been difficult to provide a radical source as explained before. Because of this, it has been difficult to carry out cleaning by using the radicals in the substrate processing apparatus 10.

SUMMARY OF THE INVENTION

Accordingly, it is a general object of the present invention to provide a novel and useful substrate processing apparatus and a valve apparatus used in such a substrate processing apparatus wherein the foregoing problems are eliminated.

Another and more specific object of the present invention is to provide a substrate processing apparatus for carrying out an ALD process wherein it is possible to set the conductance of an evacuation port evacuating a reaction vessel to have a small value during the ALD process such that there is formed a stable source gas flow in the form of laminar flow or stratiform flow in the reaction vessel and wherein it is possible to set the conductance to have a large value during a purging process such that the interior of the reaction vessel is purged in a short time period, and further to provide a high-speed variable conductance valve apparatus used with such a substrate processing apparatus.

Another object of the present invention is to provide a substrate processing apparatus carrying out adsorption and oxidation of molecular layers alternately and repeatedly wherein the throughput of substrate processing is improved by carrying out the oxidation by using radicals excited by plasma, and a substrate processing method that uses such a substrate processing apparatus.

Another object of the present inventions is to provide a substrate processing apparatus and a substrate processing method capable of carrying out cleaning efficiently by using radicals in the substrate processing apparatus that carries out an ALD process.

Another object of the present invention is to provide a substrate processing apparatus, characterized by:

a processing vessel provided with a stage holding thereon a substrate to be processed and evacuated at an evacuation port; and a source gas supplying system that supplies plural source gases to said processing vessel separately in the form of a laminar flow, wherein said evacuation port has a slit-form shape extending in a direction generally intersecting perpendicularly to a direction of said laminar flow, said evacuation port is engaged with a valve having a valve body formed with a slit-form opening corresponding to said slit-form shape of said evacuation port, said slit-form opening being provided so as to cause a displacement with respect to said evacuation port in a direction generally intersecting perpendicularly to an extending direction of said evacuation port, said valve changing a degree of valve opening thereof via displacement of said slit-form opening.

Another object of the present invention is to provide a substrate processing apparatus, characterized by:

a processing vessel provided with a stage holding thereon a substrate to be processed;

a processing gas inlet port formed in said processing vessel at a first side of said stage;

a radical source formed on said processing vessel at a second side different from said first side with respect to said stage;

a first evacuation opening formed in said processing vessel at said first side;

a second evacuation opening formed in said processing vessel at said second side; and an evacuation system connected to said first evacuation opening via a first variable conductance valve and connected to said second evacuation opening via a second variable conductance valve.

Another object of the present invention is to provide a substrate processing apparatus, characterized by:

a processing vessel provided with a stage holding thereon a substrate to be processed and evacuated at an evacuation port;

a first source supply nozzle formed in said processing vessel at a first side of said stage, said first source supply nozzle introducing a first processing gas into said processing vessel in the form of a first laminar flow;

a second source supply nozzle formed in said processing vessel at a second side of said stage, said second source supply nozzle introducing a second processing gas into said processing vessel in the form of a second laminar flow;

a first evacuation opening of a slit-form formed in said processing vessel at said second side, said first evacuation opening evacuating said first laminar flow therethrough;

a second evacuation opening of a slit form formed in said processing vessel at said first side, said second evacuation opening evacuating said second laminar flow therethrough;

a first evacuation conduit connected to said first evacuation opening;

a second evacuation conduit connected to said second evacuation opening and provided with a conductance variable valve; and a cleaning gas source connected to said second evacuation conduit at a position between said second opening and said conductance variable valve.

Another object of the present invention is to provide a high-speed rotary valve, characterized by:

a main body, said main body being formed with: a cylindrical internal space; a slit-form suction port extending parallel to said cylindrical internal space in communication with said internal space; and an evacuation opening communicating with said internal space;

a hollow cylindrical valve body provided rotatably in said main body in engagement with said internal space; and a rotating mechanism causing said valve body to rotate to an arbitrary position, said valve body being formed with a first opening having a slit-form shape corresponding to said suction port, and a second opening corresponding to the said evacuation opening.

Another object of the present invention is to provide a substrate processing method, characterized by the steps of:

(A) purging an interior of a processing vessel;

(B) introducing a processing gas into said processing vessel from a first side of a substrate to be processed and evacuating, after processing gas molecules are adsorbed to a surface of said substrate to be processed, said processing gas from a second side opposite to said first side with respect to said substrate to be processed;

(C) purging, after said step (B), an interior of said processing vessel; and (D) introducing, after said step (C), radicals into said processing vessel from said side of said substrate to be processed, causing oxidation in said processing gas molecules absorbed upon said surface of said substrate to be processed, and causing evacuation from said second side, said radicals being formed by a radical source, said radicals being caused to flow in said steps (A) and (C) to flow from said radical source to an evacuation system and supplied to said processing vessel in said step (D).

Another object of the present invention is to provide a substrate processing method, characterized by the steps of:

causing to flow a processing gas in a processing vessel along a surface of a substrate to be processed and held in said processing vessel from a first side to a second side oppose to said first side and causing adsorption of processing gas molecules upon said surface of said substrate to be processed;

purging an interior of said processing vessel inside; and oxidizing said processing gas molecules adsorbed upon said surface of said substrate to be processed by causing to flow an oxidation processing gas in said processing vessel along said surface of said substrate to be processed from said first side to said second side, wherein there is provided a step of activating said oxidation processing gas in said processing vessel at said first side by an ultraviolet optical excitation process to form radicals.

Another object of the present invention is to provide a substrate processing method conducted by a substrate processing apparatus, said substrate processing apparatus comprising a processing vessel provided with a stage holding thereon a substrate to be processed and evacuated at an evacuation port, and a source gas supply system supplying first and second source gases to said processing vessel separately in the form of a laminar flow, said evacuation port having a slit-form shape extending in a direction intersecting generally perpendicularly to a direction of said laminar flow; said evacuation port being engaged with a valve having a valve body provided with a slit-form opening corresponding to said slit-form shape of said evacuation port; said slit-form opening being provided so as to cause a displacement with respect to said evacuation port in a direction generally intersecting perpendicularly to an elongating direction of said evacuation port; said valve changing a degree of valve opening thereof with displacement of said slit-form opening; said evacuation port comprising first and second evacuation ports provided respectively at first and second, mutually opposing end parts of said processing vessel; in each of said first and second evacuation ports, said valve body being formed of a hollow cylindrical member rotatable about a rotational axis extending parallel to an extending direction of said evacuation ports and formed with first, second and third openings each extending in a direction of said rotational axis; in said first and second ends of said processing vessel, there are provided first and second nozzles of a birds beak form respectively extending from said first and second evacuations ports toward said substrate to be processed at a part closer to said substrate to be processed on said stage with respect to said first and second evacuation port as said source gas supply; said substrate processing apparatus having a radical source coupled to said first evacuation port; in said first evacuation port, said first through third openings being formed in such a positional relationship that, in a first state in which said first opening communicates with said first evacuation conduit that evacuates said processing vessel at said first end part, said second opening communicates with said first end and said third opening is closed; said first through third openings being further formed with such a positional relationship that, in a second state in which said first opening is communicating with said radical source, said third opening communicates with said first end part and said second opening is closed; in said second evacuation port, said first through third openings being formed with such a positional relationship that, in a third state in which said first opening is communicating with said second evacuation conduit that evacuates said processing vessel at said second end part, said second opening communicates with said second end part and said third opening is closed; said first through third openings being formed with such a positional relationship that, in a fourth state in which said first and second slit-form openings are closed, said third slit-form opening is formed with such a positional relationship said third slit-form opening communicates with said second nozzle; a gas supply line is provided in said hollow cylinder member constituting said valve body at said second evacuation port;

said substrate processing method comprising:

a first step of setting said first evacuation port and said second evacuation port respectively to said first and third states and evacuating a processing space inside said processing vessel;

a second step of setting said first evacuation port and said second evacuation port respectively to said first and fourth states and introducing a source gas into said processing vessel from said gas supply line via said third opening and also said second nozzle of said second evacuation port;

a third step of setting said first evacuation port and said second evacuation port respectively to said first and third states and evacuating said processing space inside said processing vessel; and a fourth step of setting said first evacuation port and said second evacuation port respectively to said second state and said third state and introducing radicals into said processing vessel from said radical source.

Another object of the present invention is to provide a substrate processing method conducted by a substrate processing apparatus, said substrate processing apparatus comprising a processing vessel provided with a stage holding thereon a substrate to be processed and evacuated at an evacuation port, and a source gas supply system supplying first and second source gases to said processing vessel separately in the form of a laminar flow, said evacuation port having a slit-form shape extending in a direction intersecting generally perpendicularly to a direction of said laminar flow; said evacuation port being engaged with a valve having a valve body provided with a slit-form opening corresponding to said slit-form shape of said evacuation port; said slit-form opening being provided so as to cause a displacement with respect to said evacuation port in a direction generally intersecting perpendicularly to an elongating direction of said evacuation port; said valve changing a degree of valve opening thereof with displacement of said slit-form opening; said evacuation port being formed as first and second evacuation ports provided respectively at first and second, mutually opposing end parts of said processing vessel; in each of said first and second evacuation ports, said valve body being formed of a hollow cylindrical member rotatable about a rotational axis extending parallel to an extending direction of said evacuation ports and formed with first, second and third openings each extending in a direction of said rotational axis; in said first and second ends of said processing vessel, there are provided first and second nozzles of a birds beak form extending from respective corresponding evacuations ports toward said substrate to be processed at a part closer to said substrate to be processed on said stage with respect to said first and second evacuation port as said source gas supply; a source gas line and a purge gas line are provided to each of said first and second nozzles; in said first evacuation port, said first through third openings being formed in such a positional relationship that, in a first state in which said third opening communicates with said first evacuation conduit that evacuates said processing vessel at a side of said first end part, said first opening communicates with said first end and said second opening communicates with said first nozzle; said first through third openings being further formed with such a positional relationship that, in a second state in which said first opening communicates with said first evacuation conduit, neither of said second and third openings communicates with any of said first end part, said first nozzle or said first evacuation conduit; in said second evacuation port, said first through third openings being formed with such a positional relationship that, in a third state in which said third opening is communicating with said second evacuation conduit that evacuates said processing vessel at said second end part, said first opening communicates with said second end part and said second opening communicates with said second nozzle; said first through third openings being formed with such a positional relationship that, in a fourth state in which said first opening communicates with said second evacuation conduit, neither of said second and third openings communicate with any of said second nozzle or said second evacuation conduit, said substrate processing method comprising:

a first step of setting said first evacuation port and said second evacuation port respectively to said first and third states and evacuating interior of said processing vessel;

a second step of setting said first evacuation port and said second evacuation port respectively to said first and fourth states and introducing said second source gas to said processing vessel from said second nozzle;

a third step of setting said first evacuation port and said second evacuation port to respectively said first and fourth states and introducing a purge gas into said processing vessel from said second nozzle;

a fourth step of setting said first evacuation port and said second evacuation port respectively to said second and also third states and evacuating interior of said vessel;

a fifth step of setting said first evacuation port and said second evacuation port to respectively said second and third states and introducing said second source gas to said processing vessel from said first nozzle; and a sixth step of setting said first evacuation port and said second evacuation port respectively to said second and third states and introducing said purge gas into said processing vessel from said first nozzle.

Another object of the present invention is to provide a substrate processing method conducted by a substrate processing apparatus, said substrate processing apparatus comprising a processing vessel provided with a stage holding thereon a substrate to be processed and evacuated at an evacuation port, and a source gas supply system supplying first and second source gases to said processing vessel separately in the form of a laminar flow, said evacuation port having a slit-form shape extending in a direction intersecting generally perpendicularly to a direction of said laminar flow; said evacuation port being engaged with a valve having a valve body provided with a slit-form opening corresponding to said slit-form shape of said evacuation port; said slit-form opening being provided so as to cause a displacement with respect to said evacuation port in a direction generally intersecting perpendicularly to an elongating direction of said evacuation port; said valve changing a degree of valve opening thereof with displacement of said slit-form opening; said evacuation port being formed as first and second evacuation ports provided respectively at first and second, mutually opposing end parts of said processing vessel; said substrate processing apparatus having a radical source coupled to said second evacuation port; in each of said first and second evacuation ports, said valve body being formed of a hollow cylindrical member rotatable about a rotational axis extending parallel to an extending direction of said evacuation ports and formed with first, second and third openings each extending in a direction of said rotational axis; in said first and second ends of said processing vessel, there are provided first and second nozzles of a birds beak form extending from respective corresponding evacuations ports toward said substrate to be processed at a part closer to said substrate to be processed on said stage with respect to said first and second evacuation port as said source gas supply; a source gas line and a purge gas line are provided to each of said first and second nozzles; in said first evacuation port, said first through third openings being formed in such a positional relationship that, in a first state in which said third opening communicates with said first evacuation conduit that evacuates said processing vessel at a side of said first end part, said first opening communicates with said first end and said second slit-form opening communicates with said first nozzle; said first through third openings being further formed with such a positional relationship that, in a second state in which said first opening communicates with said first evacuation conduit, neither of said second and third openings communicate with any of said first end part, said first nozzle or said first evacuation conduit; in said second evacuation port, said first through third openings being formed with such a positional relationship that, in a third state in which said second opening communicates with said second evacuation conduit that evacuates said processing vessel at said second end part, said first opening communicates with said second end part and said third opening communicates with neither of said second nozzle or said radical source; said first through third openings being formed with such a positional relationship that, in a fourth state in which said third opening communicates with said second evacuation conduit, said second opening communicates with said second end part and said first opening communicate with said radical source; said first through third openings being formed with such a positional relationship that, in a fifth state in which said first opening communicates with said second evacuation conduit, said third opening communicates with said radical source; said first through third openings being formed with such a positional relationship that, in a sixth state in which said third opening communicates with said second end, said second opening communicates with said radical source;

said substrate processing method comprising:

a first step of setting said first evacuation port and said second evacuation port to said first state and said third state and evacuating interior of said processing vessel;

a second step of setting said first evacuation port and said second evacuation port respectively to said second state and said fourth state and supplying said first source gas to said processing vessel from said first nozzle;

a third step of setting said first evacuation port and said second evacuation port respectively to said second state and said third state and introducing a purge gas to said processing vessel from said first nozzle;

a fourth step of setting said first evacuation port and said second evacuation port respectively to said first state and said third state and evacuating interior of said processing vessel;

a fifth step setting said first evacuation port and said second evacuation port respectively to said first state and said sixth state and introducing radicals to said processing vessel from said radical source; and a sixth step of setting said first evacuation port and said second evacuation port respectively to said first state and said sixth state and introducing a purge gas to said processing vessel from said radical source.

Another object of the present invention is to provide a cleaning method of a substrate processing apparatus, said substrate processing apparatus comprising: a processing vessel provided with a stage holding thereon a substrate to be processed and evacuated at first and second evacuation ports provided respectively to a first side and a second side of said stage; and a source gas supply system supplying first and second source gases alternately respectively from said second side to said first side and from said first side to said second side in the form of a laminar flow, wherein there is provided a step of introducing a cleaning gas, in a state said processing vessel is evacuated at said first evacuation opening, into said processing vessel through said second evacuation opening from an evacuation conduit connected to said second evacuation opening.

According to the present invention, the conductance of evacuation opening provided to a processing vessel is controlled, in an ALD deposition apparatus achieves film growth by switching source gases alternately, variably by a high-speed rotary valve provided to the processing vessel. Thereby, a film growth of one molecular layer is achieved stably by controlling the conductance to a specified value. Further, by controlling the conductance to the maximum, it become possible to purge the interior of the processing vessel with high speed, and it becomes possible to perform the film growth efficiently while using an ALD process. Further, according to the present invention, it becomes possible to change the conductance of the evacuation opening continuously, and hence according to the used source gas. Thereby, the ALD process is stabilized further.

Other objects and further features of the present invention will become apparent from the following detailed description when read in conjunction with the attached drawings.

BRIEF DESCRIPTION OF THE DRAWINGS

FIGS. 24A and 24B are diagrams showing another modification of the fifth embodiment;

FIG. 45 is a diagram explaining the operation of the deposition apparatus of FIG. 43;

FIG. 47 is another diagram showing a part of the deposition apparatus according to the eleventh embodiment of the present invention;

BEST MODE FOR IMPLEMENTING THE INVENTION

First Embodiment

Figure 7:
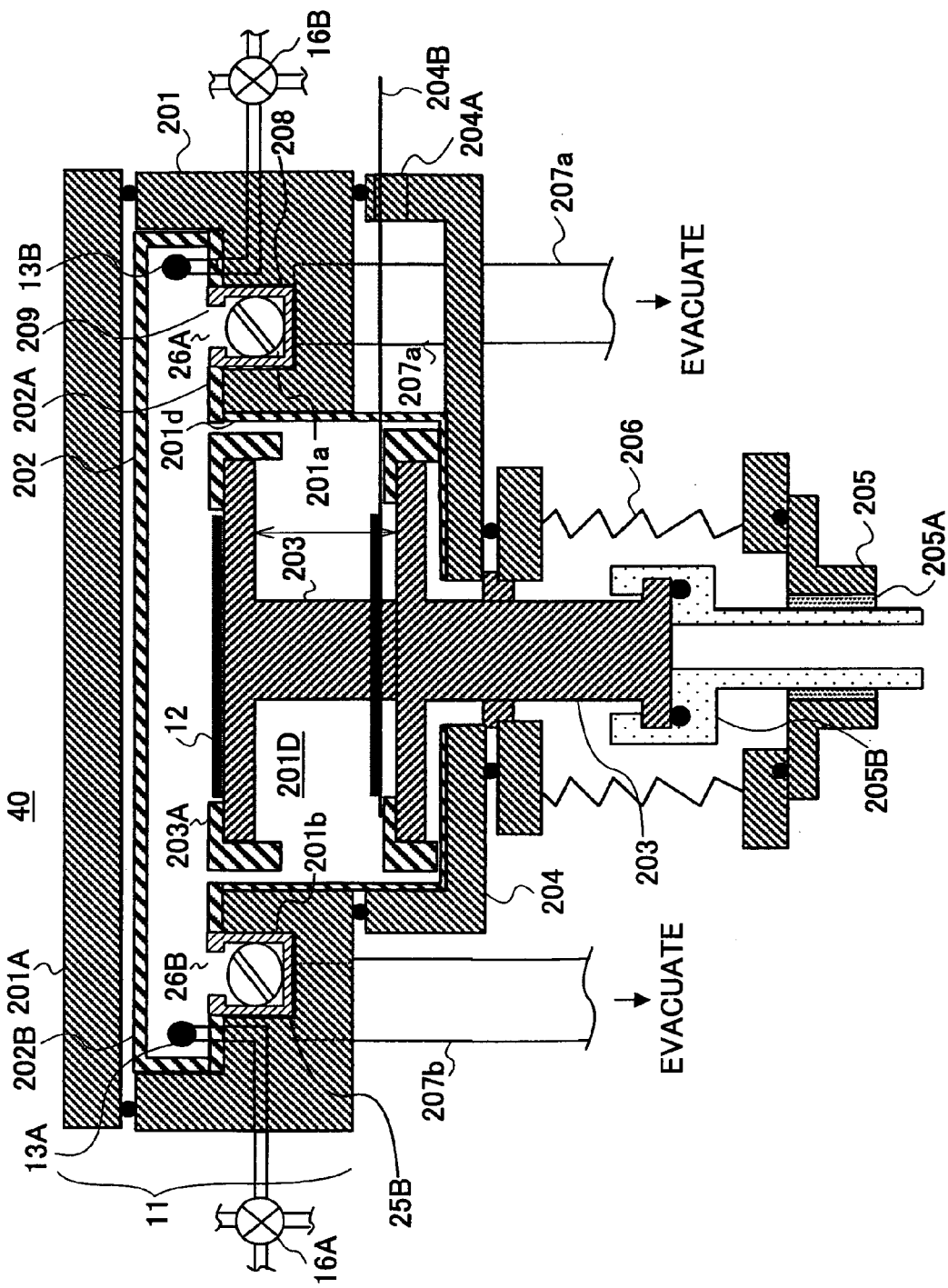
FIG. 7 is a diagram showing the construction of a processing vessel used with an ALD deposition apparatus according to a first embodiment of the present invention.

FIG. 7 shows the construction of a substrate processing apparatus (atomic layer deposition apparatus) 40 according to a first embodiment of the present invention, wherein those parts explained previously are designated by the same reference numerals and the description thereof will be omitted.

Figure 1:
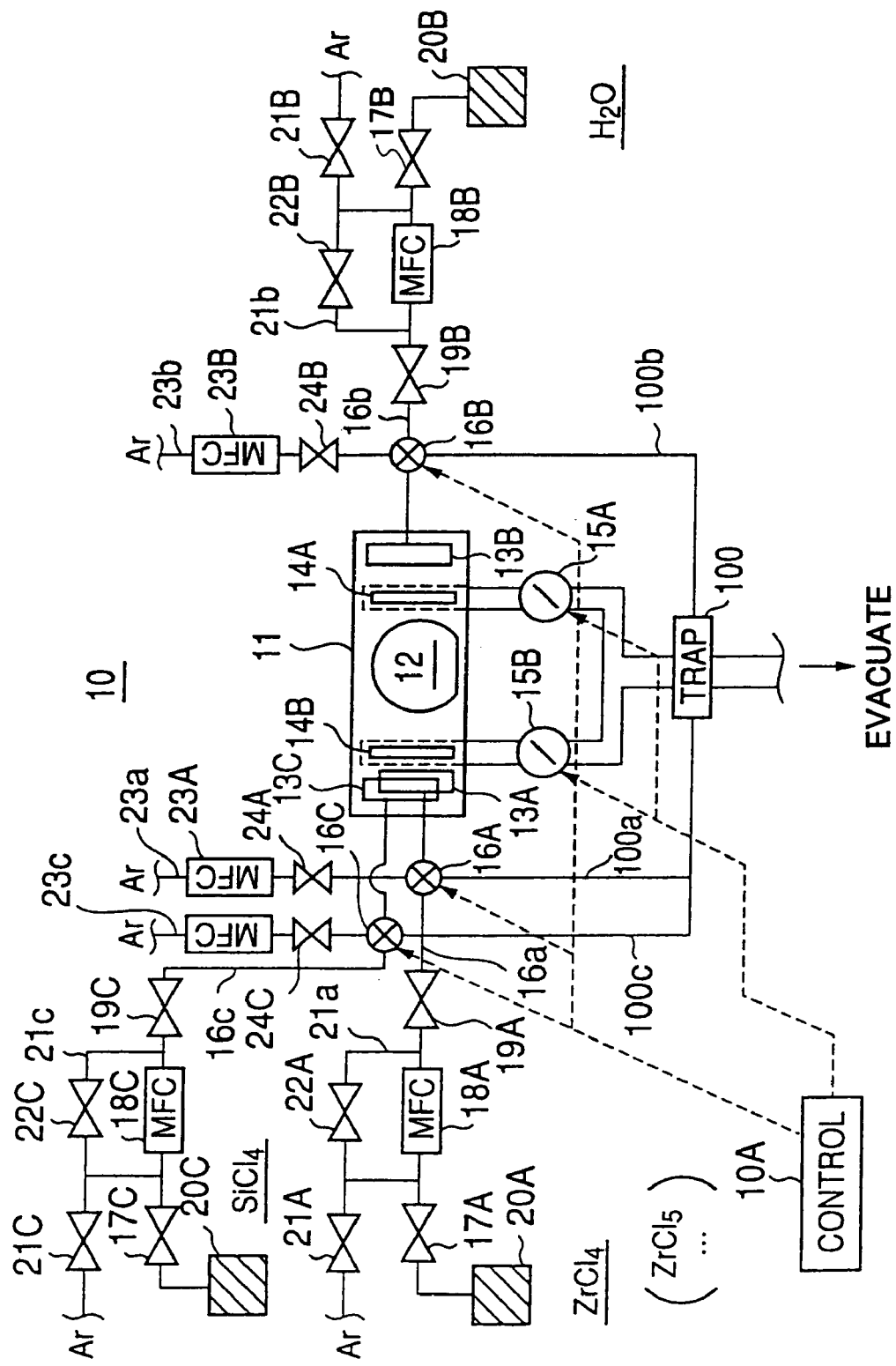
FIG. 1 is a diagram showing the outline of a conventional ALD deposition apparatus.
Figure 2:
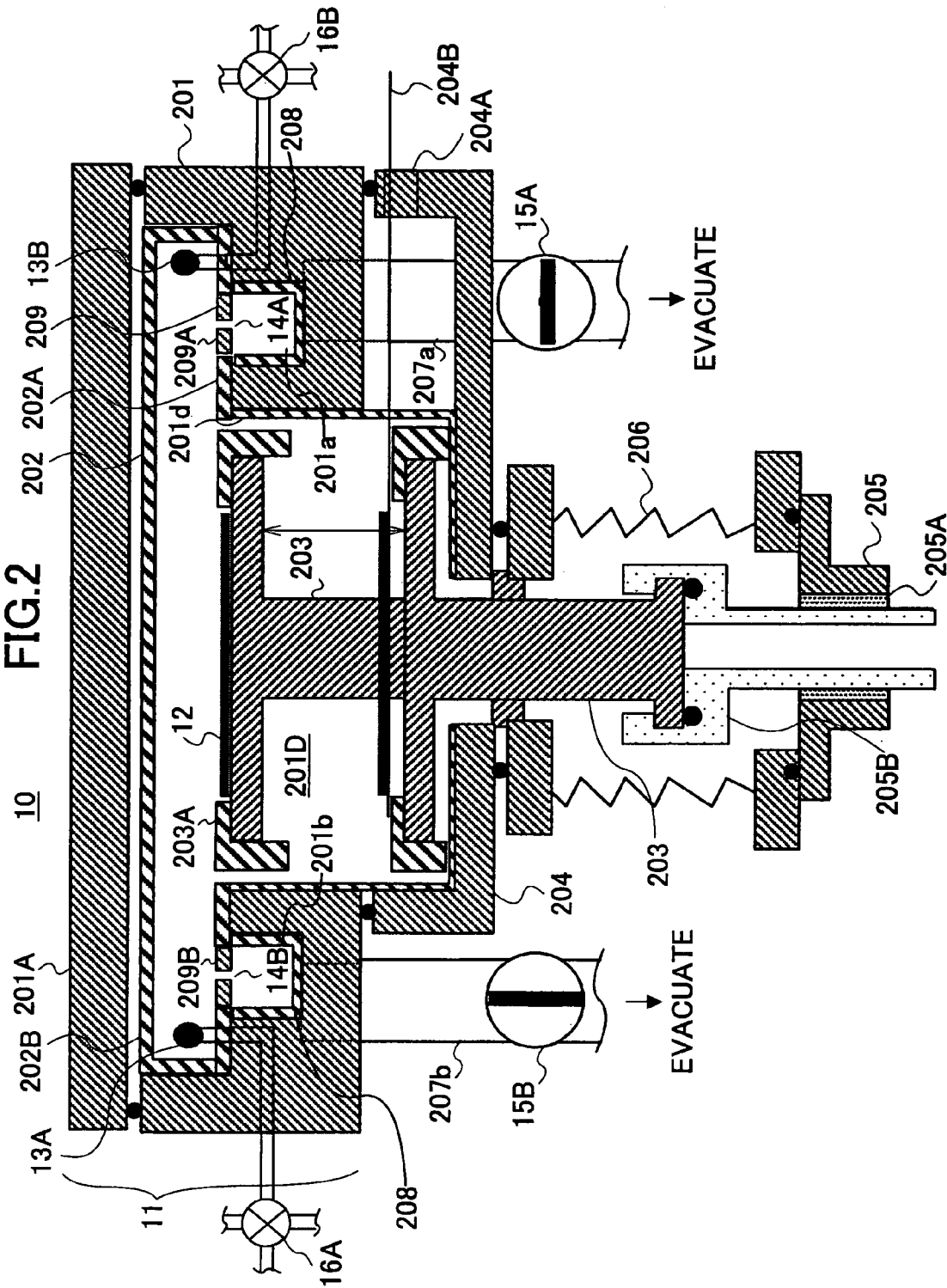
FIG. 2 is a diagram showing the construction of a processing vessel used with the ALD deposition apparatus of FIG. 1.
Figure 3:
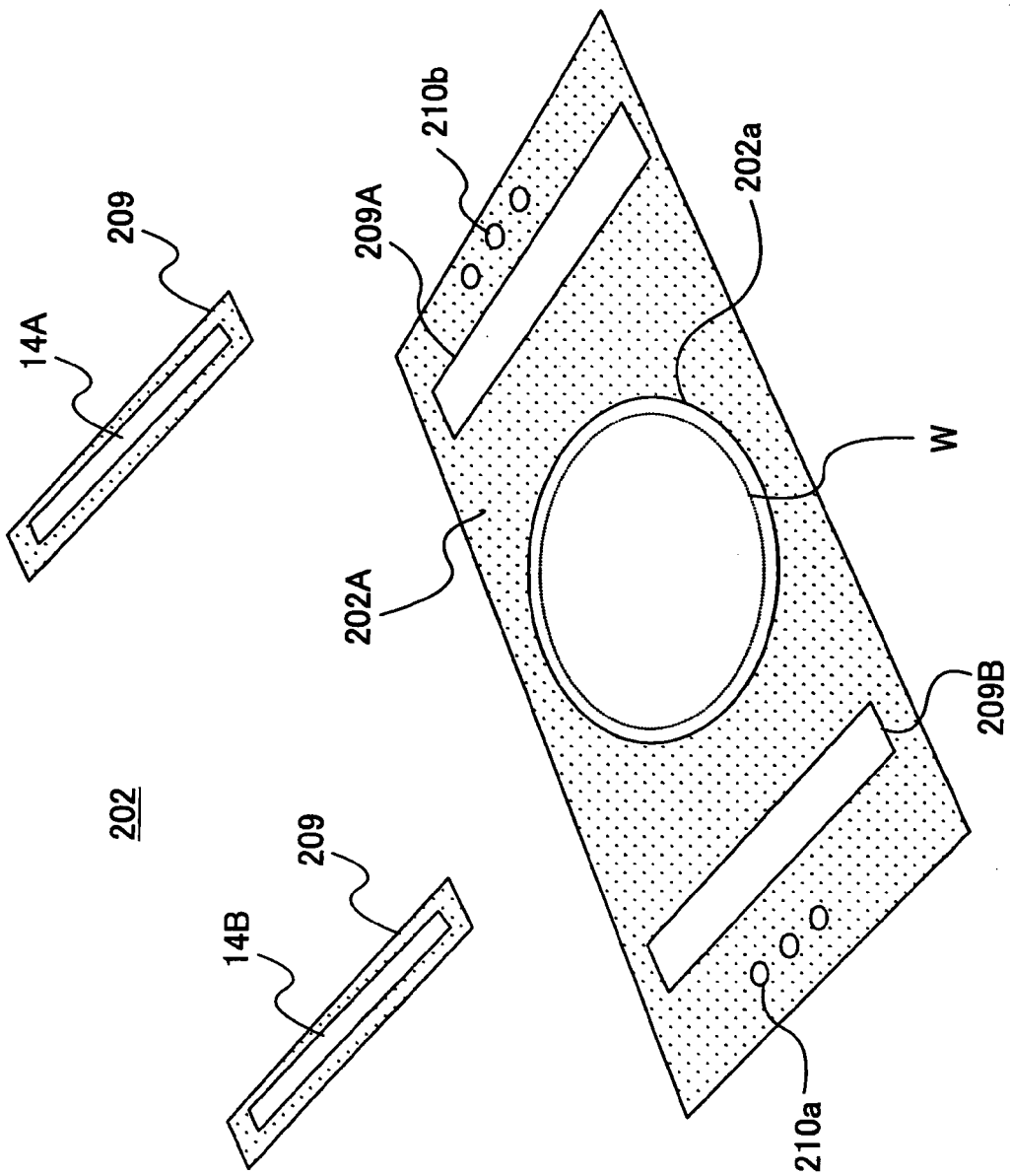
FIG. 3 is a diagram showing a part of the processing vessel of FIG. 2 in detail.
Figure 4:
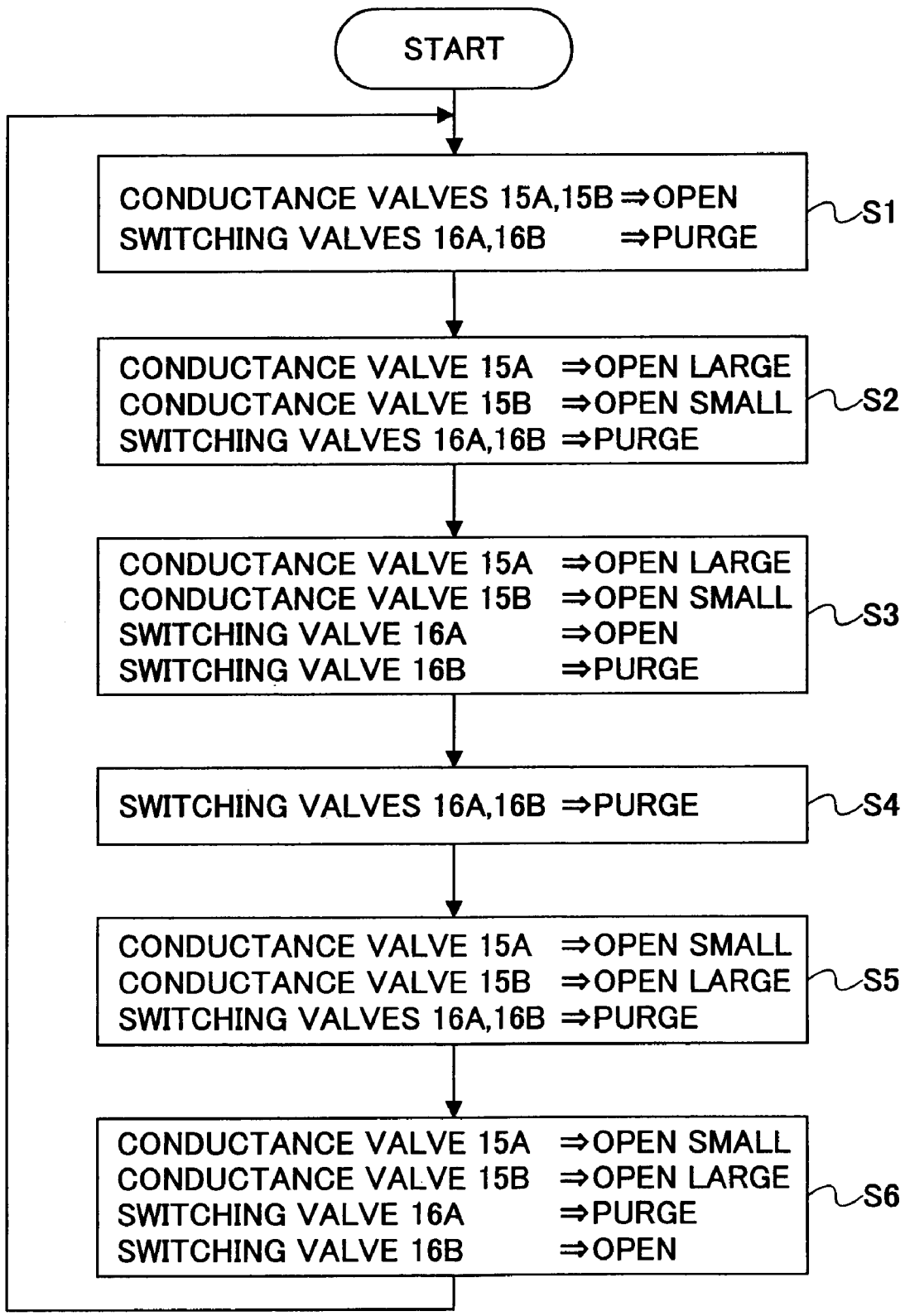
FIG. 4 is a flowchart that showing an example of the ALD process achieved by using the ALD apparatus of FIG. 1.

Referring to FIG. 7, the conductance valves 15A and 15B used with the substrate processing apparatus 10 explained with reference to FIG. 1 through 3 are taken away in the present embodiment, and high-speed rotary valves 25A and 25B are provided in place thereof in an evacuation groove 201a or 201b adjacent to the evacuation openings 14A and 14B. Further, the high-speed rotary valves 25A and 25B are connected to the trap 100 via conduits 207a and 207b respectively.

Figure 8:
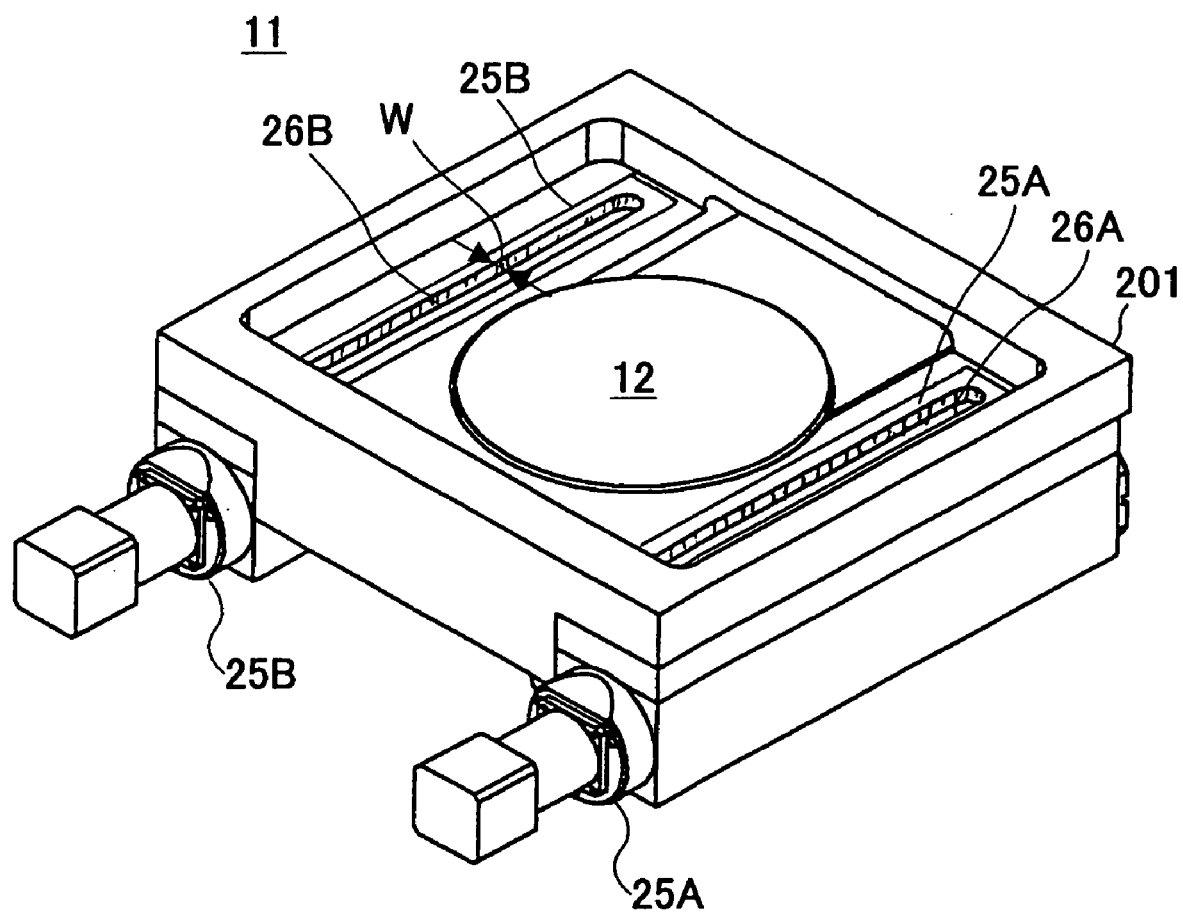
FIG. 8 is an oblique view diagram showing the construction of the processing vessel of FIG. 7.

FIG. 8 shows the construction of the processing vessel 11 in the state that the quartz bottom plate 202A of FIG. 3 is taken away.

Referring to FIG. 8, there is formed a space in an outer vessel 201 constituting the processing vessel 11 for accommodating therein a quartz reaction vessel 202, wherein the surface of the substrate 12 to be processed is exposed to the foregoing space, and there are provided the high-speed rotary valves 25A and 25B having evacuation opening 26A and 26B at both sides of the substrate 12 to be processed in place of the evacuation openings 14A and 14B explained previously. In the present embodiment, the width W as measured in the direction perpendicular to the flow of the source gas is substantially largely with the evacuation openings 26A and 26B as compared with the conventional evacuation openings 14A and 14B, and as a result, it becomes possible to evacuate a large amount of gas efficiency from the quartz reaction vessel 202 through such evacuation openings 26A and 26B.

Figure 9A:
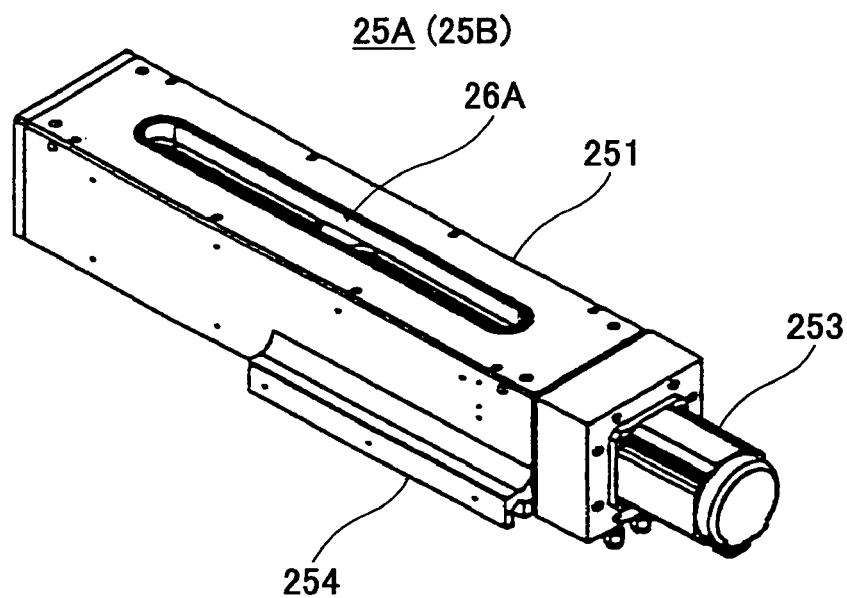
FIGS. 9A and 9B are oblique view diagrams showing the construction of a high speed rotary valve used in the processing vessel of FIG. 7.
Figure 9B:
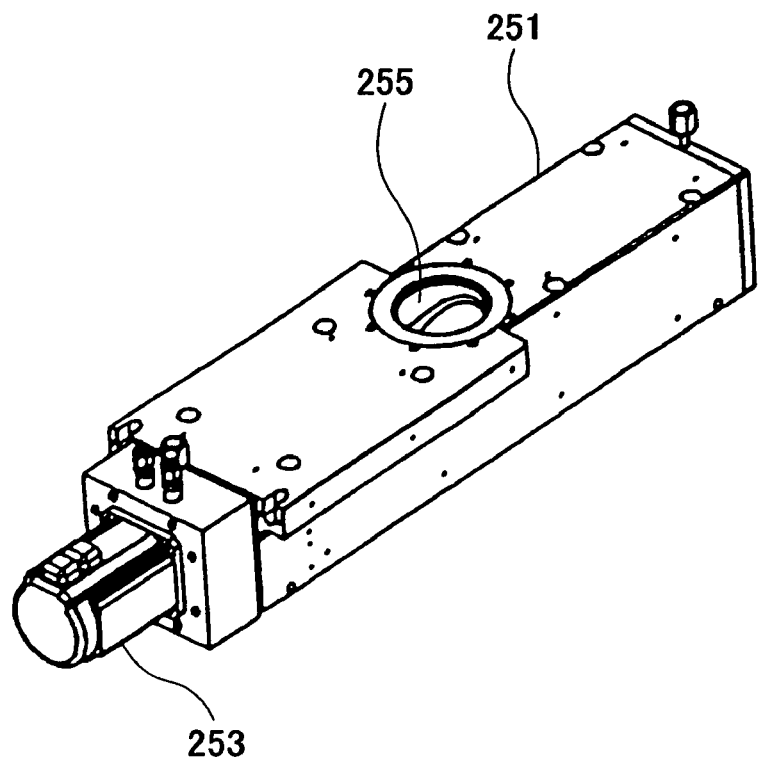

FIGS. 9A and 9B show the construction of the high-speed rotary valve 25A, wherein FIG. 9A is an oblique view diagram showing the entirety of the rotary valve 25A from an upward oblique direction, while FIG. 9B is an oblique view diagram of the same rotary valve 25A from a downward oblique direction. Because the high-speed rotary valve 25A has a construction similar to that of the high-speed rotary valve 25B, explanation will be made hereinafter only for the case of the high-speed rotary valve 25A.

Referring to FIG. 9A, the high-speed rotary valve 25A includes a main body 251 formed with an evacuation opening 26A, a valve body 252 provided rotatably in the main body 251 (see FIG. 10) and a driving member 253 such as a servo motor rotating the valve body 252, wherein a heating part 254 accommodating therein a heater is provided to a part of the main body 251. Further, an evacuation opening 255 is formed at the bottom surface of the main body 251 in connection with the conduit 207a as shown in FIG. 9B.

Figure 10:
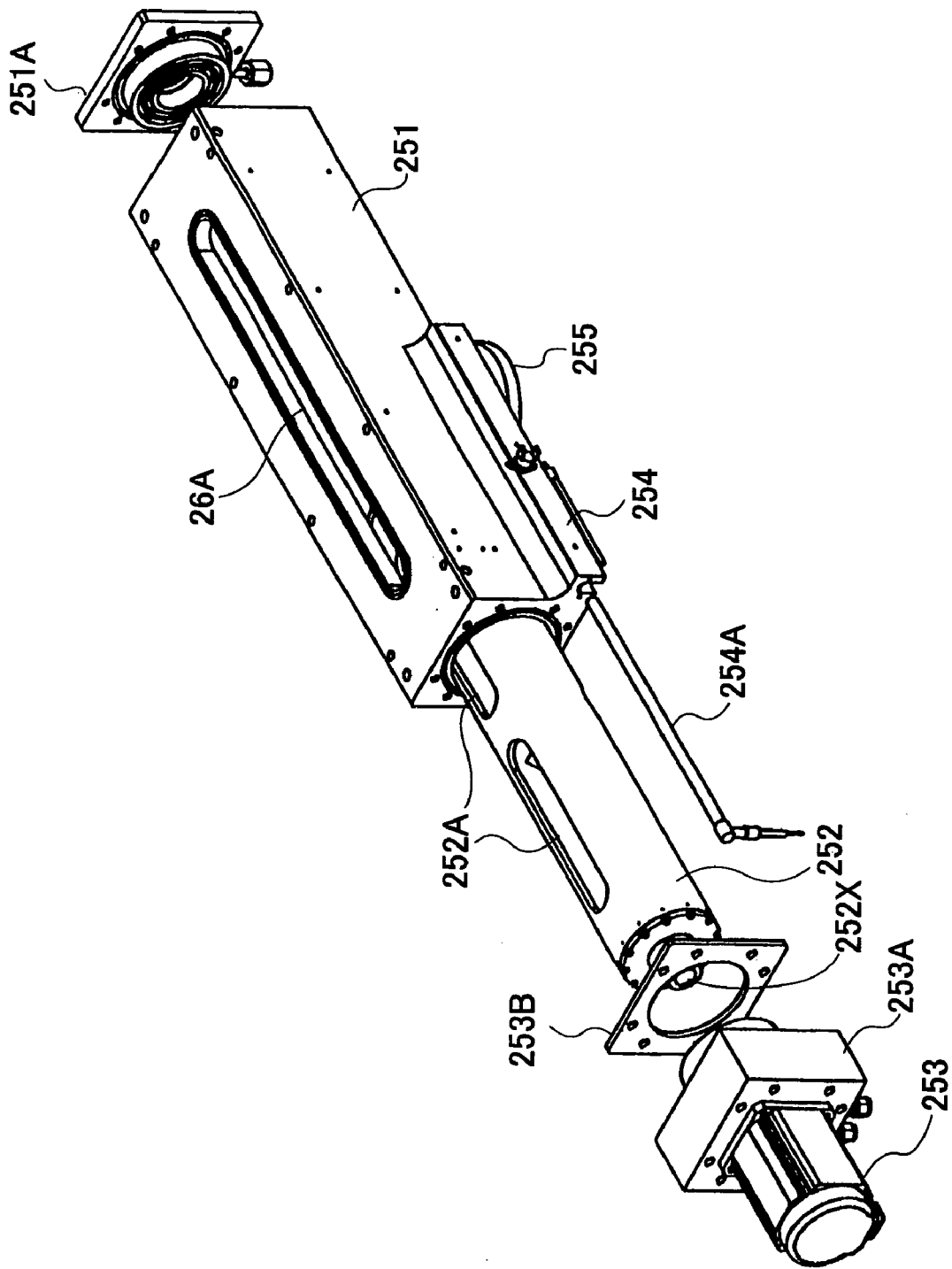
FIG. 10 is an exploded view diagram showing the construction of the high-speed rotary valve.

FIG. 10 shows the details of the high-speed rotary valve 25A of FIGS. 9A and 9B.

Referring to FIG. 10, an end of the main body 251 is closed with a cap 251A equipped with a bearing unit, and a drive block 253A having the servo motor 253 is coupled to the other end of the main body 251 via a seal 253B.

Further, there is formed an opening of cylindrical form in the main body 251 in communicating with the evacuation opening 26A and also 255, and a hollow valve body 252 of a ceramic or metal is inserted into the cylindrical opening rotatably with a corresponding cylindrical form. The valve body 252 is formed with an opening 252A extending in a length direction thereof and a different opening 252B at a diametrically opposing position (see FIG. 11D reference) of the opening 252A. Further, the valve body 252 is connected to the servo motor 253 at a shaft 252X provided at an end part of the valve body 252 and is moved in the clockwise direction and counter-clockwise by the motor 253. Also a heater 254A is inserted into the heating part 254. While not illustrated, there is provided a rotary shaft similar to the shaft 252X at the other end of the valve body 252, such that the rotary shaft is held to rotatably in a bearing unit provided on the cap 251A.

Figure 11A:
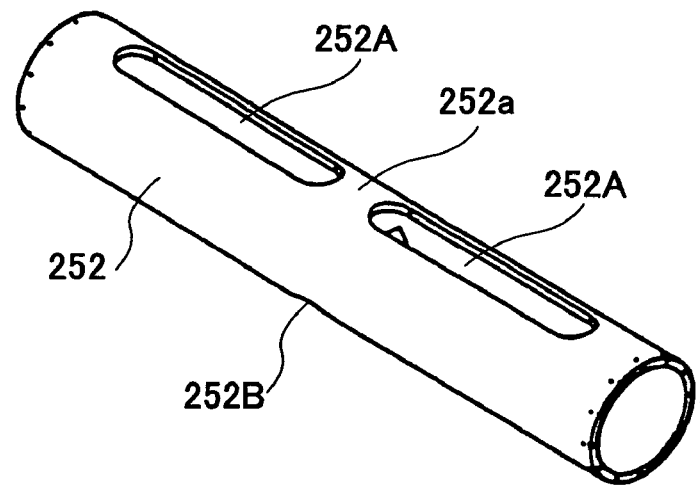
FIGS. 11A-11D are diagrams showing the construction of a valve body used with the high-speed rotary valve.
Figure 11B:
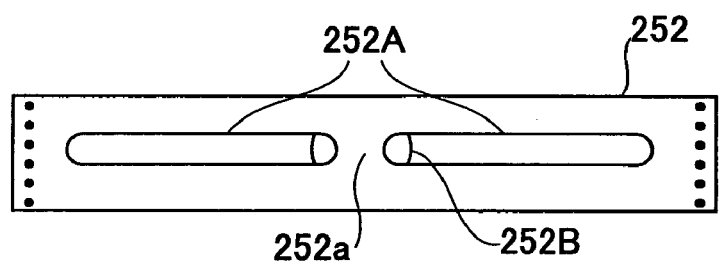
Figure 11C:
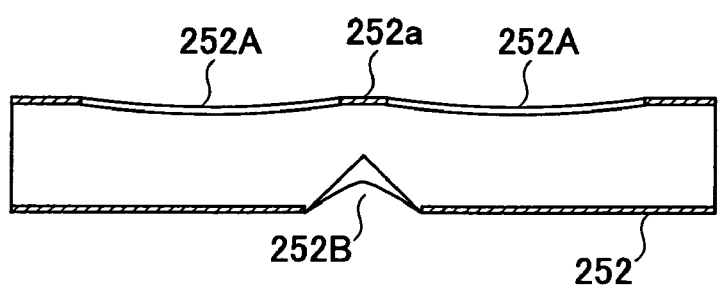
Figure 11D:
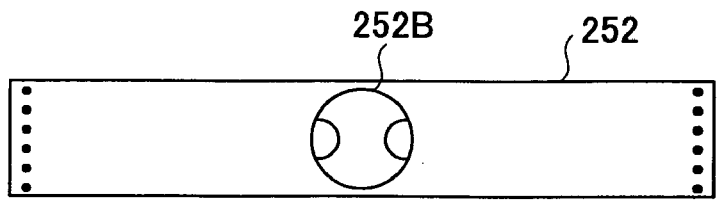

FIGS. 11A-11D show the construction of the valve body 252, wherein FIG. 11A is an oblique view of the valve body 252, FIG. 11B is a plan view of the valve body 252, FIG. 11C is a cross-sectional view of the valve body 252, and FIG. 11D is a bottom view of the valve body 252.

Referring to FIG. 11A-11D, there are formed two openings 252A are formed in the valve body 252 with a separation by an intermediate part 252a, and each opening 252A communicates with an opening 252B formed at a position opposing the intermediate department 252a via a space inside the valve body 252.

FIGS. 12A-12D show four states of the high-speed rotary valve 25A used with the substrate processing apparatus 40 of the present embodiment.

Figure 12A:
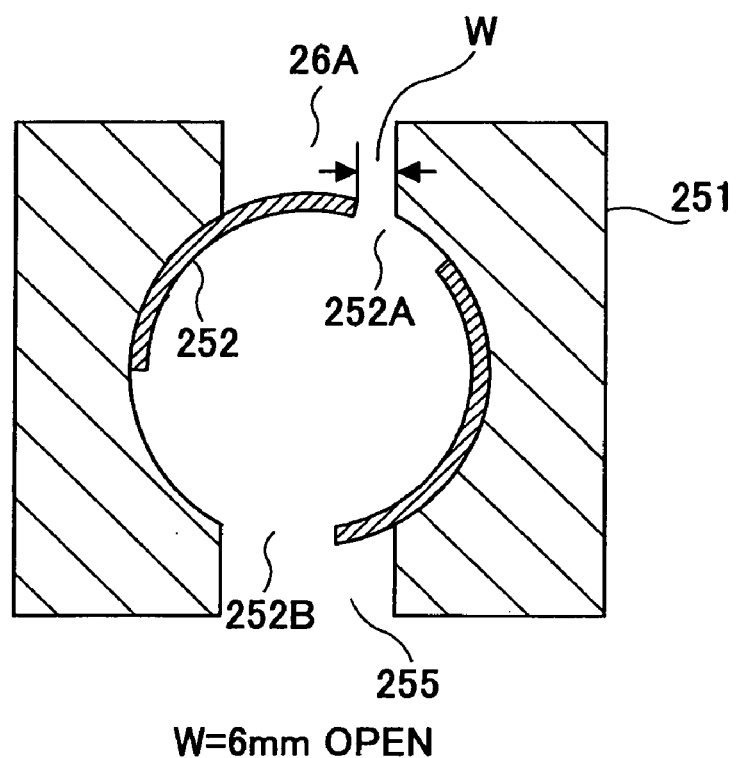
FIGS. 12A-12D are diagrams explaining the operation of the high-speed rotary valve.

Referring to FIG. 12A, the servo motor 253 causes the valve body 252 to rotate such that the opening 252A in the valve body 252 forms an opening having a width W of 6 mm for example at the evacuation opening 26A, and as a result, the conductance at the time of evacuation is restricted when the substrate processing apparatus 40 of FIG. 7 is used in the construction of FIG. 1 and the interior of the reaction vessel 202 is evacuated via the conduit 207a connected to the opening 255. Thereby, the interior of the reaction vessel 202 is evacuated gradually, and there takes place the desired adsorption of the source gas to the surface of the substrate 12 to be processed 12.

Figure 12B:
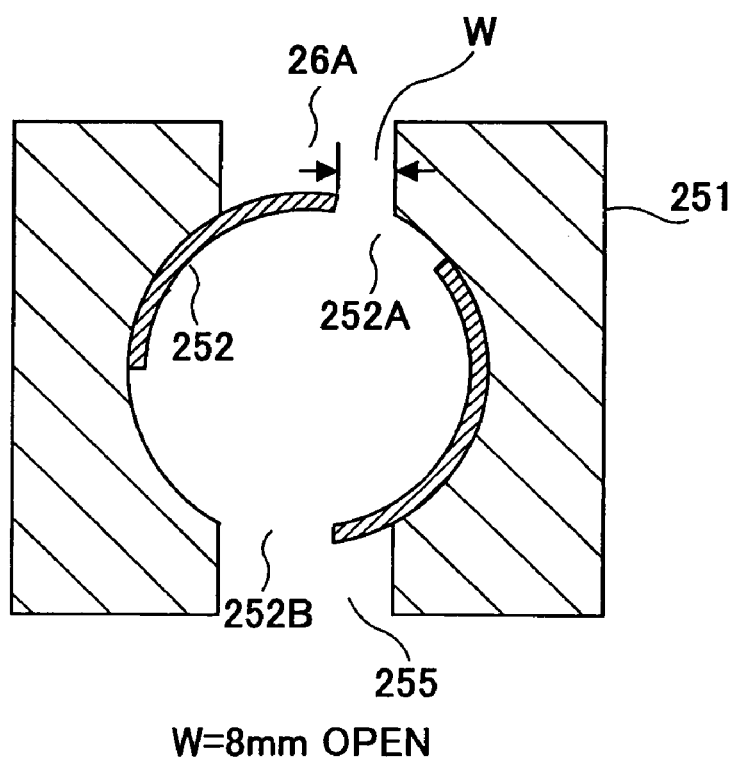

In the state of FIG. 12B, on the other hand, the valve body 252 is driven by the servo motor 253 such that the opening 252A forms an opening having a width W of 8 mm, for example, which is larger than the state of the valve 25A of FIG. 12A.

Figure 12C:
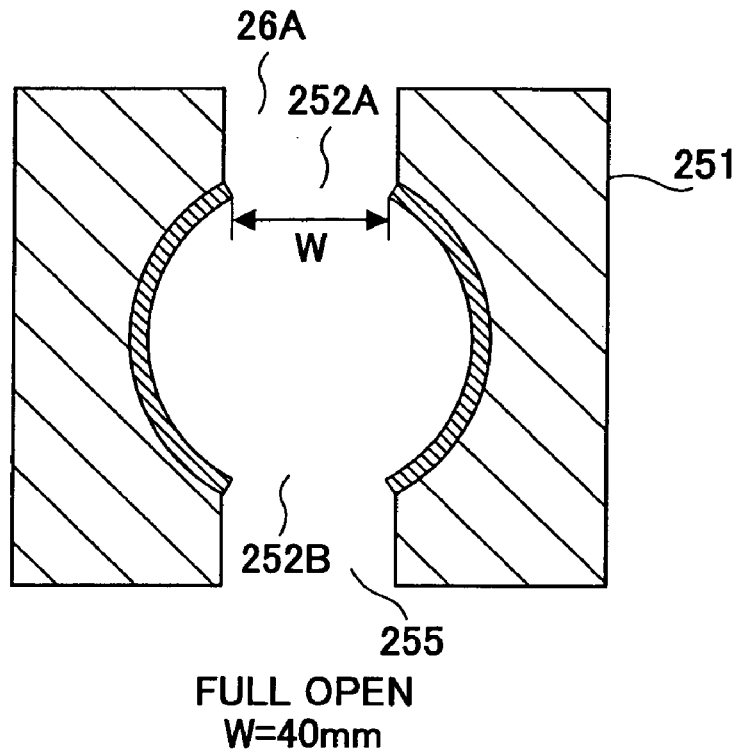

In the state of FIG. 12C, the valve body 252 is driven by the servo motor 253 such that the opening 252A coincides with the opening 26A, and the valve 25A is in the fully opened state. In the state of FIG. 12C, the opening 252A forms an opening having the width W of 40 mm, for example.

Figure 12D:
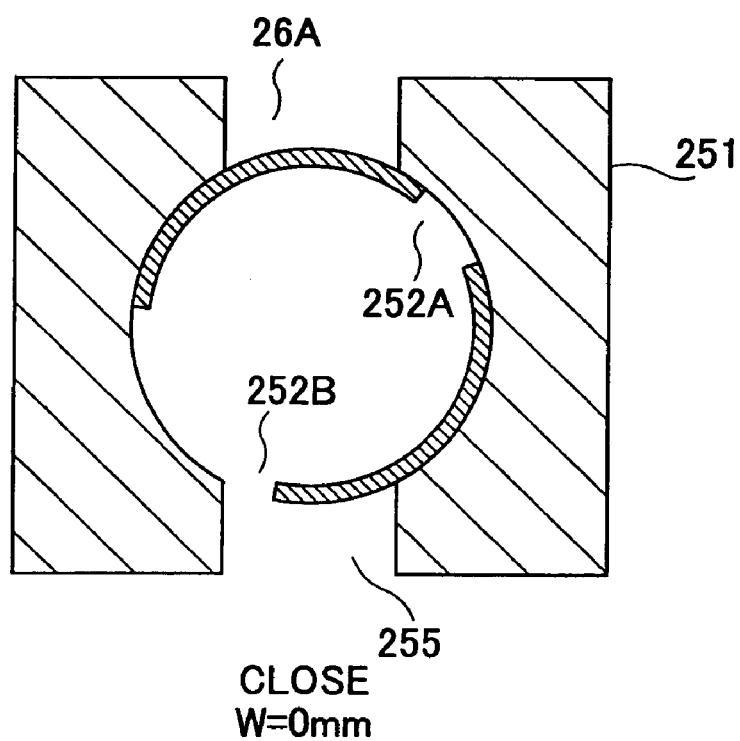

In the state of FIG. 12D, on the contrary, the valve body 252 is driven by the servo motor 253 such that opening 252A is offset completely from the opening 26A, and thus, the valve 25A is in the closed state.

Figure 42:
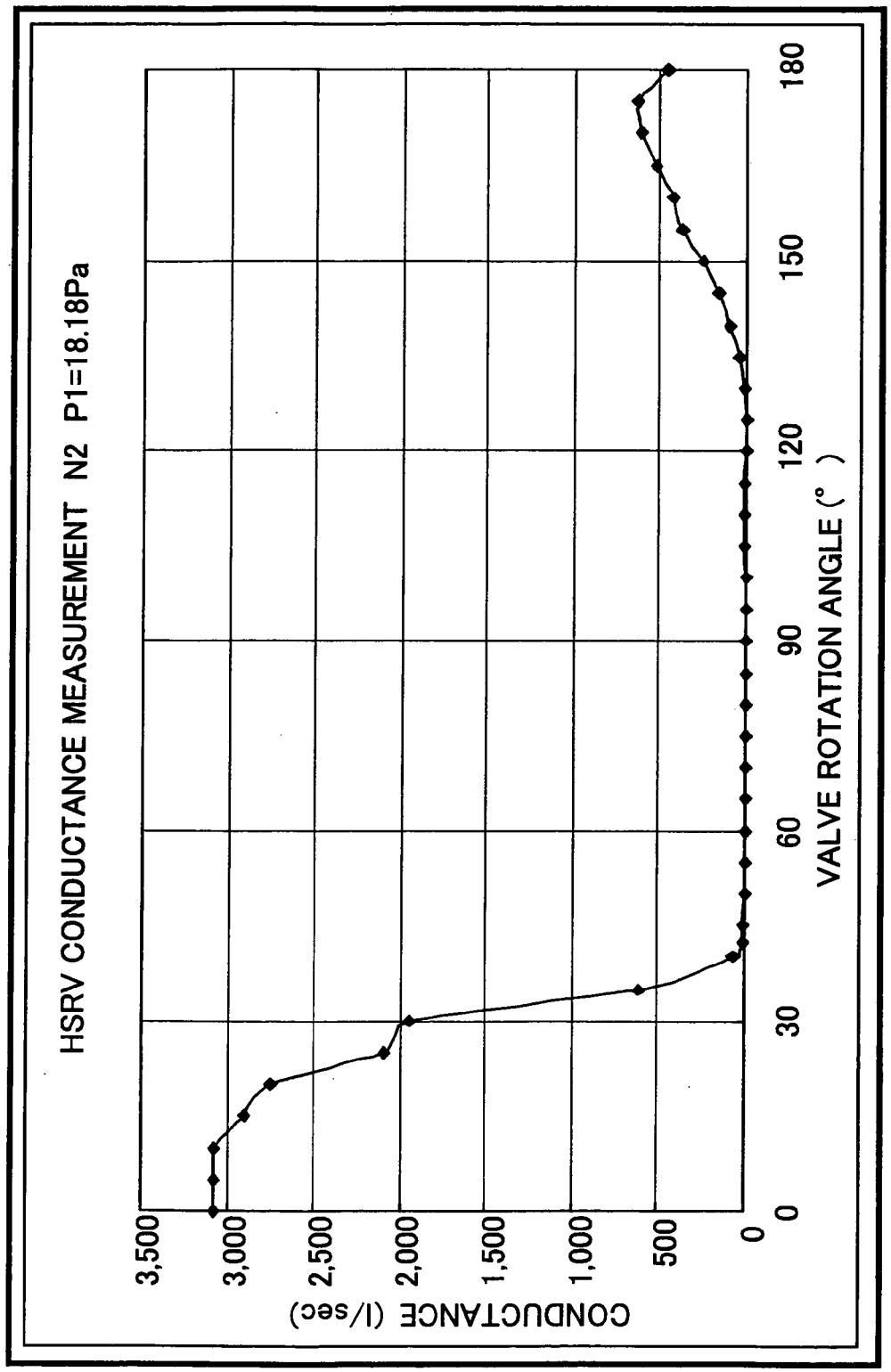
FIG. 42 is a diagram showing exemplar operational characteristics of the high-speed rotary valve of the present invention.

FIG. 42 shows an example of change of the conductance associated with the rotation of the valve body 252 in the high-speed rotary valves 25A and 25B of the present embodiment.

Referring to FIG. 42, it can be seen that the conductance exceeding the value of 3000 l/second is obtained in the case the rotational angle of the valve body 252 is zero degree, while in the case the rotational angle exceeds about 40 degrees, the conductance becomes zero. Further, the conductance increases again when the rotational angle has exceeded about 120 degrees and reaches the value of about 600 l/second at about 170 degrees. In the present invention, it becomes possible to realize the conductance change shown in FIG. 42 in an extremely short time within 0.1 seconds. by merely rotating the valve body 252.

Second Embodiment

Figure 13:
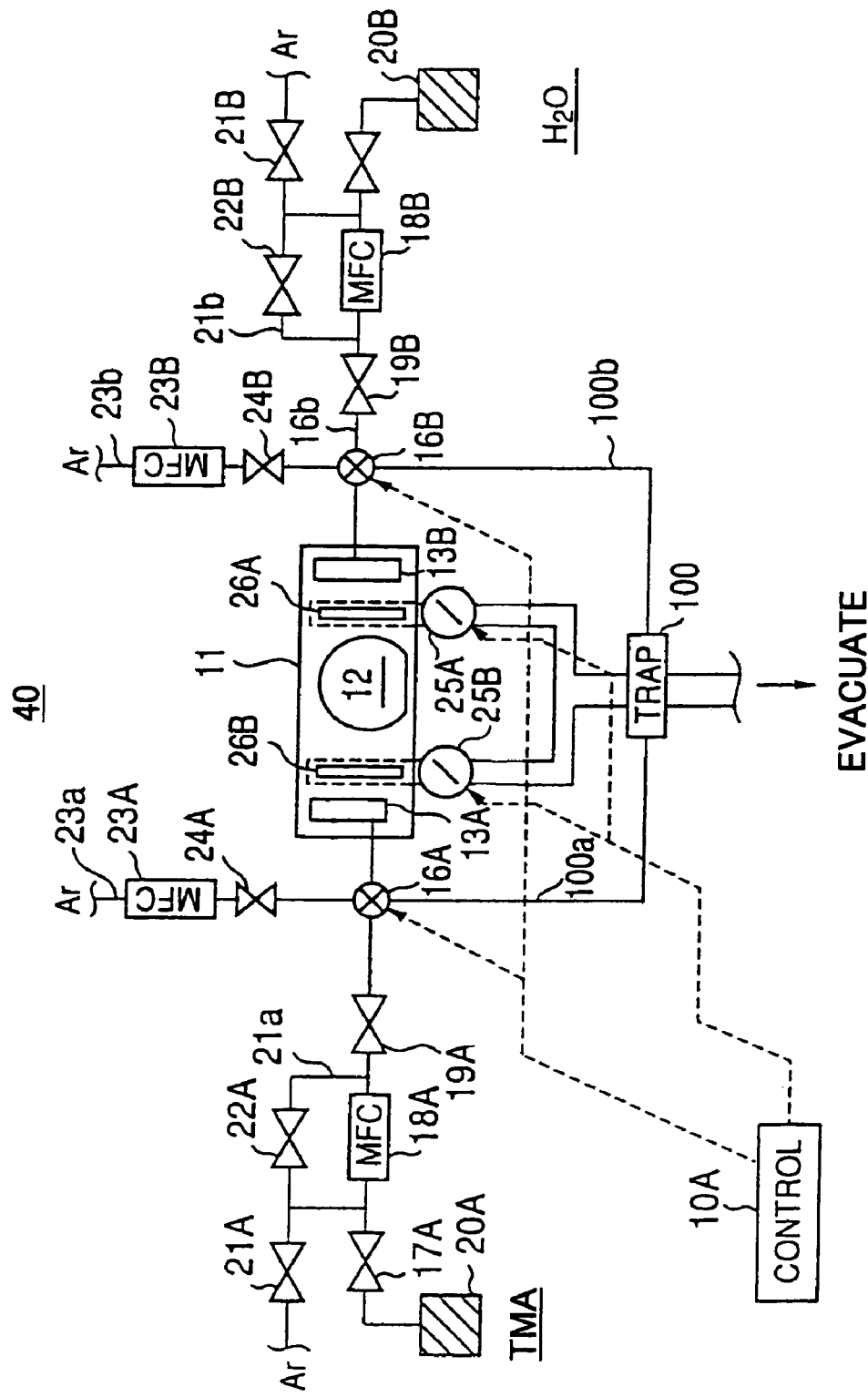
FIG. 13 is a diagram showing the outline of an ALD deposition apparatus according to a second embodiment of the present invention.

FIG. 13 shows the construction of a second embodiment of the present invention that forms an $Al_2O_3$ film, for example, on the surface of the substrate 12 to be processed by an ALD process by using the substrate processing apparatus 40 of FIG. 7. In FIG. 13, those parts explained previously are provided with the same reference numerals and the explanation thereof will be omitted.

Referring to FIG. 13, TMA (trimethyl aluminum), for example, is held in the present embodiment in the source material vessel 20A, and the TMA source in the source material vessel 20A is introduced into the quartz reaction vessel 202 in the processing vessel 11 through the switching valve 16A and the nozzle 13A. In the system of FIG. 13, it should be noted that the source supply system including the source material vessel 20C is not used, and thus, the illustration thereof is omitted.

Figure 14:
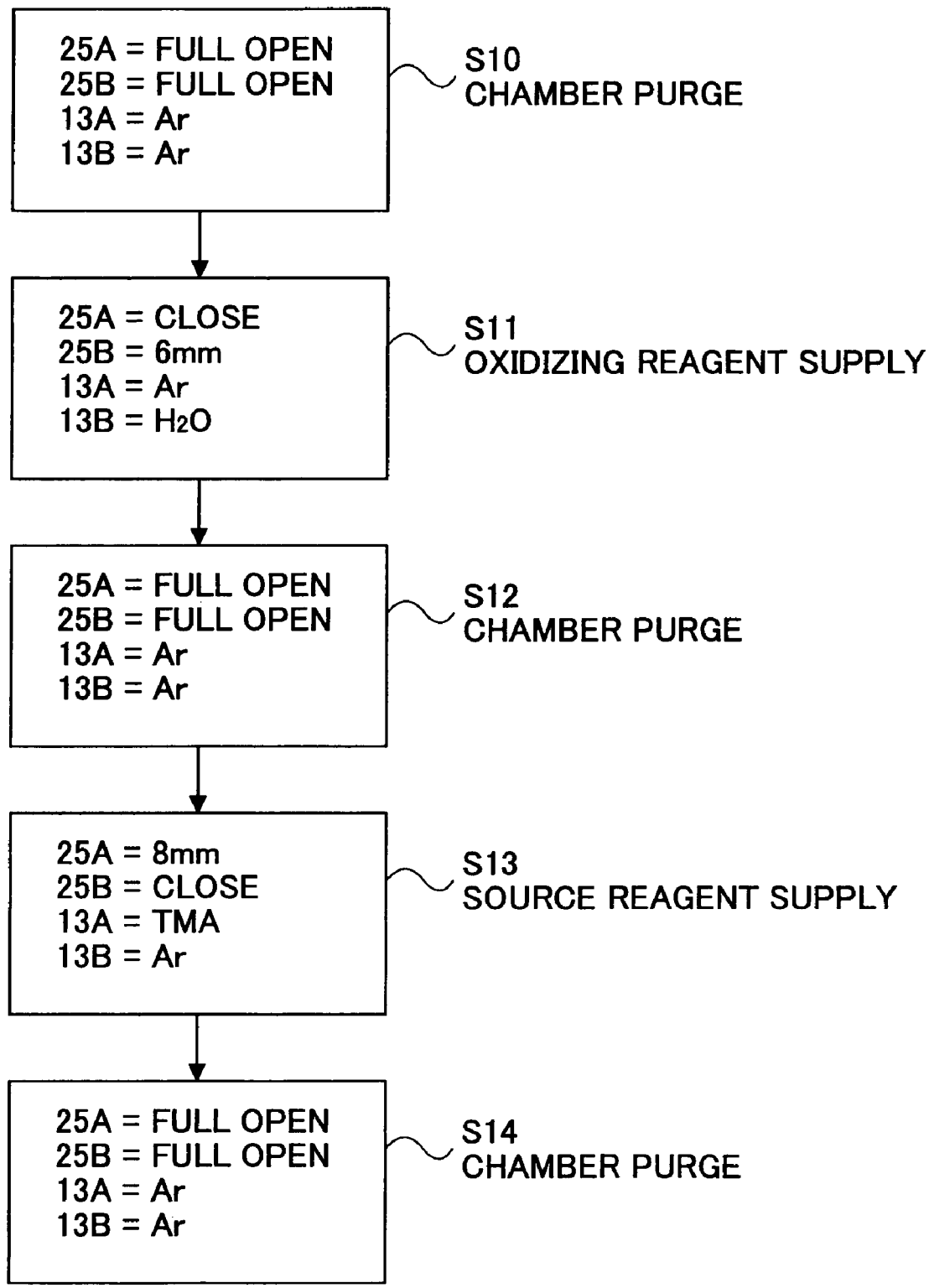
FIG. 14 is a flowchart showing an ALD film formation process according to the second embodiment of the present invention conducted by using the ALD deposition apparatus of FIG. 13.

FIG. 14 is flowchart showing the ALD process carried out by using the system of FIG. 13.

Referring to FIG. 14, both of the high-speed rotary valves 25A and 25B are fully opened in the process of step 10 (chamber purge step) to the state of FIG. 12C, and a purge gas such as an Ar gas is introduced into the quartz reaction vessel 202 from the valves 16A and 16B respectively through the nozzles 13A and 13B. Thereby, interior of the reaction vessel 202 is purged.

Next, the high-speed rotary valve 25A is closed to the state of FIG. 12D in the step 11 (oxidizing gas supplying and adsorbing step), and the high-speed rotary valve 25B is opened partially to the state of FIG. 12A simultaneously. Alternatively, the high-speed rotary valve 25B is controlled such that the interior of the reaction vessel 202 reaches a predetermined pressure. Further, an oxidizing gas such as an $H_2O$ gas is introduced into the quartz reaction vessel 202 through the valve 16B and the nozzle 13B. The $H_2O$ gas thus introduced flows along the surface of the substrate 12 to be processed in the form of a laminar flow discharged from the rotary valve 25B. With this, $H_2O$ molecule are absorbed upon the substrate surface for only one molecular layer. During the step 11, a small amount of Ar gas is supplied to the nozzle 13A from the valve 16A, and the interior of the nozzle 13A is purged.

Next, in the step 12 (chamber purge step), the high-speed rotary valves 25A and 25B are set to the fully opened state shown in FIG. 12C, and an Ar gas is introduced from the valves 16A and 16B respectively through the nozzles 13A and 13B. With this, the nozzles 13A and 13B and also the interior of the quartz reaction vessel 202 are purged.

Next, in the step 13 (source gas supplying and adsorbing step), the high-speed rotary valve 25A is opened partially to the state of FIG. 12B, and the high-speed rotary valve 25B is closed as shown in the state of FIG. 12D. Alternatively, the high-speed rotary valve 25A may be controlled so as to produce a predetermined pressure inside the processing vessel 22. Further, TMA is introduced into the quartz reaction vessel 202 from the switching valve 16A through the gas nozzle 13A in this state, wherein the TMA gas thus introduced flows along the surface of the substrate 12 to be processed in the form of a laminar flow and discharged from the rotary valve 25A. As a result, the $Al_2O_3$ film of one molecular layer is formed on the surface of the substrate 12 to be processed. During this interval, the gas nozzle 13B is purged by the Ar gas.

Further, in the step 14 (chamber purge step), the high-speed rotary valves 25A and 25B are set to the fully opened state of FIG. 12C, and the interior of the nozzles 13A and 13B and the interior of the quartz reaction vessel 202 are purged by introducing the Ar gas from the nozzles 13A and 13B.

By repeating the process of the steps 10-14, it is possible to form a high quality $Al_2O_3$ film on the surface of the substrate to be processed one molecular layer by one molecular layer.

Figure 15:
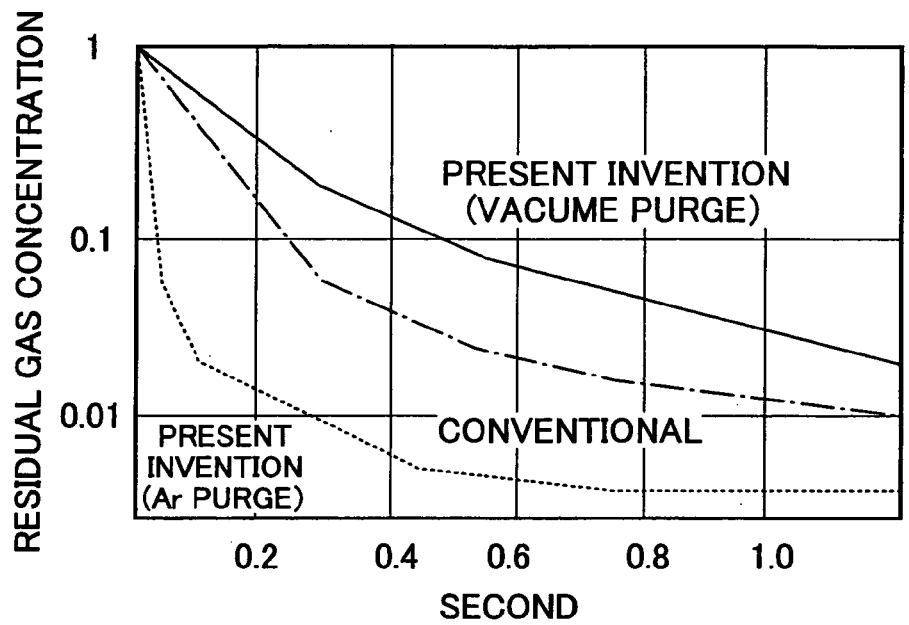
FIG. 15 is a diagram showing the operational characteristics of the high-speed rotary valve of the present invention.

FIG. 15 is a diagram comparing the purge rate of the quartz reaction vessel 202 in the step 10 or step 12 of FIG. 14 between the case in which the purging is conducted by using the high-speed rotary valves 25A and 25B of the present invention and the case in which the purging is conducted by using the conventional conductance valves 15A and 15B of FIG. 2.

Referring to FIG. 15, it can be seen that the time needed for reducing the residual gas concentration to about 5% of the initial concentration is reduced to about 0.1 seconds in the case the high-speed rotary valves 25A and 25B of the present invention are used, while it should be noted that this value is reduced to about ⅕ of the conventional case. Further, from FIG. 16, it can be seen that it becomes possible to reduce the concentration of the residual gas to about 5% within the purging time of one second by using the high-speed rotary valves 25A and 25B of the present invention, even in the case the quartz reaction vessel 202 is vacuum purged.

Third Embodiment

Figure 16:
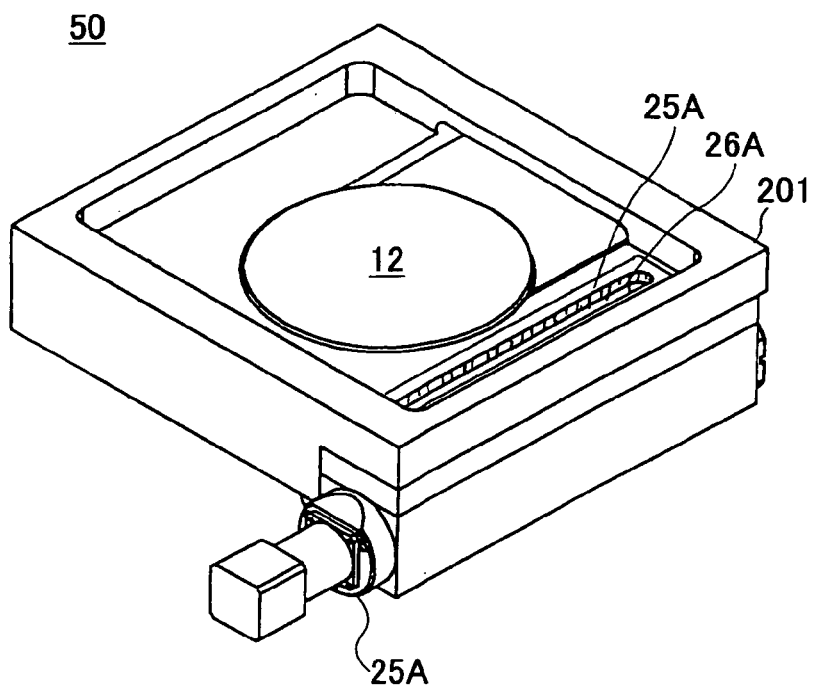
FIG. 16 is a diagram showing the construction of an ALD film deposition apparatus according to a third embodiment of the present invention.

FIG. 16 shows the construction of substrate processing apparatus 50 according to a third embodiment of the present invention, wherein those parts of FIG. 16 explained previously are designated with the same reference numerals and the description thereof will be omitted.

Referring to FIG. 16, the high-speed rotary valve 25B at one side is taken away in the present embodiment, and associated with this, the source gas supply nozzle 13B and also the source gas supply system corresponding thereto are taken away.

Figure 17:
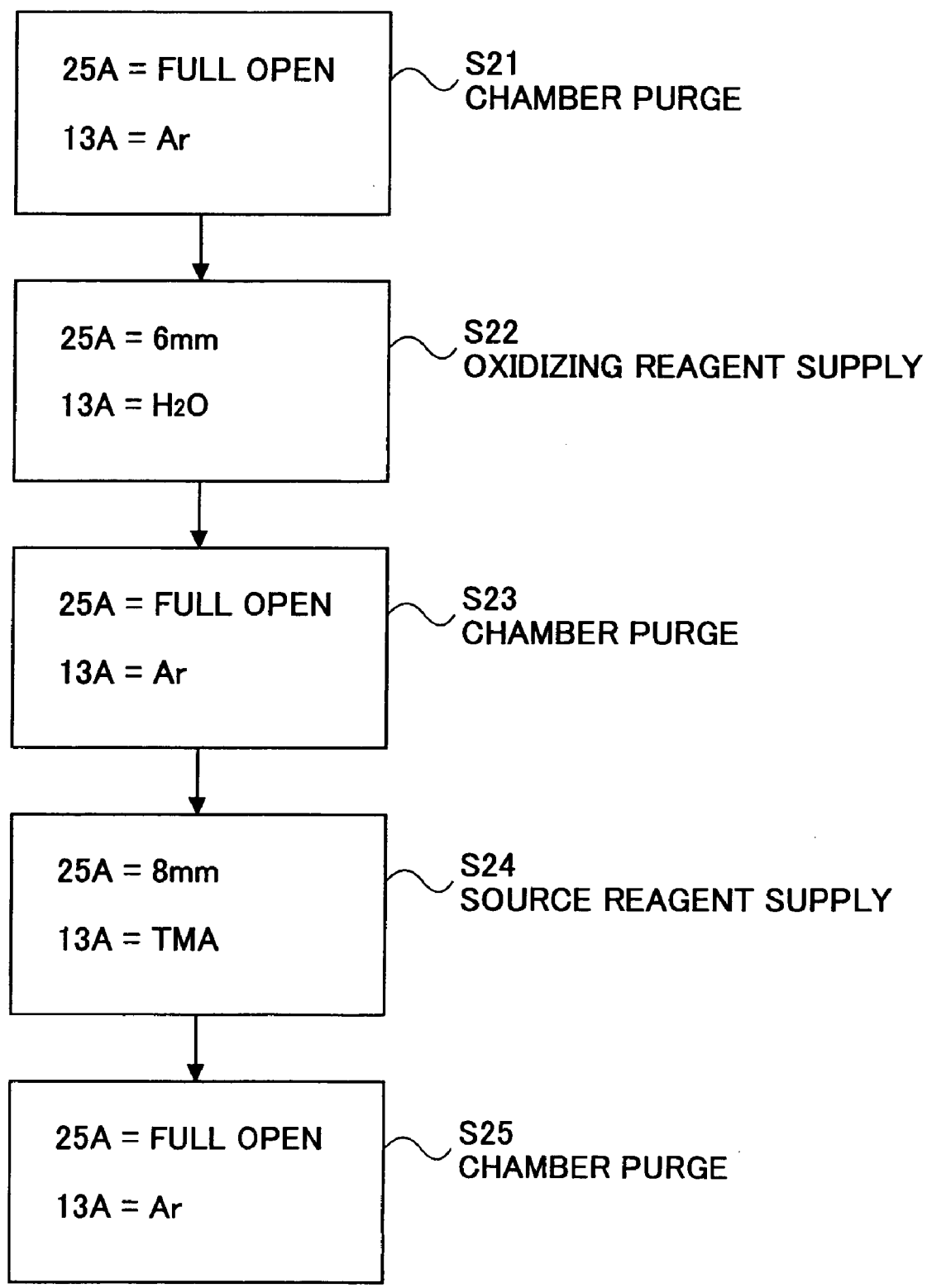
FIG. 17 is a diagram showing an ALD film formation process according to a third embodiment of the present invention conducted by using the deposition apparatus of FIG. 16.

In the substrate processing apparatus 50 of such construction, too, the interior of the quartz reaction vessel 202 is purged at high speed, by fully opening the high-speed rotary valve 25A in the step 21 (chamber purge step) and supplying the Ar gas from the nozzle 13A as shown in the flowchart of FIG. 17. Thus, in the step 22 (oxidizing gas supplying and adsorbing step), the high-speed rotary valve 25A is set to the degree of valve opening of 6 mm, for example, and the $H_2O$ gas is introduced from the nozzle 13A as the oxidizing gas. With this, $H_2O$ molecules are absorbed upon the surface of the substrate 12 to be processed in the form or one molecular layer. It should be noted that a similar effect is obtained also in the case the degree of valve opening of the valve 25A is not set in the step 22, by setting the process pressure and by controlling the slit width according to this pressure.

Further, in the step 23 (chamber purge step), the high-speed rotary valve 25A is fully opened, and the nozzle 13A and the interior of the quartz reaction vessel 202 are purged by the Ar gas.

Further, in the step 24 (source gas supplying and adsorbing step), the high-speed rotary valve 25A is set to have the degree of valve opening of 8 mm, for example, and a TMA gas is introduced from the nozzle 13A as the source gas. With this, an $Al_2O_3$ film of one molecular layer is formed on the surface of the substrate 12 to be processed. In the step 24, it should be noted that a similar effect is achieved also in the case the degree of valve opening of the valve 25A is not set, by setting the process pressure in place thereof and by controlling the slit width in accordance with this pressure.

After the step S24, a chamber purge step 25 is conducted in which the valve 25A is fully opened and the nozzle 13A is supplied with the Ar gas. Thereby, the nozzle 13A and the interior of the quartz reaction vessel 202 are purged with the Ar gas.

Fourth Embodiment

Figure 18:
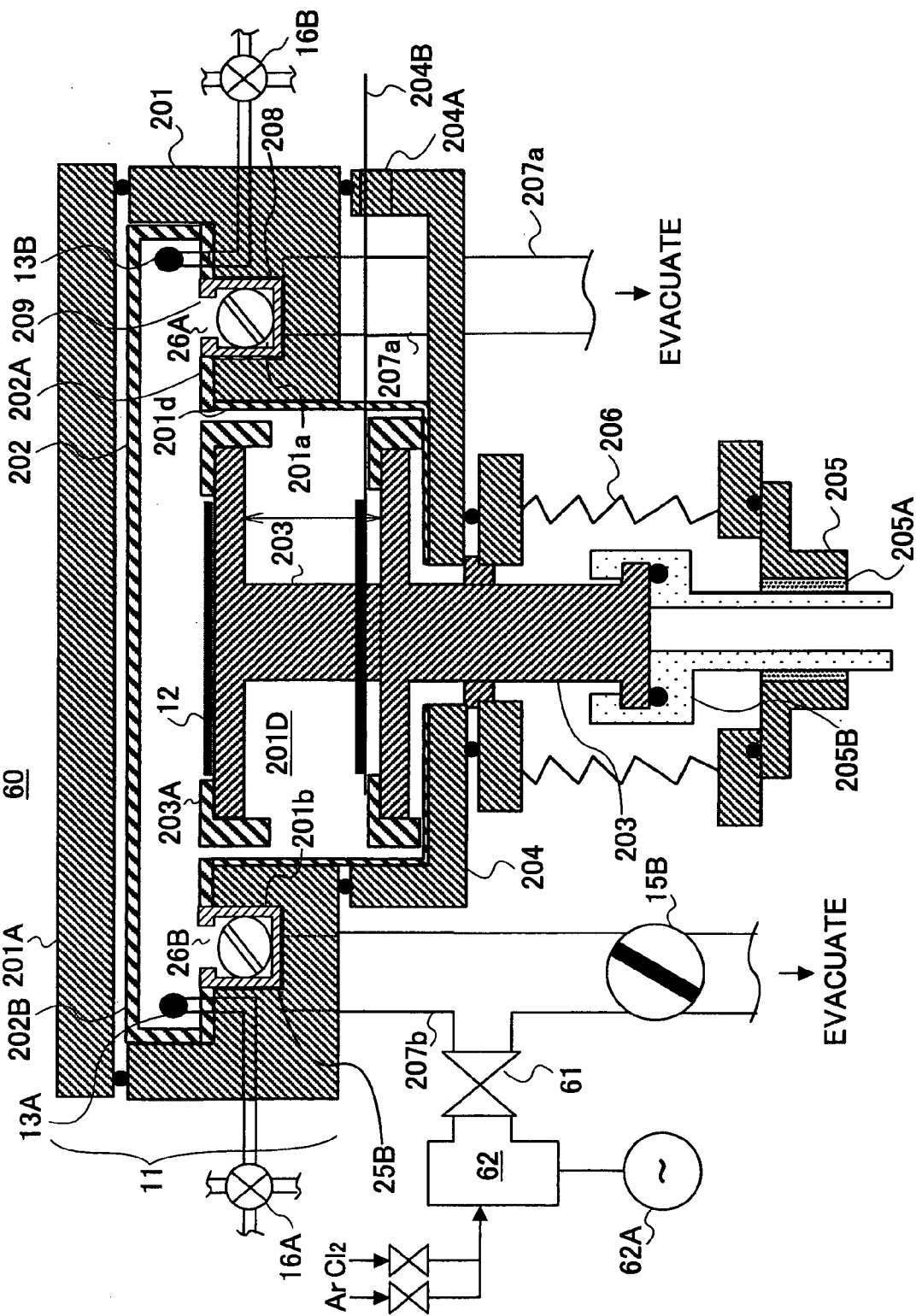
FIG. 18 is a diagram showing the construction of an ALD deposition apparatus according to a fourth embodiment of the present invention.

FIG. 18 shows the construction of a substrate processing apparatus 60 according to a fourth embodiment of the present invention, wherein those parts corresponding to the part explained previously are designated with the same reference numerals and the description thereof will be omitted.

Referring to FIG. 18, the conductance valve 15B of FIG. 2 is provided further to the conduit 207b in the substrate processing apparatus 60 at a downstream side of the high-speed rotary valve 26B, and a remote plasma source 62 is provided to the conduit 207b at an intermediate part between the high-speed rotary valve 26B and the conductance valve 15B via an open/close valve 61.

Thereby, the remote plasma source 62 is supplied with a cleaning gas, for example a cleaning gas of chlorine family such as $Cl_2$ or a cleaning gas of the fluorine family such as the $CHF_3$ or $NF_3$, together with a rare gas such as Ar. By driving the high-frequency source 62A of 400 kHz frequency for example cooperating with the remote plasma source 62, there are formed chemically active chlorine radicals or fluorine radicals.

With the present embodiment, it becomes possible, in substrate processing apparatus 60, to perform efficient cleaning of the quartz reaction vessel 20 by introducing the chlorine radicals or fluorine radicals thus formed into the quartz reaction vessel 202 from the conduit 207b through the high-speed rotary valve 25B in the opposite direction to the usual exhaust direction and by evacuating the same through high-speed rotary valve 25A, by fully opening the high-speed rotary valves 25A and 25B and closing the conductance valve 15B.

Figure 19:
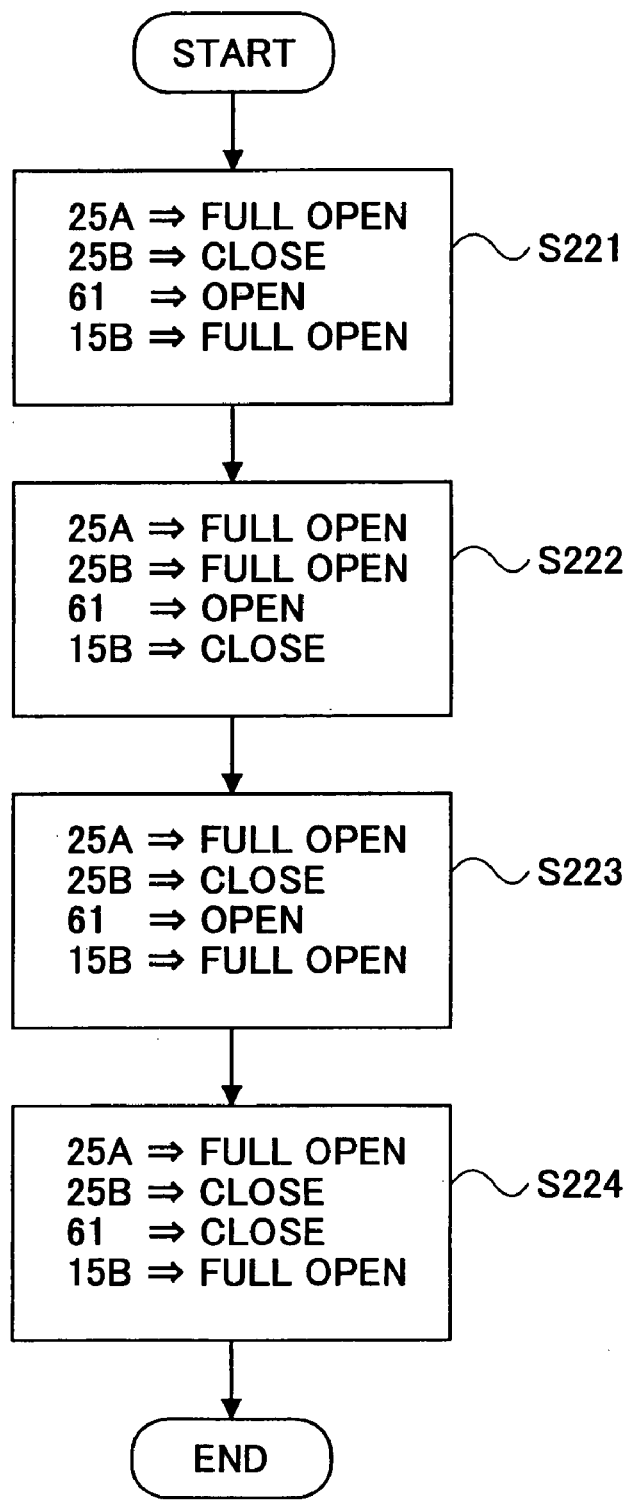
FIG. 19 is a flowchart showing a cleaning method of the deposition apparatus according to a fourth embodiment of the present invention.
Figure 20A:
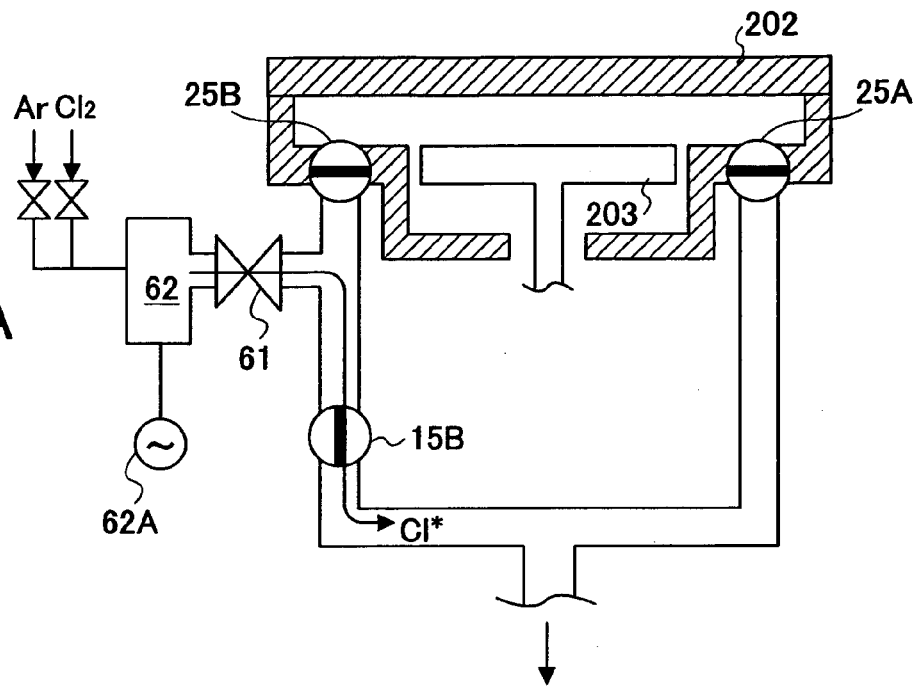
FIGS. 20A and 20B are diagrams corresponding to FIG. 19 and showing the cleaning process according to a fourth embodiment of the present invention.
Figure 20B:
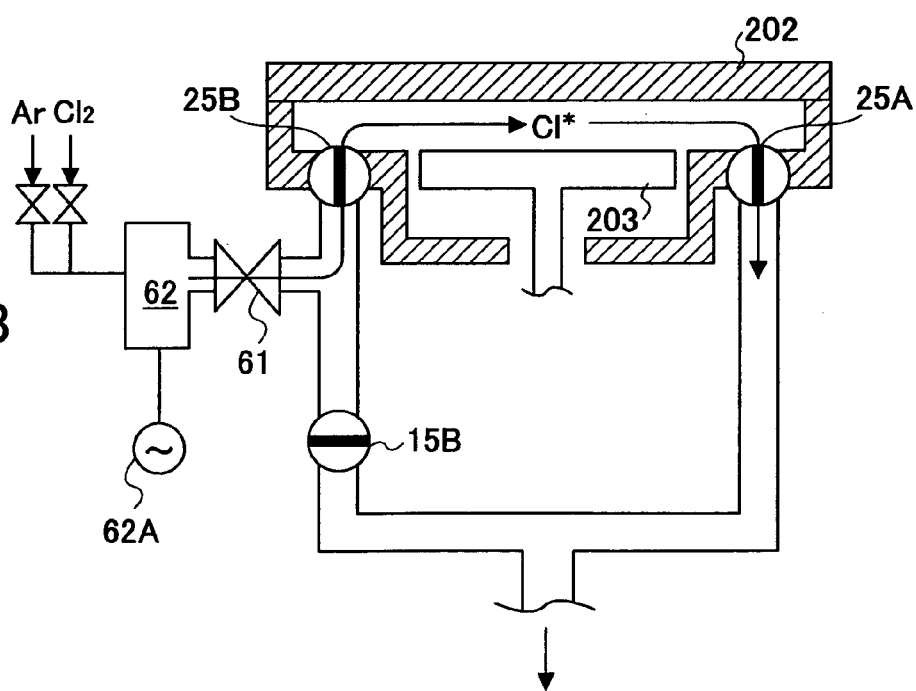

FIG. 19 shows the flowchart of the cleaning process of FIG. 19, while FIGS. 20A and 20B are diagrams showing the state of the substrate processing apparatus 60 corresponding to the flowchart of FIG. 19 schematically.

Referring to FIG. 19, the high-speed rotary valve 25A is fully opened and the high-speed rotary valve 25B is closed in the step 221. Further, the Ar gas and the $Cl_2$ gas are supplied to the remote plasma source 62, and the conductance valve 15B is fully opened. Further, the open/close valve 61 is opened, and the remote plasma source 62 is driven with the high frequency power formed by the high-frequency source 62A with the frequency of 400 kHz and the electric power of 5 kilowatts, for example. With this, chlorine radicals Cl* are generated with the remote plasma. In the state of the step 21, the chlorine radicals thus formed are evacuated immediately to the evacuation system as shown in FIG. 20A.

Next, in the step 222, the high-speed rotary valve 25B is fully opened and the conductance valve 15 is closed. The chlorine radicals Cl* formed in the step 21 are then introduced into the quartz reaction vessel 202 through the high-speed rotary valve 25B and through the evacuation opening 26B as shown in FIG. 20B. The chlorine radicals Cl* thus introduced are caused to flow in the quartz reaction vessel 202 to the high-speed rotary valve 25A and discharged through the evacuation opening 25A. Thus, by maintaining the state of step 222 for a predetermined time, the deposits adhered to the inner wall surface, and the like, of the quartz reaction vessel 202 is cleaned.

Next, in the step 223, the high-speed rotary valve 25B is closed again and the conductance valve 15B is fully opened. As a result, the chlorine radicals formed with the remote radical source 62 are evacuated immediately to the evacuation system as shown previously in FIG. 20A.

Further, in the step of step 224, the high-frequency source 62A is turned off, the remote radical source 62 is turned off, and the open/close valve 61 is closed.

In the present embodiment, it becomes possible to suppress the loss of activity of the radicals at the time a large amount of radicals are introduced into the quartz reaction vessel 220 from outside, by setting the width W of the evacuation openings 26A and 26B to be larger than the width of the conventional evacuation openings 14A and 14B and further by combining the high-speed rotary valves 25A and 25B that realize a larger conductance. Thereby, efficient cleaning becomes possible. Because the radical source 62 is formed to the part of the evacuation system in the present embodiment, there arises no difficulty of providing the radical source even in the case the reaction vessel 202 has a flat form suitable for forming the laminar flow of the source gas, Fifth Embodiment In the substrate processing apparatus 60 of FIG. 18, it should be noted that the radical source 62 is useful not only in the cleaning of the processing vessel 202 but also in the oxidation or nitridation of the molecules absorbed on the substrate to be processed. In this case, an oxygen-containing gas or a nitrogen-containing gas, such as an oxygen gas or a nitrogen gas, is supplied to the radical source 62 in place of the cleaning gas together with the rare gas such as Ar, He or Kr.

Hereinafter, the substrate processing process according to a fifth embodiment of the present invention that forms an $Al_2O_3$ film on the substrate to be processed by using substrate processing apparatus 60 of FIG. 18 will be described with reference to FIGS. 21A and 21B.

Figure 21A:
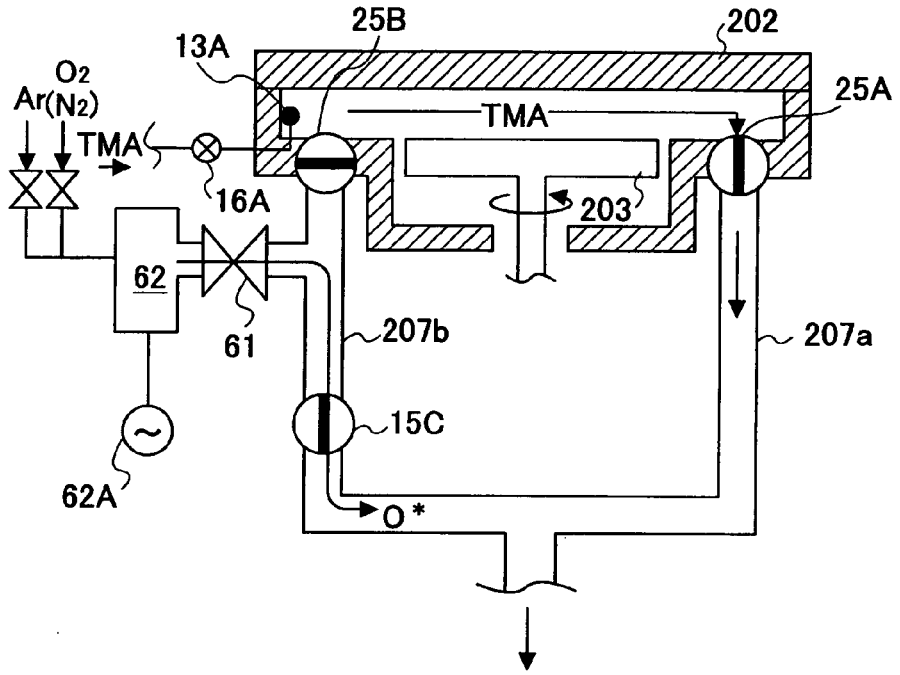
FIGS. 21A and 21B are diagrams showing the construction and process of a deposition apparatus according to a fifth embodiment of the present invention.

Referring to FIG. 21A, the stage 203 is rotated by the servo motor 253 and the high-speed rotary valve 25A is opened. With this, interior of the reaction vessel 202 is evacuated. Further, the remote plasma source 62 is activated.

Further, in the state of FIG. 21A, the high-speed rotary valve 25B is closed and the processing gas such as TMA is introduced into the reaction vessel 202 from the processing gas inlet port 13A. The processing gas thus introduced is caused to flow along the surface of the substrate to be processed on the stage 203 and evacuated through the high-speed rotary valve 25A and also conduit 207a. As a result, the TMA molecules cause absorption to the surface of the substrate to be processed, and a TMA layer of the thickness of almost one molecular layer is formed.

In the state of FIG. 21A, the variable conductance valve 15C provided to the conduit 207b is opened, and as a result, the oxygen radicals formed by the remote plasma source 62 are discharged through the variable conductance valve 15C without being introduced into the reaction vessel 202.

Figure 21B:
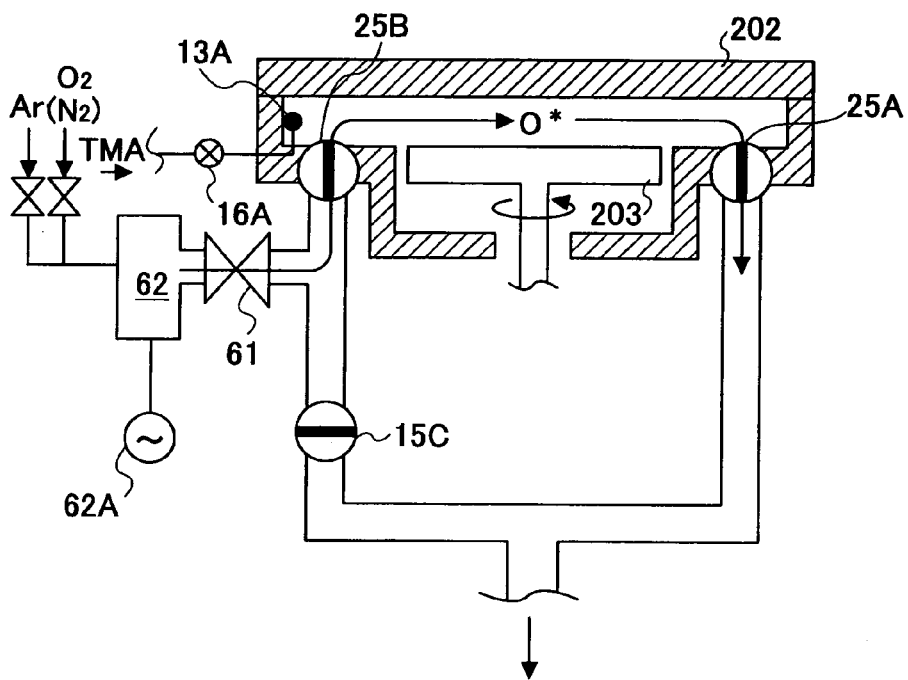

In the state of FIG. 21B, on the other hand, the supply of TMA to the processing gas inlet port 13A is blocked by the switching valve 16A. Further, by closing the variable conductance valve 15C and by opening the high-speed rotary valve 25B, the oxygen radicals O* formed by the remote plasma source 62 are supplied to the reaction vessel 202 in the form of a back flow flowing backward through the evacuation opening 26B. Thereby, it should be noted that the high-speed rotary valve 25A is opened also in the state of FIG. 21B, and the oxygen radicals O* thus introduced are caused to flow through the reaction vessel 202 along the surface of the rotating substrate to be processed. Thereby, the oxygen radicals oxidize the TMA molecules absorbed to the substrate surface and an $Al_2O_3$ film of one molecular layer is formed.

After the step of FIG. 21B, the process returns to the step of FIG. 21A, and the $Al_2O_3$ film is grown on the substrate to be processed one molecular layer by one molecular layer, by repeating the steps of FIG. 21A and FIG. 21B alternately and repeating.

Thus, the present embodiment uses oxygen radicals for the oxidation of the TMA molecules in place of $H_2O$. Associated with this, the present embodiment does not use a processing gas supply opening 13B for introducing $H_2O$ or the switching valve 16B. As a result, there is caused no problem of adhesion of the $H_2O$ molecules upon the inner wall of the reaction vessel 202 or the switching valve 16B, and it becomes possible to carry out the purging process at the time of switching the state from the state of FIG. 21B to the state of FIG. 21A promptly.

Particularly, it become possible to provide the remote plasma source 62 in the periphery of the evacuation opening 26B by using the high-speed rotary valves 25A and 25B explained previously for the openings 26A and 26B, and it becomes possible to introduce the oxygen radicals into the reaction vessel 202 effectively. Because it is not necessary to provide the remote plasma source 62 directly upon the processing vessel 201 or the reaction vessel 202 therein in the present embodiment, the design thereof becomes substantially easier.

Figure 22:
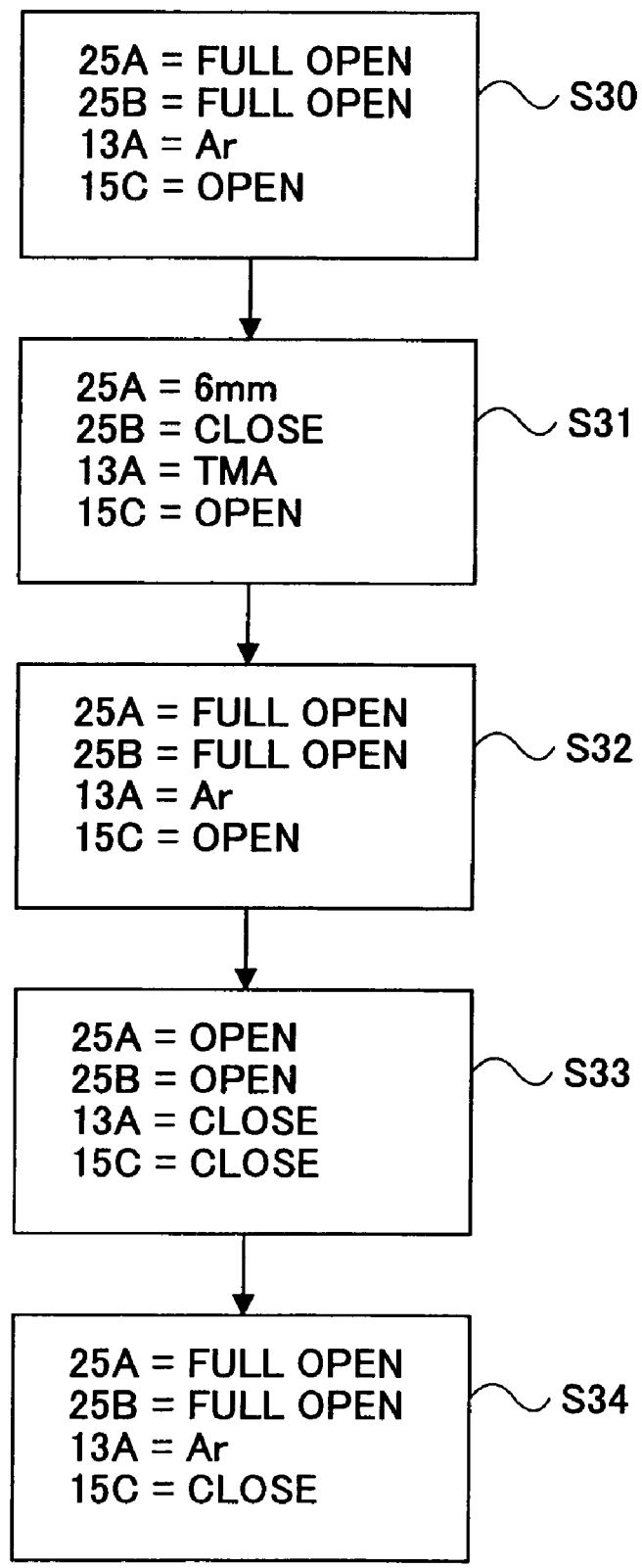
FIG. 22 is a flowchart showing a film formation process that uses the deposition apparatus of FIG. 21.

FIG. 22 is a flowchart showing the substrate processing method including the process steps of FIGS. 21A and 21B conducted by the substrate processing apparatus 60 of FIG. 18.

Figure 23A:
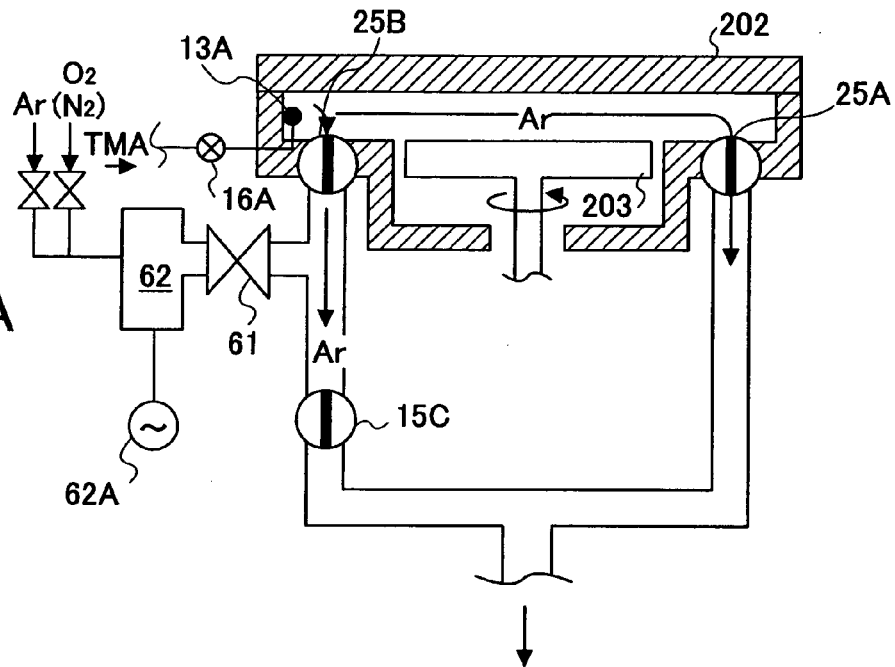
FIGS. 23A and 23B are diagrams showing a modification of the fifth embodiment.
Figure 23B:
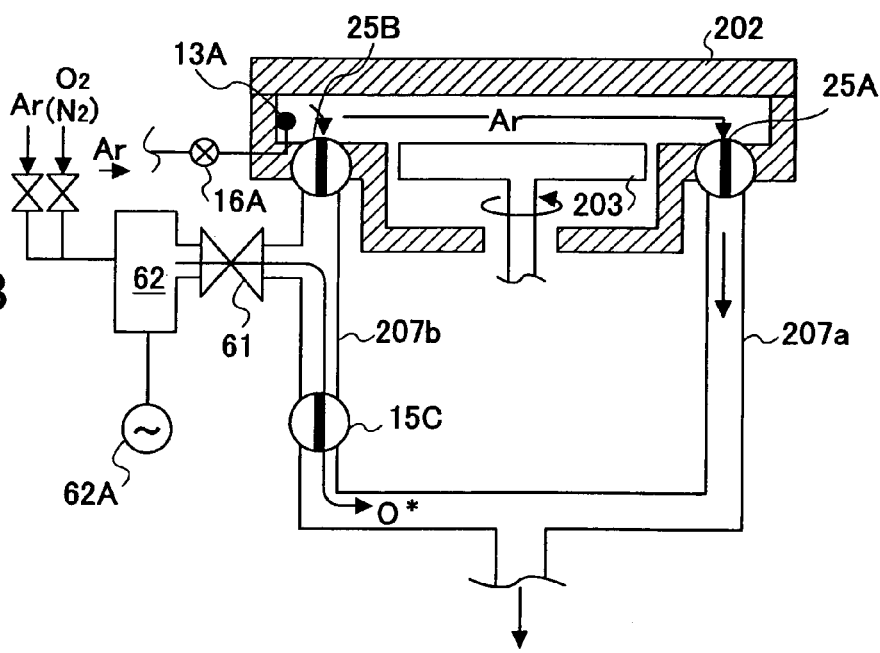

Referring to FIG. 22, the high-speed rotary valves 25A and 25B are fully opened in the step S30 and the interior of the reaction vessel 202 is purged by and introducing the Ar gas from the processing gas inlet port 13A. In this step, it is possible to close the valve 61 as shown in FIG. 23A so as to prevent that residual gas discharged from the reaction vessel 202 causing invasion into the remote plasma source 62 and causing deposition therein. In the case the degree of invasion of the residual processing gas is small, on the other hand, it is possible to open the valve 61 in the foregoing purging process of the step S30 as shown in FIG. 23B. In this case, the pressure inside the remote plasma source 62 is stabilized and stabile plasma formation becomes possible.

Next, in the step S31 corresponding to the process of FIG. 23A, the rotary valve 25B is closed and the rotary valve 25A is set to have the degree of valve opening of 6 mm, for example. Further, by introducing TMA from the processing gas inlet port 13A in this state, the TMA molecular layer is absorbed upon the surface of the substrate to be processed with the thickness of about one molecular layer.

Next, the high-speed rotary valves 25A and 25B are fully opened again in the step S32, and TMA remaining in the reaction vessel 202 is purged. In this state, too, the valve 61 of the remote plasma source 62 may be closed as shown in FIG. 23A. On the other hand, it is also possible to open the valve 61 in the purging process of the step S30 as shown in FIG. 23B in the case the degree of invasion of the residual processing gas is small. In this case, the pressure inside the remote plasma source 62 is stabilized, and thus, the plasma is stabilized also.

Further, in the step S33 corresponding to the process of FIG. 21B, the high-speed rotary valves 25A and 25B are opened, and introduction of TMA from the processing gas inlet port 13A is interrupted. Further, by closing the variable conductance valve 15C and opening the valve 61, the oxygen radicals are introduced to the reaction vessel 202 and the TMA molecular layer already absorbed on the surface of the substrate to be processed is oxidized. As a result, an $Al_2O_3$ film of the thickness of one molecular layer is formed on the surface of the substrate to be processed.

Further, in the step S34, the high-speed rotary valves 25A and 25B are fully opened, and the reaction vessel 202 is purged while introducing the Ar gas from the processing gas inlet port 13A. Here, it should be noted that, in the step S34, the variable conductance valve 15C is in the opened state.

The step S34 is the same process as the step S30 explained previously, and thus, it becomes possible to grow the $Al_2O_3$ film one molecular layer by one molecular layer on the surface of the substrate to be processed by repeating steps S31-S34.

According to the present embodiment, the purging time in the step S10, and hence in the step S34, is reduced by using the oxygen radicals for the oxidation of the TMA molecular layer, and the efficiency of substrate processing is improved.

Further, it should be noted that the film formed in the present invention is not limited to an $Al_2O_3$ film, but it is possible to form a $ZrO_2$ film by using a $ZrCl_4$ gas or an $HfO_2$ film by using an $HfCl_4$ gas, for example.

Further, it is possible for the remote plasma source 62 to form nitrogen radicals by being supplied with a nitrogen gas.

Figure 5:
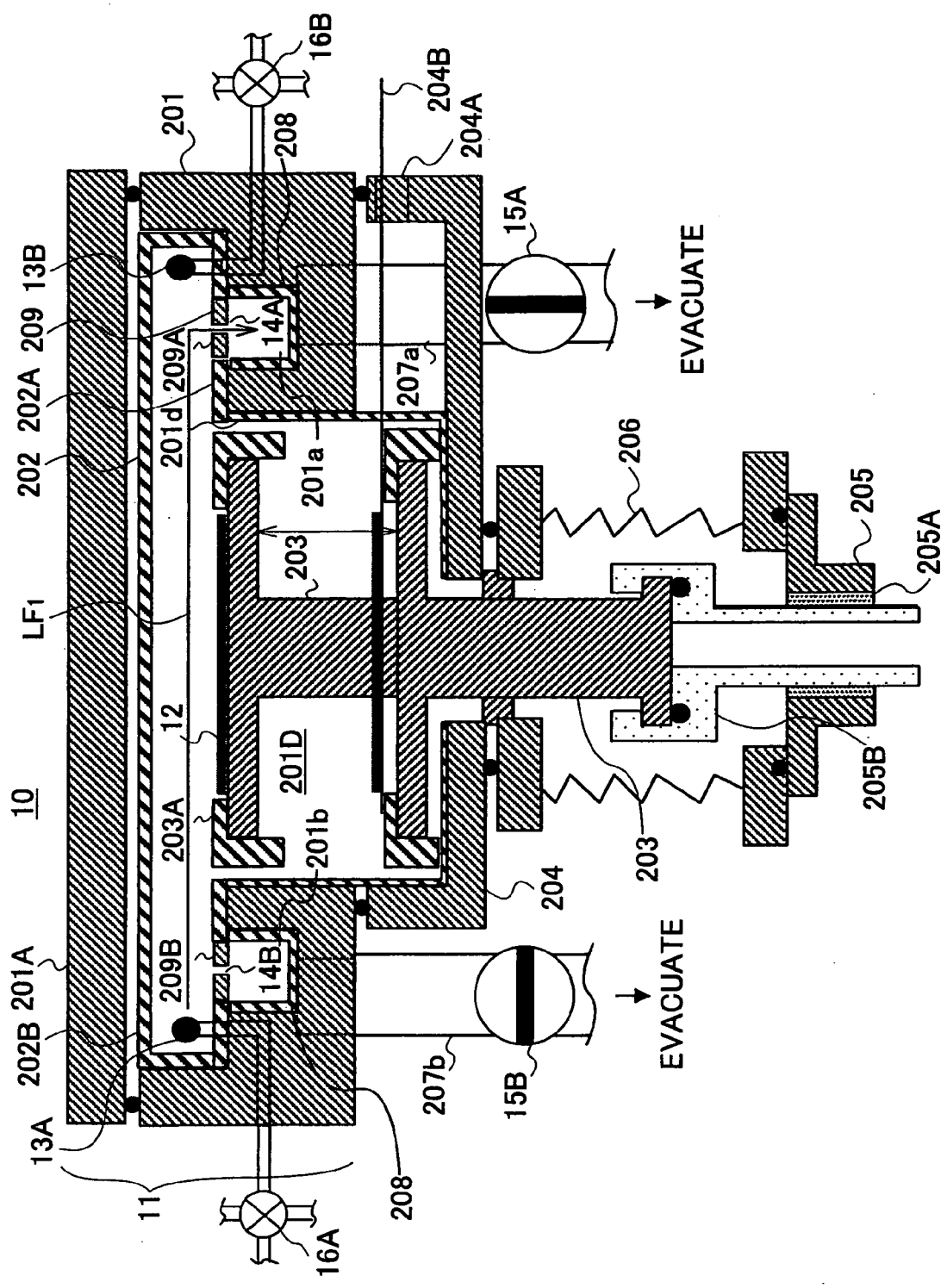
FIG. 5 is a diagram showing the ALD process carried out in the processing vessel of FIG. 2.
Figure 6:
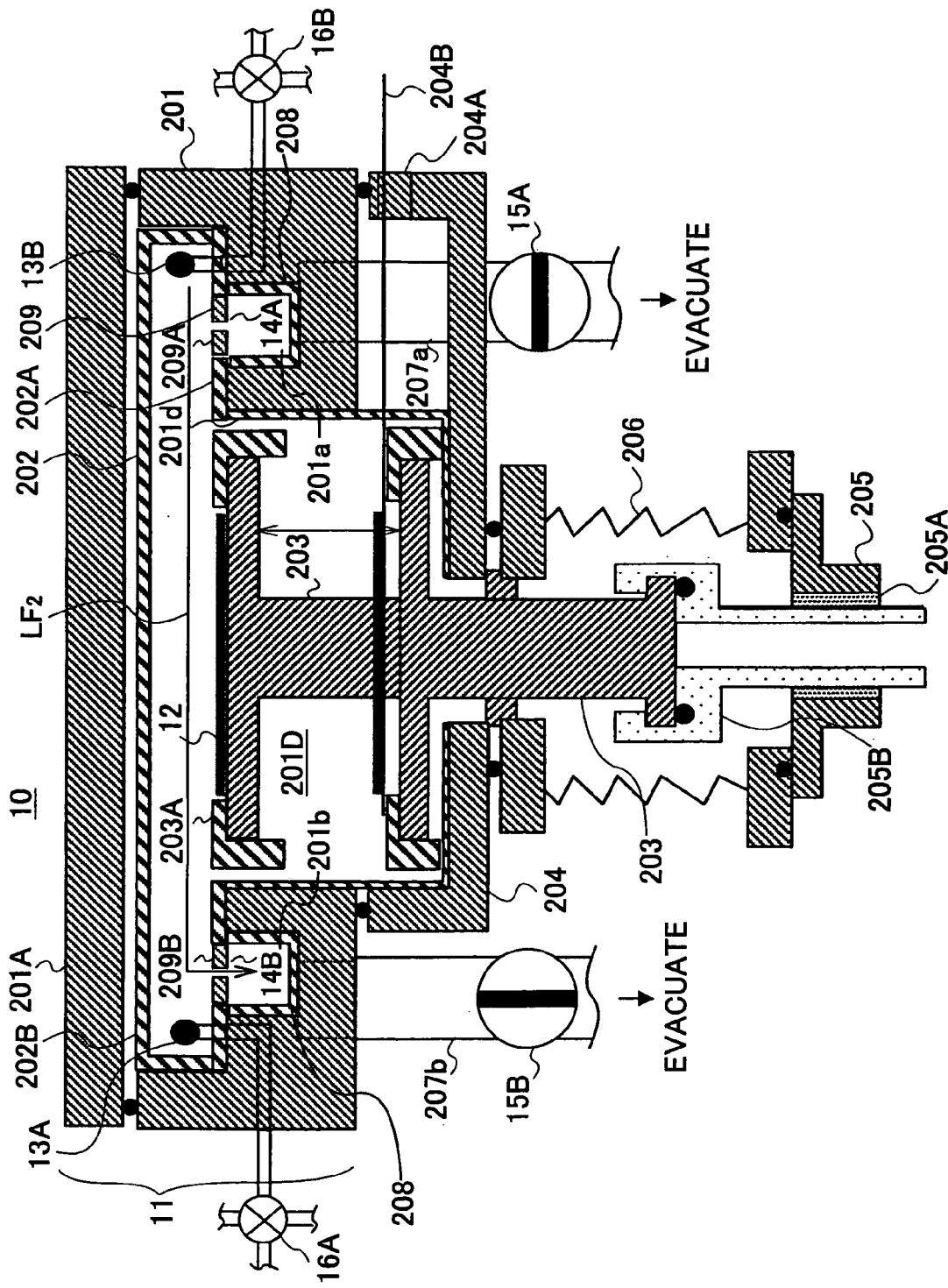
FIG. 6 is another diagram showing the ALD process carried out in the processing vessel of FIG. 2.

In the present embodiment, as a result of providing the remote plasma source 62 to a part of the evacuation system, there is caused no invasion of radicals into the reaction vessel 202 in the case driving of the remote plasma source 62 is made continuously in the process such as the process of the step S11 of FIG. 22, in which the processing gas is introduced so as to cover the surface of the substrate surface to be processed with the processing gas molecules. Thereby, there is no need of controlling the remote plasma source 62 ON and OFF, and it becomes possible to supply the plasma stably even in the case the substrate processing apparatus is operated with a short cycle. Because of, the substrate processing apparatus of FIG. 5 can perform the so-called atomic layer CVD process with large throughput.

FIG. 24A shows case of supplying the processing gas such as TMA from the processing gas inlet port 13B opposite to the processing gas inlet port 13A in step S31 of FIG. 22.

In this case, the processing gas thus introduced from the valve 16B via the processing gas inlet port 13B flows through the processing vessel 202 in the direction of the processing gas inlet port 13A, and is evacuated to the exhaust conduit 207b through the high-speed rotary valve 25A, which is in the fully opened state. Thereby, the variable conductance valve 15C provided to the conduit 207b is fully opened also, and as a result, the processing gas is evacuated through the valve 15C.

In the condition of FIG. 24A, it should be noted that the valve 61 of the remote plasma source 62 has to be closed in view of the fact that the processing gas of high concentration flows through the conduit 207b. Otherwise, the processing gas such as TMA may be oxidized with the oxygen radicals in the conduit 207b deposition may be caused.

It should be noted that the state of FIG. 24B is an oxidation process corresponding to the step S33 of FIG. 22, and oxygen radicals are introduced into the processing vessel 202 from the remote radical source 62 through the fully opened high-speed rotary valve 25B similarly to the case of FIG. 21B. The oxygen radicals are then caused to flow along the surface of the substrate to be processed and evacuated through the high-speed rotary valve 25A, which is in the fully opened state. In this state, the variable conductance valve 15C is closed.

Sixth Embodiment

Figure 25:
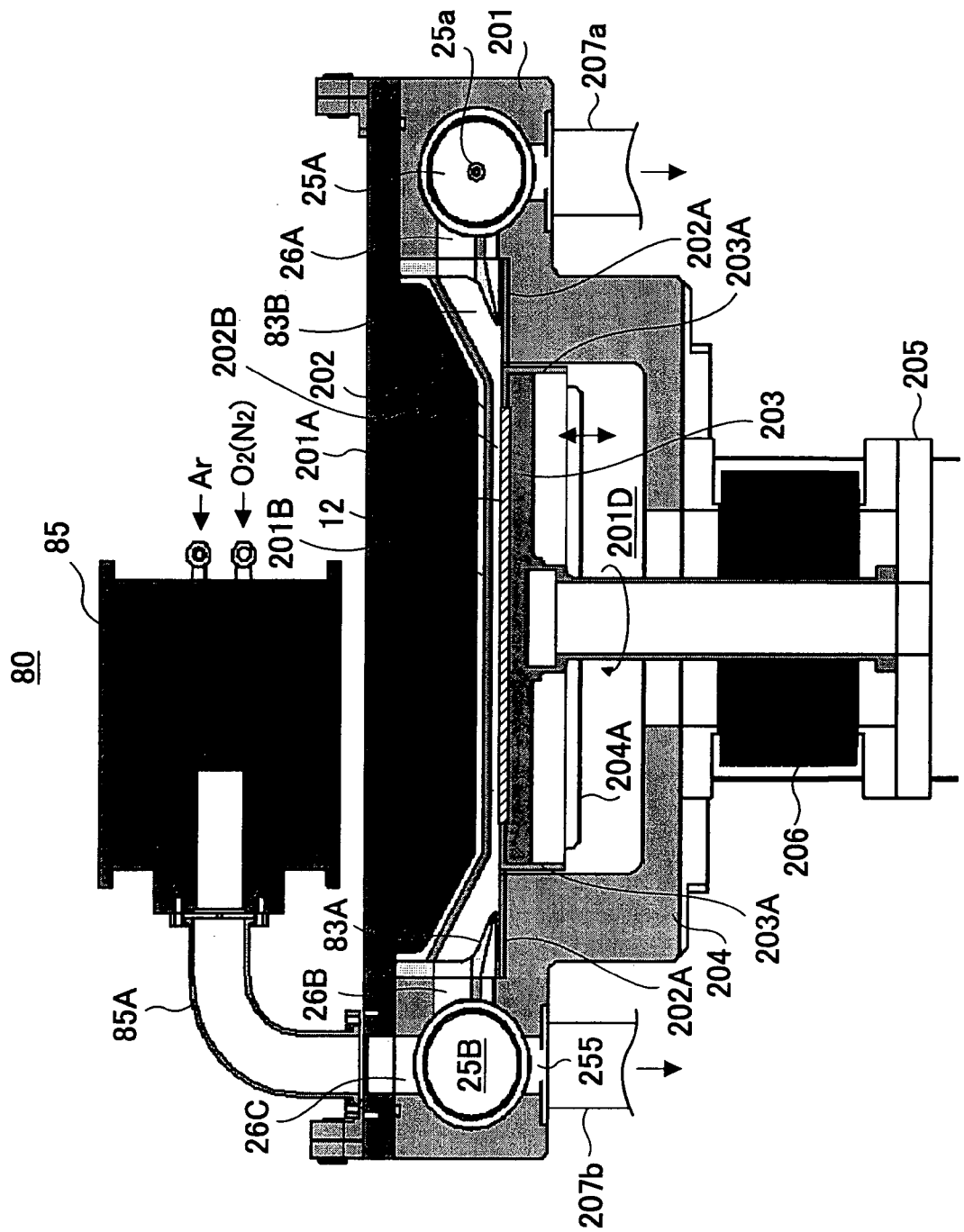
FIG. 25 is a diagram showing the construction of a deposition apparatus according to a sixth embodiment of the present invention.

FIG. 25 shows the construction of a substrate processing apparatus 80 according to a sixth embodiment of the present invention, wherein those parts of the drawing explained previously are designated by the same reference numerals and the description thereof will be omitted. It should be noted that FIG. 25 shows the state in which the stage 203 is lifted to the processing position. In the construction of FIG. 25, a substrate transportation part 204A is provided so as to locate intermediate of the high-speed rotary valves 25A and 25B.

Referring to FIG. 25, the substrate processing apparatus 80 has a construction generally corresponding to the substrate processing apparatus 40 explained previously, except that a processing space 201B is formed under the cover plate 201A and the quartz reaction vessel 202 is formed in the processing space 201B so as to come close to the surface of the substrate 12 to be processed in the part corresponding to substrate 12 to be processed. Thereby, a flat, low-profile gas passage 202B is formed in the processing space 201B between the substrate 12 to be processed and the quartz reaction vessel 202. Further, in correspondence to the form of such a quartz reaction vessel 202, the cover plate 201A is formed to have a shape in which the thickness thereof is increased at the central part. By forming such a low-profile and extremely flat gas passage 202B at the surface of the substrate 12 to be processed, there occurs an increase of velocity of the gas flow passing over the surface of the substrate 12 to be processed in the form of the laminar flow, and as a result, uniform adsorption of the gaseous source molecules upon the surface of the substrate 12 is guaranteed. Further, because the effective volume inside the processing vessel 201 is decreased, the efficiency of purging is improved and it becomes possible to carry out the atomic layer CVD process efficiently by switching the processing gases in short time.

Further, in the substrate processing apparatus 80 of FIG. 25, processing gas inlet ports 83A and 83B of bird's beak form are provided at the inner side of the high-speed rotary valves 25A and 25B, in other words, at the side closer to the substrate 12 to be processed in communication with the flat gas passage 202B, in place of the processing gas inlet ports 13A and 13B, and a remote plasma source 85 is provided on the cover plate 201A. The remote plasma source 85 is connected to the high-speed rotary valve 25B by the conduit 85A as will be explained below and introduces for example oxygen radicals or nitrogen radicals thus formed into the processing space in the reaction vessel 202. Because of this, the valve 25B has an evacuation opening 255 connected to exhaust conduit 207b and an inlet port 26C to which the conduit 85A is connected.

The rotary valve 25A has the evacuation opening 26A connected to the side part of the reaction vessel 202 and evacuates the processing space inside the reaction vessel 202 in response to the rotation of the valve body 252 as will be explained below. Similarly, the rotary valve 25B has the evacuation opening 26B connected to the side part of the reaction vessel 202 and evacuates the processing space inside the reaction vessel 202 in response to the rotation of the valve body 252.

In the substrate processing apparatus 80 of FIG. 25, a processing gas inlet tube 25a is formed along a rotational axis of the valve 25A inside the high-speed rotary valve 25A, and the processing gas inlet tube 25a is connected to switching valve 16B of FIG. 7.

Figure 26:
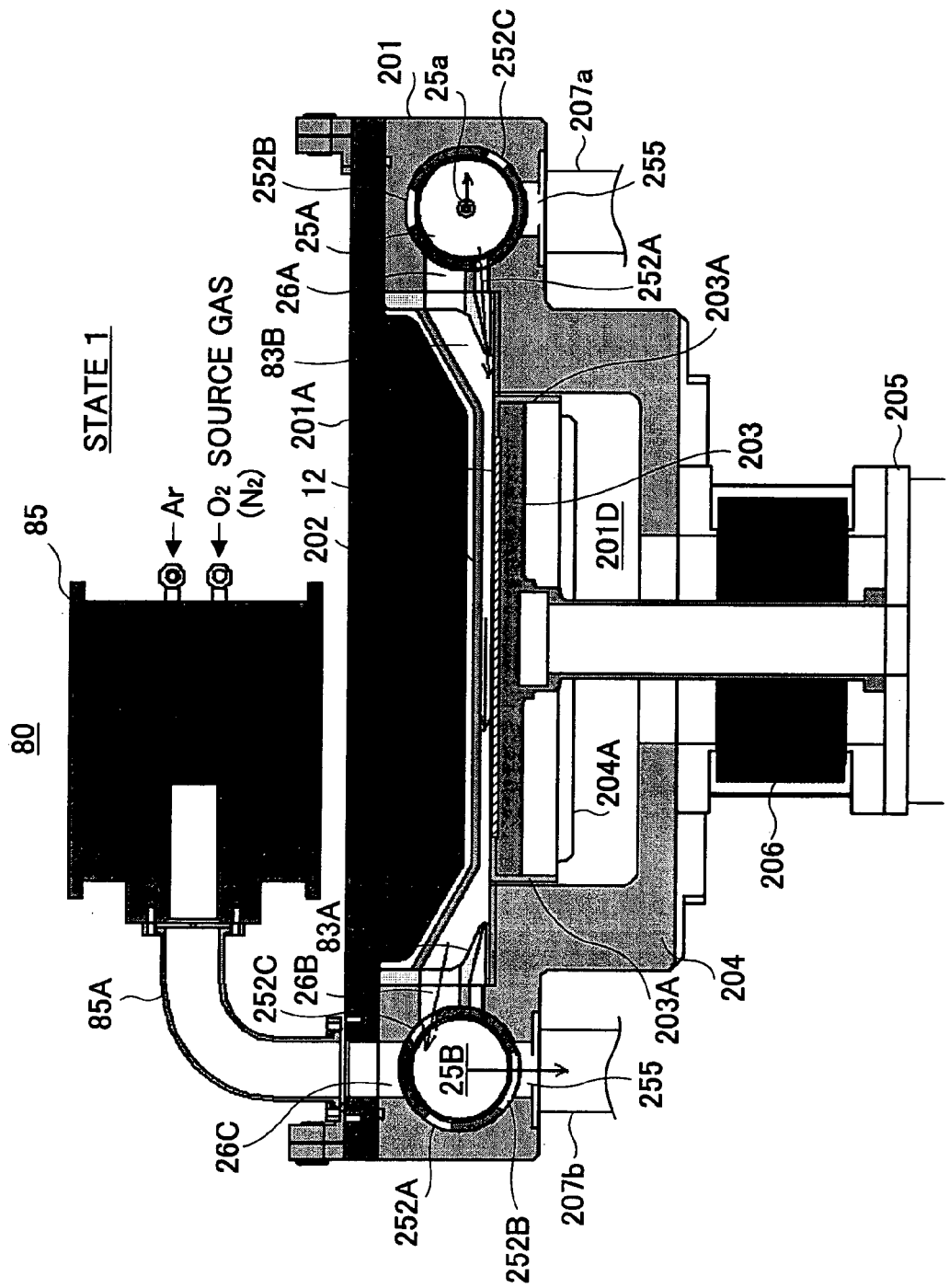
FIG. 26 is a diagram showing a film formation process that uses the deposition apparatus of FIG. 25.

FIG. 26 shows the adsorption process achieved in the substrate processing apparatus 80 of FIG. 25 in the state 1.

Referring to FIG. 26, the high-speed rotary valves 25A and 25B have a large valve opening 252C different form the valve opening 252A and the valve opening 252B explained previously in the valve body 252C, and the openings 252A-252C are formed clockwise in the valve 25A, while the openings 252A-252C are formed in counterclockwise in the valve 25B. Further, in the present embodiment, each of the openings 252B and 252C has an elongate form extending in the axial direction of the valve body 252 similarly to the opening 252A shown in FIG. 11A.

In the state 1 of FIG. 26, the high-speed rotary valve 25B is rotated such that the large opening 252B coincides with the evacuation opening 255, wherein it should be noted that another large opening 252C coincides in this state with the evacuation opening 26B communicating with the processing space in the quartz reaction vessel 202. Thus, the processing space is evacuated to the evacuation conduit 207b through the openings 252C and 252B. Further, in this state, the communication of the valve 25B to the remote plasma source 85 is interrupted, and the communication to the processing gas inlet port 83A is also interrupted.

In the state 1 of FIG. 26, it should further be noted that the high-speed rotary valve 25A is rotated such that the large opening 252A coincides with the processing gas inlet port 83B, and a processing gas such as TMA is introduced into the space in the valve 25A through the processing gas inlet tube 25a from the switching valve 16B. The processing gas thus introduced is introduced into the processing space inside the quartz processing vessel 222 through the opening 252A and the processing gas inlet port 83B, and the source material molecules in the processing gas are absorbed upon the surface of the substrate 12 to be processed during the interval in which the processing gas is discharged through the evacuation opening 26B and the valve 25B.

Figure 27:
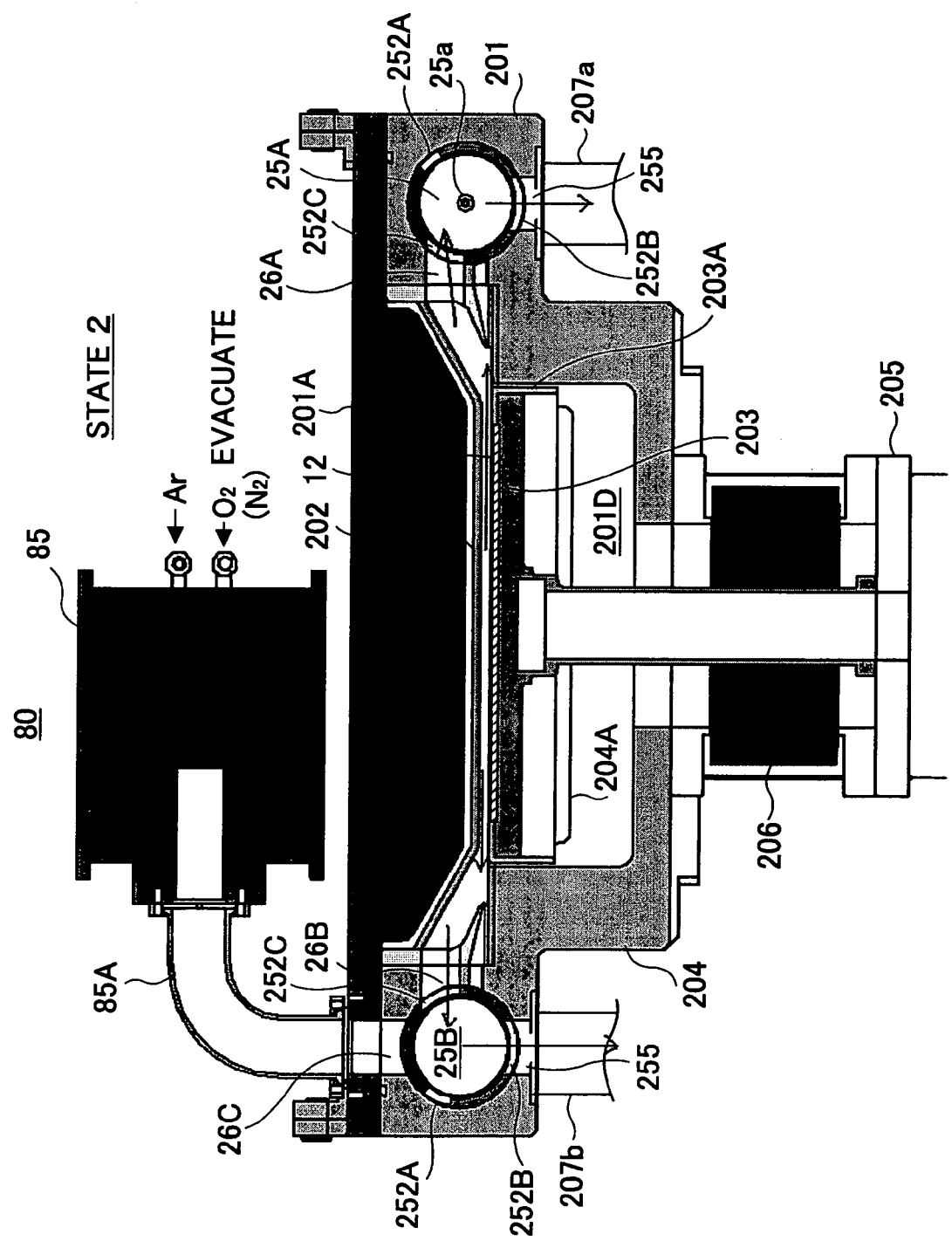
FIG. 27 is another diagram showing the film formation process that uses the deposition apparatus of FIG. 25.

FIG. 27 shows the state 2 of the substrate processing apparatus 80 in the exhaust process where it is carried out following the process of FIG. 26.

Referring to FIG. 27, the high-speed rotary valve 25B is rotated such that a large valve opening 252C coincides with the evacuation opening 26B, another large valve opening 252B coincides with the evacuation opening 255 in this state. Further, similar state is caused in the high-speed rotary valve 25A, and as a result, the processing space inside the quartz reaction vessel 202 is evacuated promptly through the high-speed rotary valves 25A and 25B.

Figure 28:
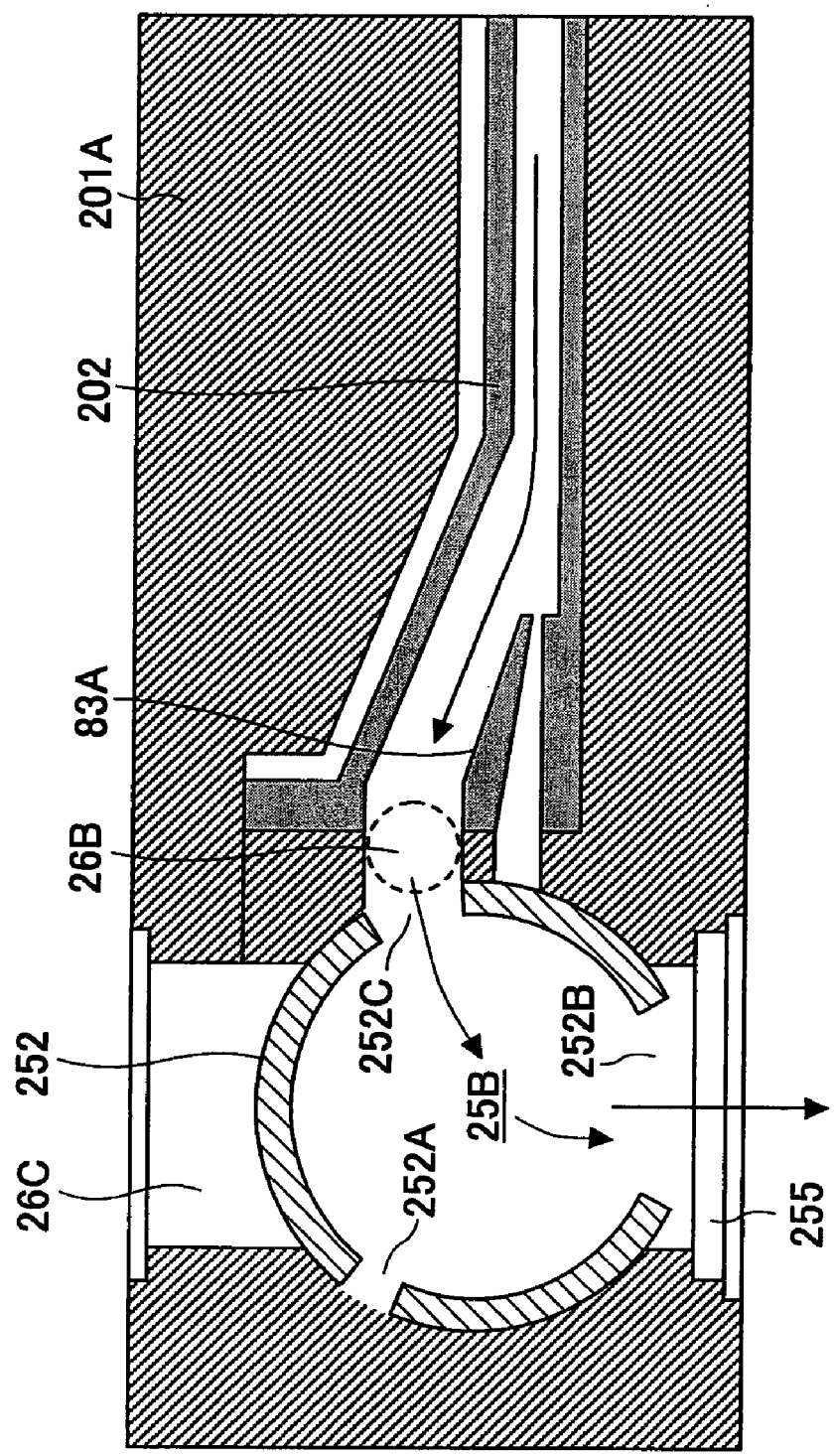
FIG. 28 is a diagram showing a part of FIG. 27 with an enlarged scale.

FIG. 28 shows the part in the vicinity of the high-speed rotary valve 25B in the evacuation process of FIG. 27 with enlarged scale.

Referring to FIG. 28, the processing gas inlet port 83A is formed at a position closer to the substrate 12 to be processed in the present embodiment with respect to the high-speed rotary valve 25B as explained previously, and because of this, the processing gas inlet port 83A is located at the upstream side of the high-speed rotary valve 25B with respect to the gas flow to be evacuated in the evacuation process of FIG. 27, and the gas flows to the evacuation opening 26 along the processing gas inlet port 83A of the birds beak form and flows into the valve 25B through the valve opening 252C. With this, the problem of residence of gas occurring in the region behind the gas inlet port as shown by the broken line is eliminated, and it become possible to evacuate the reaction vessel 202 interior efficiently.

Figure 29:
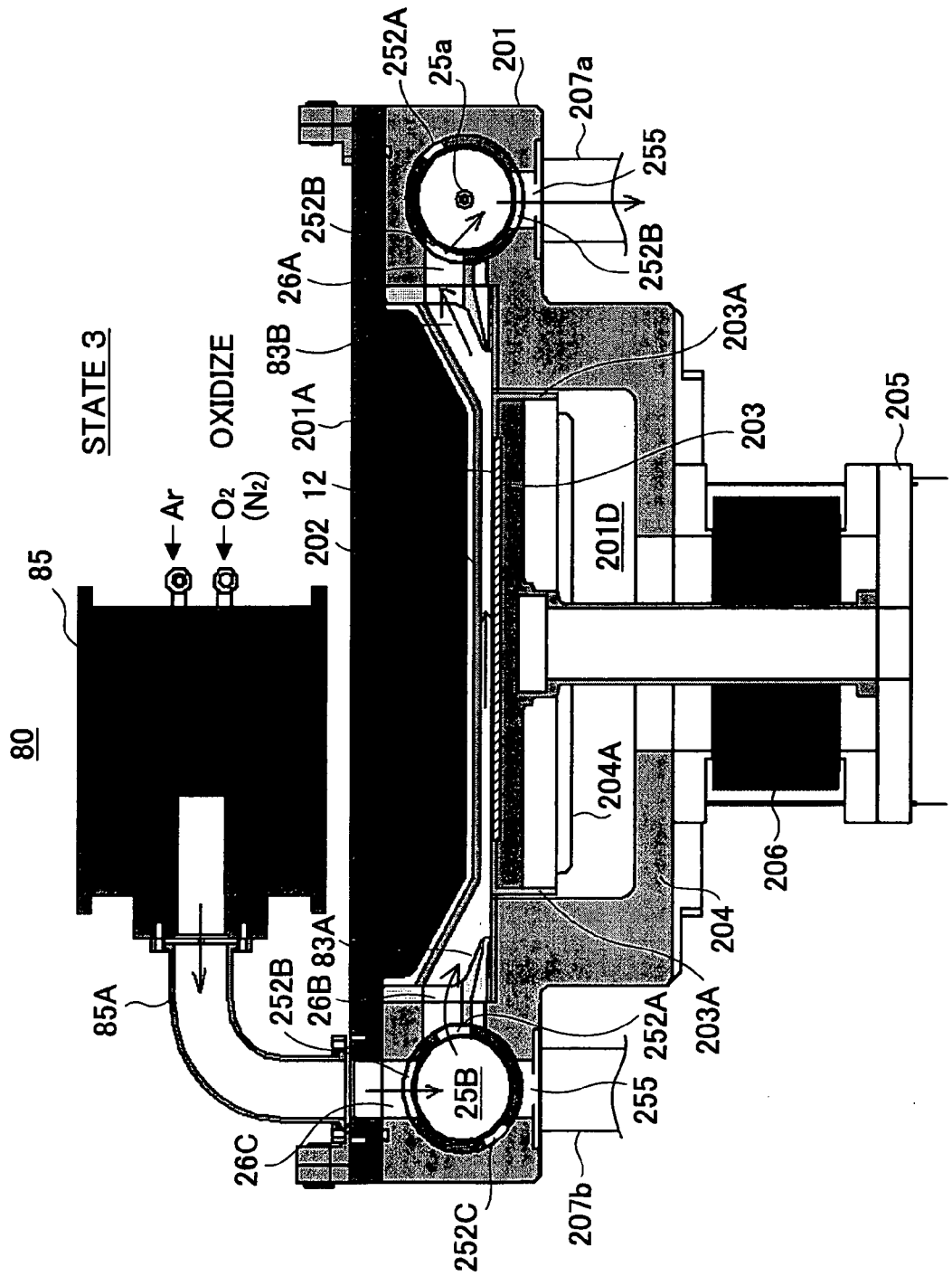
FIG. 29 is a further different diagram showing the film formation process uses the deposition apparatus of FIG. 25.

After the evacuation process of FIGS. 27 and 28, the oxidation processing shown in FIG. 29 is conducted in the state 3 of the substrate processing apparatus 80.

Referring to FIG. 29, an Ar gas and an oxygen gas are supplied to the remote plasma source 85 in the oxidation processing, and oxygen radicals O* are formed by high-frequency excitation conducted with a high frequency power of 400 kHz, for example. Further, in the process of FIG. 29, the high-speed rotary valve 25B is rotated such that the valve opening 252B coincides with the opening 26C. In this state, the valve opening 252A coincides with the evacuation opening 26B.

As a result, the oxygen radicals O* excited in the remote plasma source 85 are introduced into the processing space inside the quartz processing vessel 202 through the valve opening 252A and the evacuation opening 26B in the opposite direction.

Thereby, the high-speed rotary valve 25A is set to the same exhaust position as in the case of FIG. 27, and the oxygen radicals thus introduced through the high-speed rotary valve 25B and the processing gas inlet port 83A are caused to flow through the processing vessel 202 to the evacuation opening 26A of the high-speed rotary valve 25A along the surface of the substrate 12 to be processed, and cause the oxidation of the source material molecules absorbed on the substrate 12 to be processed. Thereby, it becomes possible to avoid the decrease of lifetime the radicals by providing a large area to the valve opening 252A and by introducing the radicals through the evacuation opening 26B.

Further, by carrying out the evacuation process of FIG. 27 after the process of FIG. 29, and by repeating the adsorption process of FIG. 26, the evacuation process of FIG. 27, the oxidation process of FIG. 29 and the evacuation process of FIG. 27, a high-K dielectric film of a metal oxide, and the like, for example, is deposited on the surface of the substrate 12 to be processed one molecular layer by one molecular layer.

Figure 30:
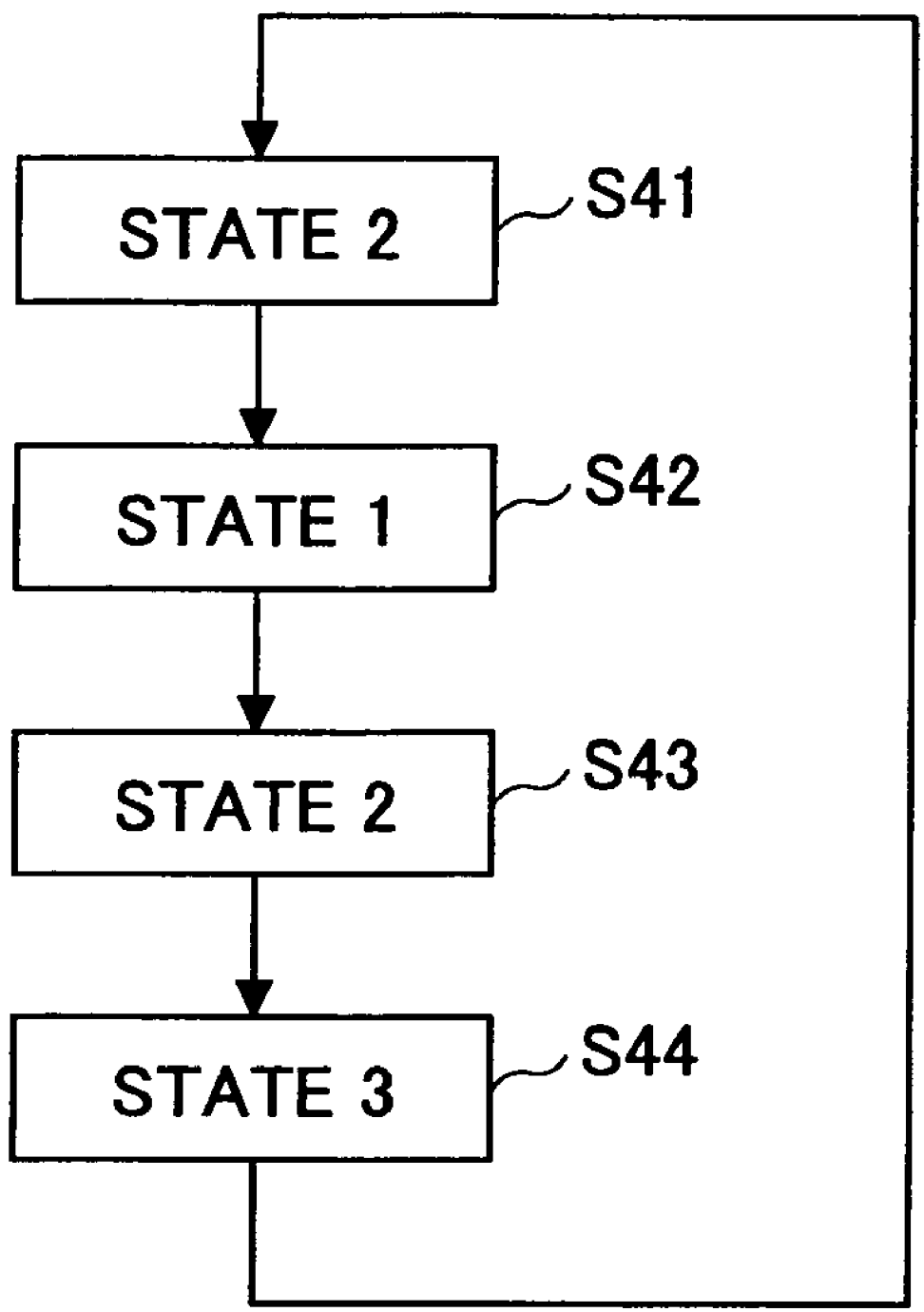
FIG. 30 is a flowchart showing the film formation process that uses the deposition apparatus of FIG. 25.

FIG. 30 shows an example of the substrate processing that uses the substrate processing apparatus 80 of FIG. 25.

Referring to FIG. 30, the substrate processing apparatus 80 is set to the state 2 of FIG. 27 in the step 41, and the processing space inside the reaction vessel 202 is evacuated. Further, an Ar purge gas is introduced from the processing gas inlet port 83A and purging is carried out for the processing gas inlet port 83A and the processing space.

Next, in the step of step 42, the substrate processing apparatus 80 is set to the state 1 of FIG. 26, and a processing gas such as TMA is introduced into reaction vessel 202 from the processing gas inlet port 83B. Thereby, there is caused adsorption of the source molecules on the substrate 12 to be processed.

Next, in the process of step 43, the substrate processing apparatus 80 is returned to the state 2 of FIG. 27, and the processing space inside the reaction vessel 202 is evacuated. Thereby, the Ar purge gas is introduced from the processing gas inlet port 83B in the step 43 and purging is carried out for the processing gas inlet port 83B and the processing space.

Next, in the step 44, the substrate processing apparatus 80 is set to the state 3 of FIG. 29, and radicals such as the oxygen radical formed in the radical source 85 is introduced to the processing space through the high-speed rotary valve 25B and the evacuation opening 26B. Thereby, the source molecules absorbed upon the substrate 12 to be processed 12 undergo oxidation.

Further, the process returns to the step 41, and an $Al_2O_3$ film, for example, is formed on the surface of the substrate 12 to be processed one molecular layer by one molecular layer by repeating the steps 42-44.

Figure 31:
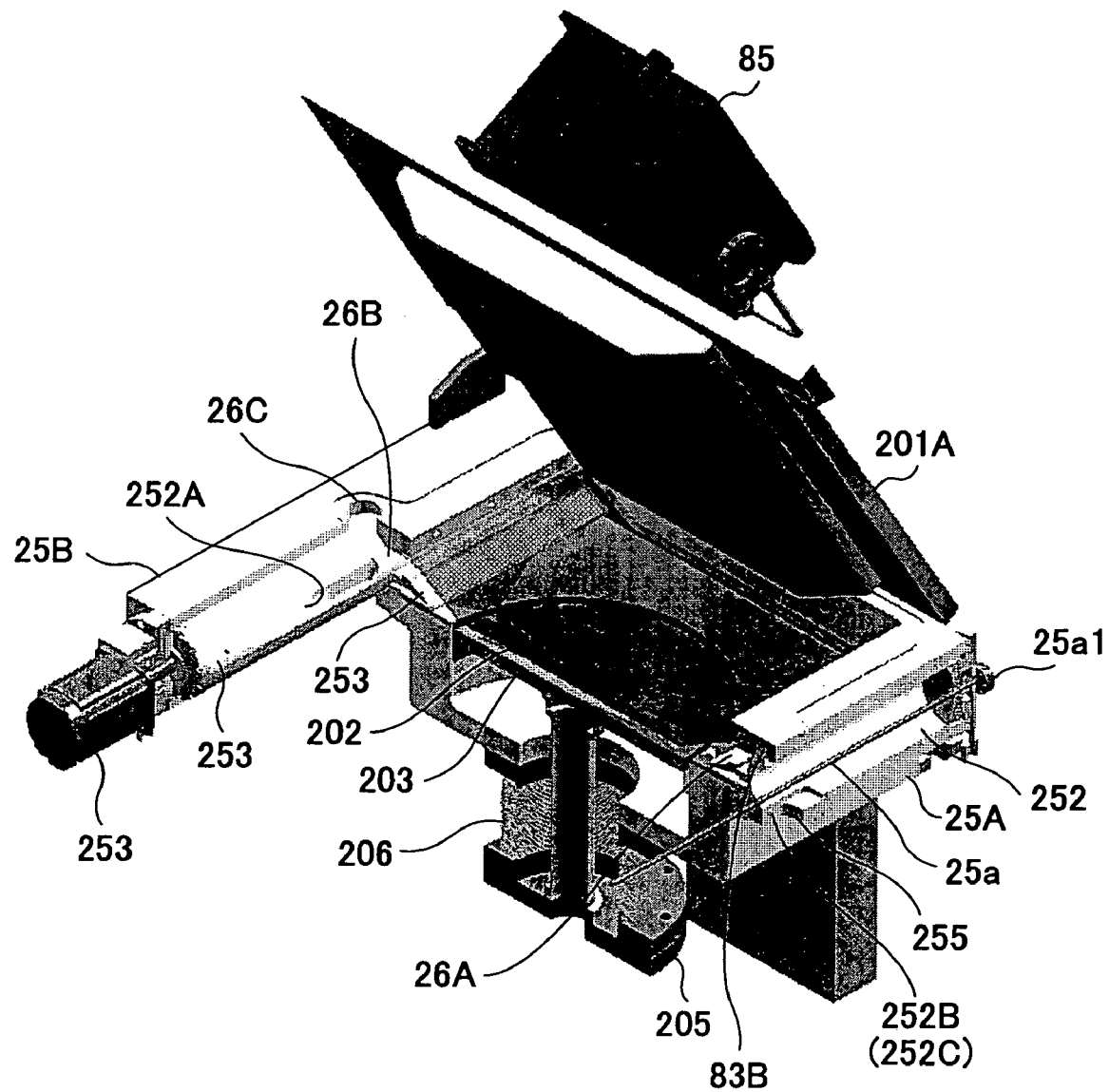
FIG. 31 is a partially removed oblique view diagram showing the entirety of the deposition apparatus of FIG. 25.

FIG. 31 is a partially removed cross-sectional diagram showing the substrate processing apparatus 80 of the present embodiment explained above in the state the cover plate 201A is opened.

Referring to FIG. 31, it can be seen that a gas inlet tube 25a extends in the high-speed rotary valve 25A in the axial direction thereof, and the opening 26C has a generally circular form corresponding to the form of the conduit 85A. Further, it can bee seen that the valve opening 252A, 252B or 252C has an elongated form extending in the axial direction of the valve body 252. Further, a connection part 25a1 of the source gas line is provided to an edge part of the gas inlet tube 25a, and that the valve body 252 is driven by the motor 253 in any of the valves 25A and 25B.

As shown in FIG. 31, the cover plate 201A is provided to so as to be opened and closed freely by a fulcrum not illustrated. By using such a construction, the maintenance of the substrate processing apparatus 80 is facilitated substantially.

Seventh Embodiment

Figure 32:
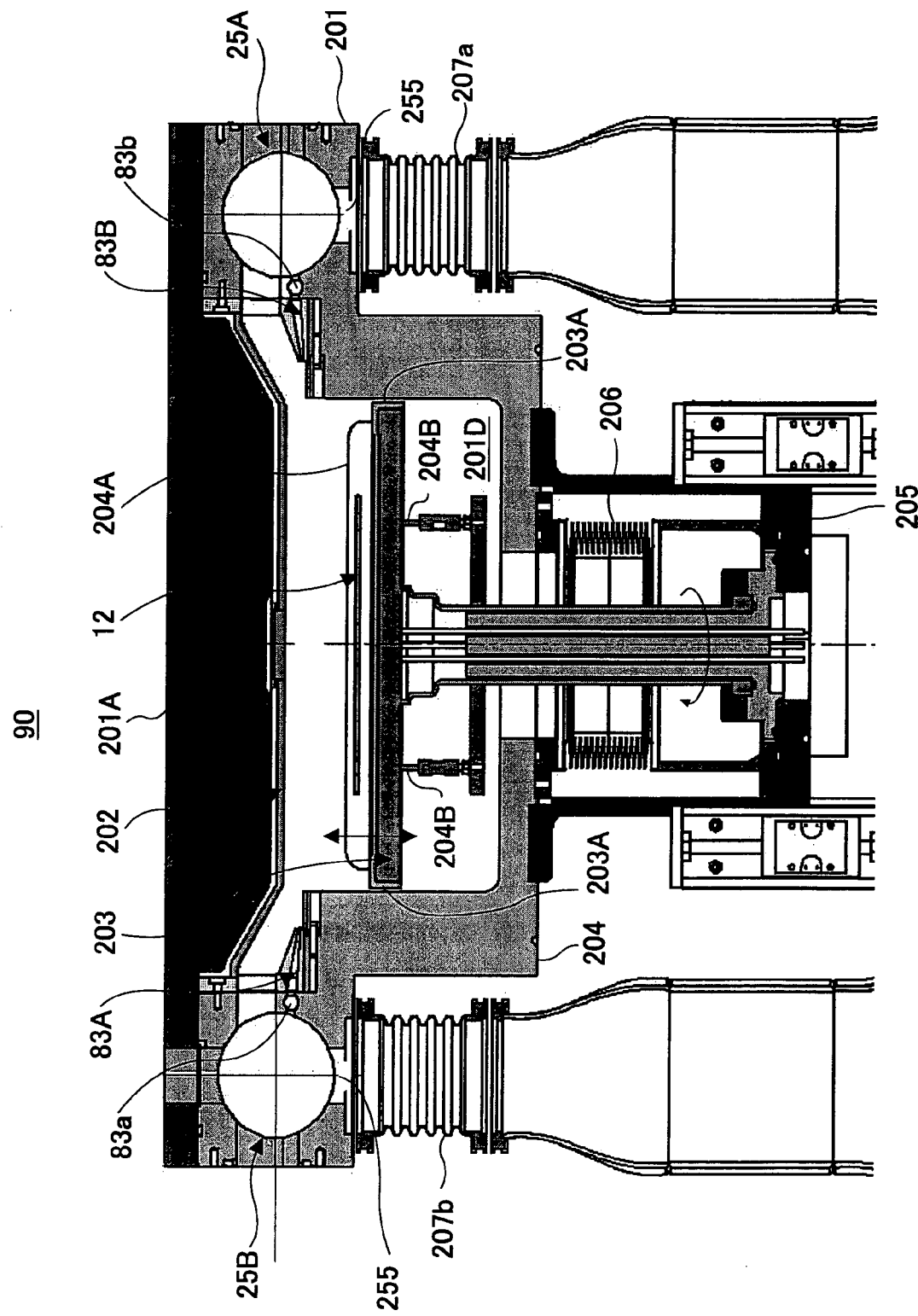
FIG. 32 is a diagram showing the construction a deposition apparatus according to a seventh embodiment of the present invention.
Figure 33:
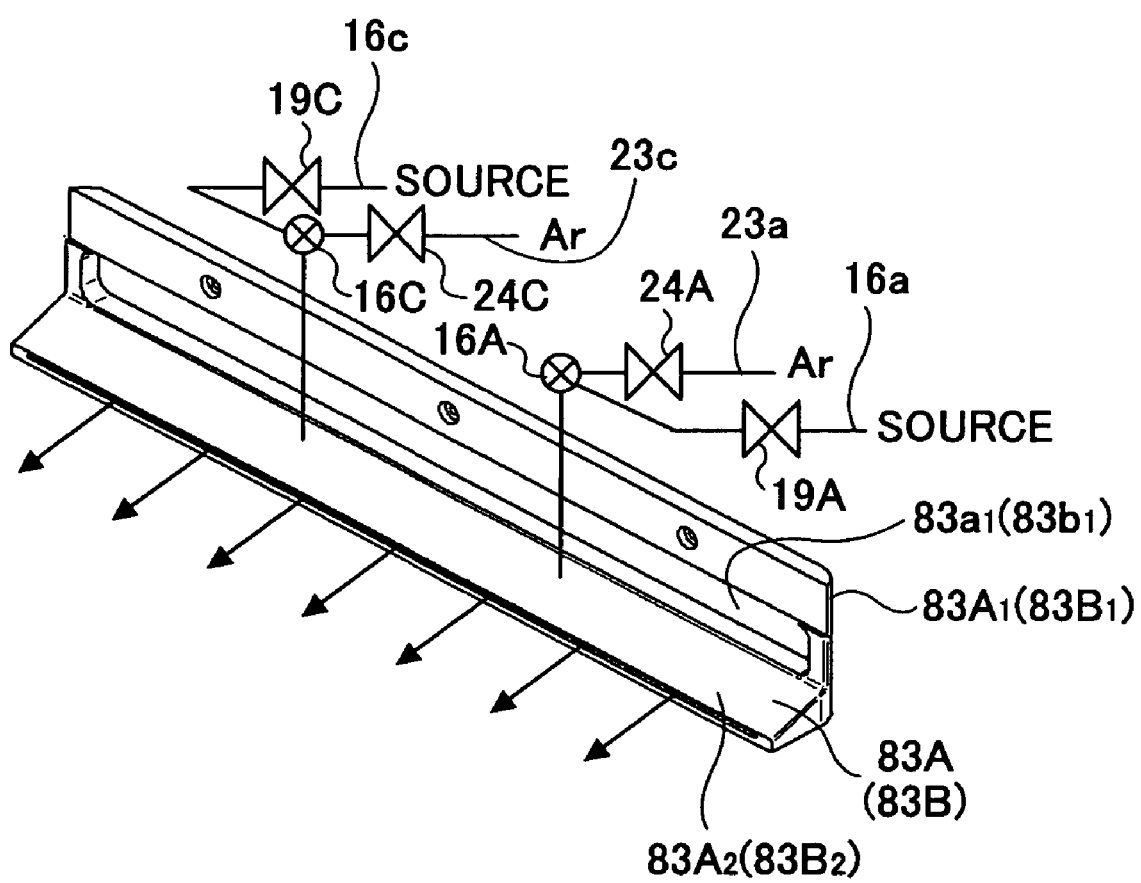
FIG. 33 is a diagram showing the construction of a processing gas inlet port used with the deposition apparatus of FIG. 32.

FIG. 32 shows the construction of a substrate processing apparatus 90 according to a seventh embodiment of the present invention, while FIG. 33 shows the construction of a processing gas inlet port used with the substrate processing apparatus 90 of FIG. 32, wherein those parts in FIGS. 32 and 33 corresponding to the parts explained previously are designated with the same reference numerals and the description thereof will be omitted. It should be noted that FIG. 32 shows the state in which the stage 203 is lowered to a position corresponding to the substrate in/out port 204A and the substrate 12 to be processed 12 is lifted by lifter pins 204B.

Referring to FIG. 32, the substrate processing apparatus 90 has a construction similar to that of the substrate processing apparatus 80 of the previous embodiment, except that a source gas line is connected to the processing gas inlet ports 83A and 83B via a valve as shown in FIG. 33. In the case of the processing gas inlet port 83A, for example, a purge gas such as an inert Ar gas supplied through the line 23a and the valve 24A in FIG. 1 and a source gas such as $ZrCl_2$ or TMA, for example, supplied through the line 16a and the valve 19A are supplied through the switching valve 16A. Further, an Ar purge gas supplied through the line 23c and the valve 24C and a source gas such as $ZrCl_2$ or TMA supplied through the line 16c and the valve 19C are supplied through the switching valve 16C.

Referring to FIG. 33, the inlet port 83A comprises a main body $83A_1$ mounted upon the processing vessel 201 at an end part thereof such that a slit opening $83a_1$ formed therein communicates with the high-speed rotary valve 25A. With this, it becomes possible to evacuate the processing vessel 201 via the slit opening $83a_1$. Further, the main body 83A1 carries thereon a bird's beak nozzle part $83A_2$. The port 83A is connected to the gas lines 16a, 16c, 23a and 23c via respective valves 19A, 19C, 24A, 24C and switching valves 16C and 16A and supplies a gas into the quartz reaction vessel 202 in the form of sheet-like laminar flow. As the inlet port 83B has a similar construction, the description thereof will be omitted. It should be noted that FIG. 33 merely shows the connection of the gas lines 16a, 16c, 23a and 23c to the port 83A schematically. The detailed description of supplying of the gas to the port 83B (or 83A) will be described later with reference to FIGS. 46A and 46B.

Further, it should be noted that the remote plasma source 85 used with the substrate processing apparatus 80 of FIG. 32 is not provided in the substrate processing apparatus 90.

Figure 34A:
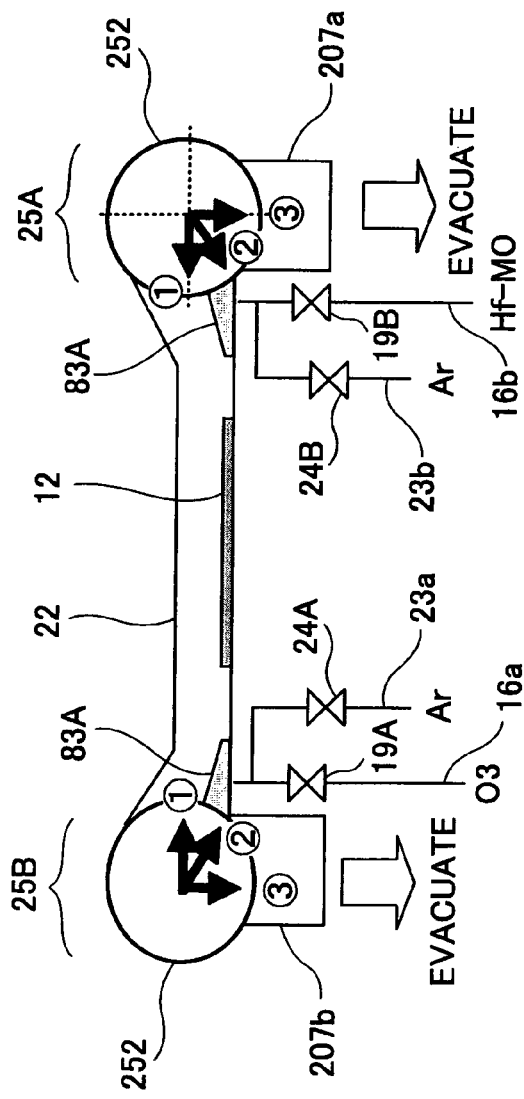
FIGS. 34A-34C are diagrams for explaining the high-speed rotary valve used with the deposition apparatus of FIG. 32.

FIG. 34A shows the construction of the high-speed rotary valves 25A and 25B used with the substrate processing apparatus 90 of FIG. 32, particularly the construction of the valve body 252 used in the respective valves in detail.

Figure 34C:
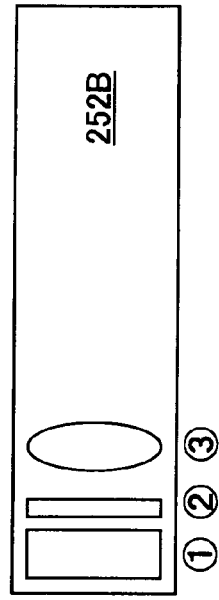
Figure 34B:
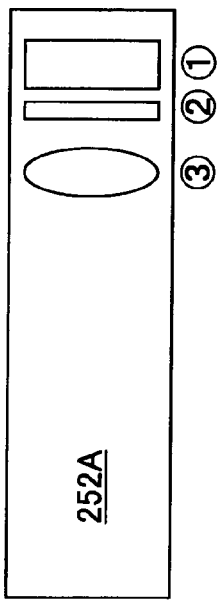

Referring to FIG. 34A, valve openings ①-③ corresponding to the valve openings 252A, 252B, and the like, explained previously, are formed in the high-speed rotary valves 25A and 25B, wherein FIG. 34B shows the valve body 252 for use in the valve 25A formed with the valve openings ①-③ in the form of a developed view diagram. Further, FIG. 34C shows the valve body 252 for use in the valve 25B formed with the valve openings ①-③ in the form of a developed view diagram.

Referring to FIGS. 34B and 34C, the openings ①-③ of the valve 25B are formed at a predetermined position with a predetermined width such that in the state of FIG. 34A, the opening ① communicates with the processing space inside the processing vessel 22, such that the opening ② communicates with the processing gas inlet port 83A, and such that the opening ③ communicates with the evacuation conduit 207a via the evacuation opening 255.

In the present embodiment, an ozone gas ($O_3$) is supplied to the processing gas inlet port 83A through the line 16a and the valve 19A, and an organic metal source such as $Hf[N(C_2H_5)_2]_4$ or $Hf[N(CH_3)_2]_4$ is supplied to the processing gas inlet port 83B via the gas line 16b and the valve 19B.

Next, an example of the substrate processing conducted by using the substrate processing apparatus 90 of FIG. 32 with reference to FIGS. 35A-35H.

Figure 35A:
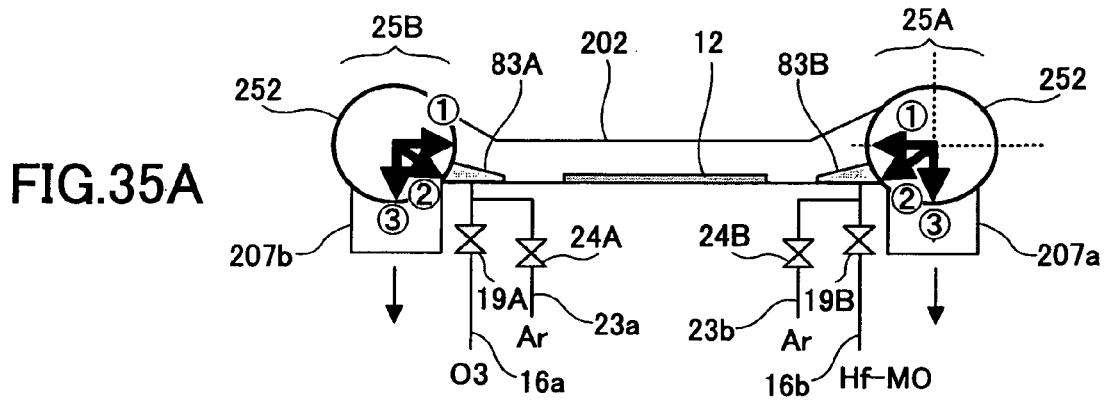
FIGS. 35A-35H are diagrams showing a film formation process carried out by using the deposition apparatus of FIG. 32.

In the step of FIG. 35A, the high-speed rotary valves 25A and 25B are set to the state of FIG. 35A, and as a result, the processing space inside the quartz processing vessel 202 is evacuated to the evacuation conduit 270a or 207b along the path that passes through the openings ① and ③ in any of the valves 25A and 25B. Further, in the state of FIG. 35A, the opening ② coincides with the processing gas inlet port 83A or 83B in any of the valves 25A and 25B, and as a result, the processing gas inlet ports 83A and 83B are evacuated through the opening ③ and the evacuation conduit 207a or 207b.

Figure 35B:
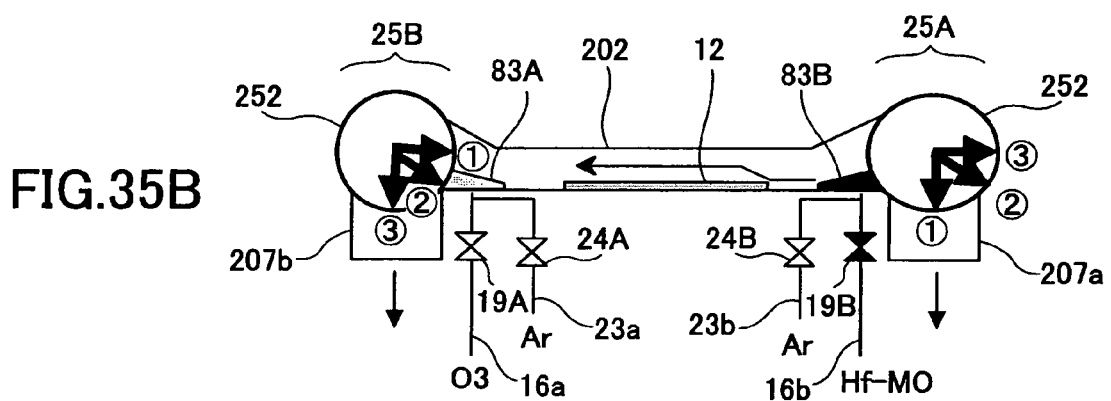

Next in the process of FIG. 35B, the high-speed rotary valve 25B is held in the state of FIG. 35A and the valve body 252 of the high-speed rotary valve 25A is rotated to the position in which the opening ① communicates with the evacuation conduit 207a but none of the openings ②-③ communicates with any of the processing space or the processing gas inlet port 83B. Further, the valve 19B is opened and the organic metal source of Hf in the line 16b is introduced into the processing space through the processing gas inlet port 83B. The organic metal source of Hf thus introduced flows through the processing space along on the surface of the substrate 12 to be processed and absorbed upon the surface of the substrate 12 to be processed.

Figure 35C:
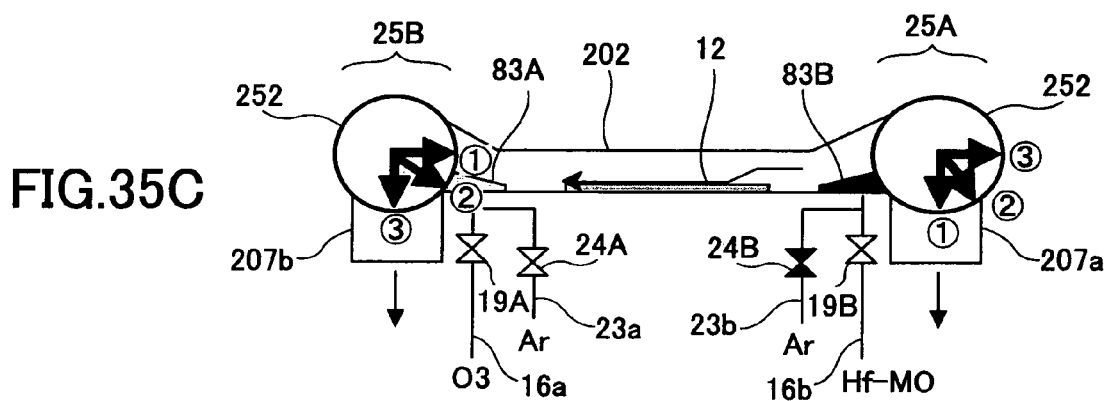

Next, in the step of FIG. 35C, the valve body 252 in the high-speed rotary valve 25A is maintained as it is, and the valve body 252 in the high-speed rotary valve 25B, is returned to the position of FIG. 35A. Thereby, the processing space inside the processing vessel 202 is evacuated to the evacuation conduit 207b. Further, the valve 24B is opened in the step of FIG. 35C and the Ar purge gas in the line 23b is introduced into the processing gas inlet port 83B. As a result, the-processing gas inlet port 83B is purged.

Figure 35D:
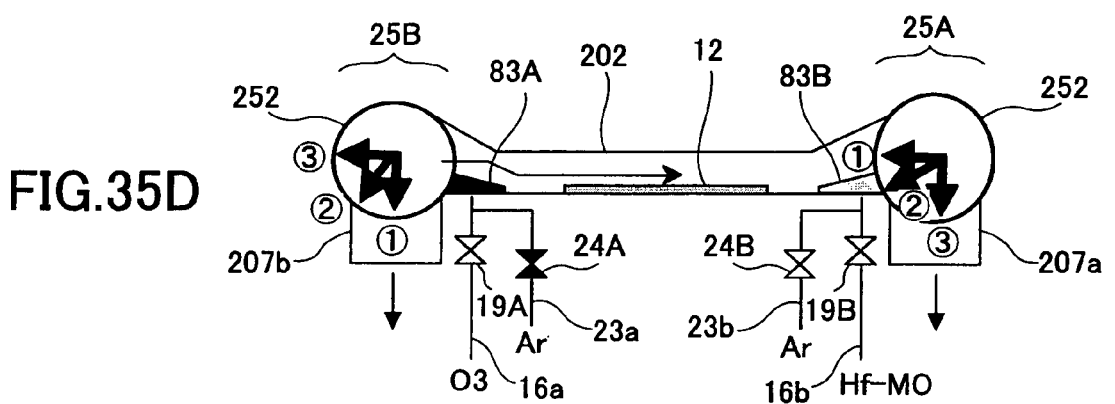

Further, in the step of FIG. 35D, the valve body 252 in the high-speed rotary valve 25A is returned to the state of FIG. 35A, and the processing space inside the processing vessel 202 is evacuated to the evacuation conduit 207a through the openings ①, ② and ③ of the high-speed rotary valve 25A. Further, the valve 24A is opened in the step of FIG. 35D and the Ar purge gas in the line 23a is introduced into the processing gas inlet port 83A. Thereby, the processing gas inlet port 83A is purged.

Figure 35E:
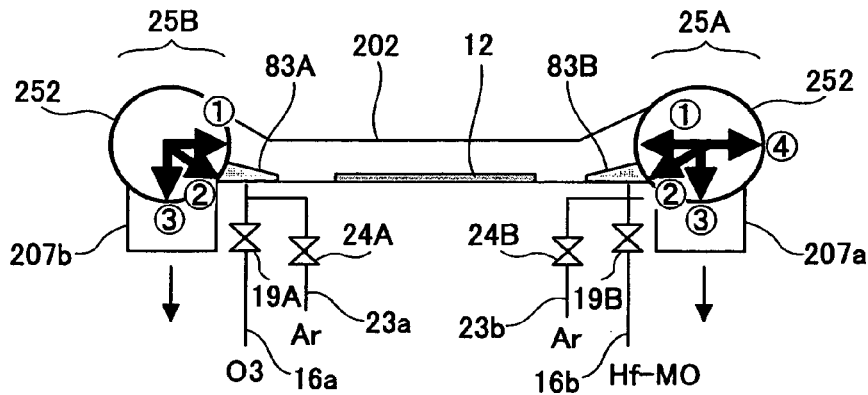

Next, in the step of FIG. 35E, the valve body 252 in any of the high-speed rotary valves 25A and 25B is returned to the state of FIG. 35A, and the processing space inside the processing vessel 202 is evacuated.

Figure 35F:
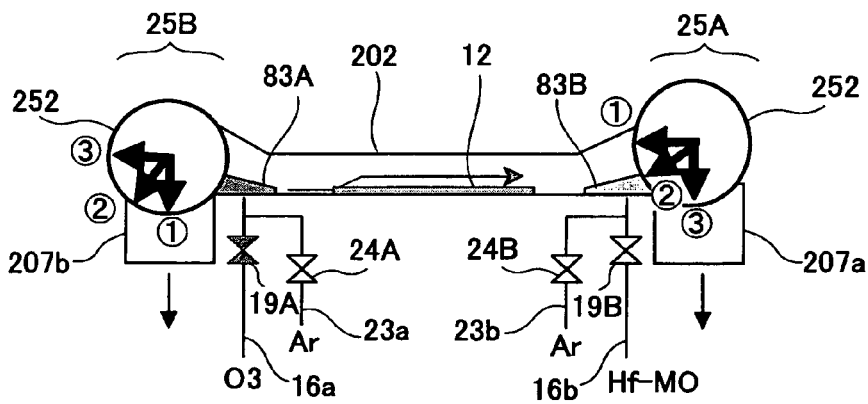

Next, in the step of FIG. 35F, the valve body 252 of the high-speed rotary valve 25A is maintained to the state of FIG. 35E and the valve body 252 in the high-speed rotary valve 25B is rotated to the same position as FIG. 35D. Further, the valve 19A is opened and the ozone gas in the line 16a is introduced into the processing space through the processing gas inlet port 83A. Thereby, the ozone gas thus introduced flows through the processing space along the surface of the substrate 12 to be processed and causes oxidation of the molecules of the organic metal source of Hf absorbed upon the surface of the substrate 12 to be processed. Thereby, an $HfO_2$ film of the thickness of one molecular layer is formed.

Figure 35G:
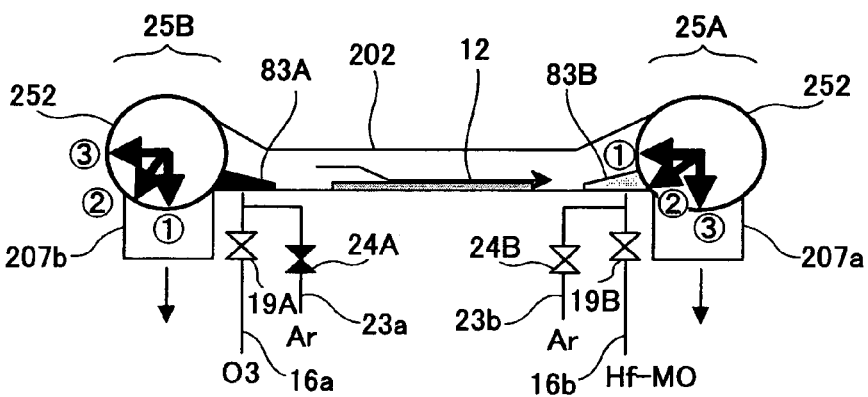

Next, in the step of FIG. 35G, the valve body 252 in the high-speed rotary valves 25A and 25B is held as it is, and the processing space inside the processing vessel 202 is evacuated to the evacuation conduit 207a. Further, the valve 24A is opened in the step of FIG. 35G, and the Ar purge gas in the line 23a is introduced into the processing gas inlet port 83A. As a result, the processing gas inlet port 83A is purged.

Figure 35H:
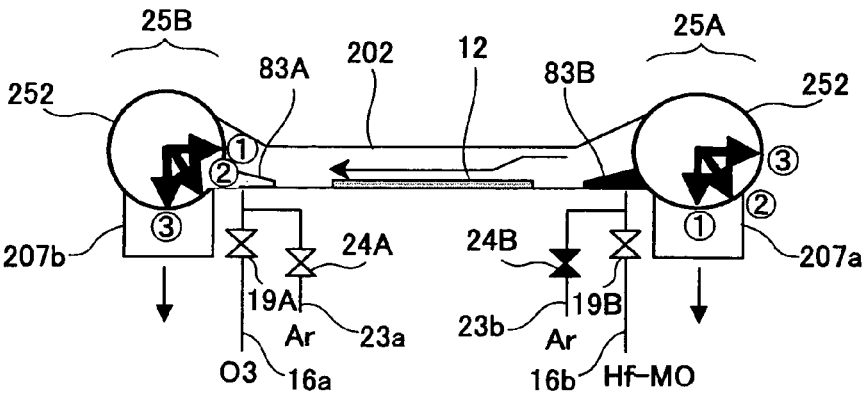

Further, the valve body 252 in the high-speed rotary valve 25A is returned to the state of FIG. 35A in the step of FIG. 35H, and thus, the opening ① communicates with the evacuation conduit 207b and the opening ② communicates with the processing gas inlet port 83A. Further, the opening ③ communicates with the processing space. As a result, the processing space inside the processing vessel 202 is evacuated to the evacuation conduit 207b from the opening ② or ③ through the opening ①. Further, the valve 24B is opened in the step of FIG. 35H, and the Ar purge gas in the line 23b is introduced into the processing gas inlet port 83B. As a result, the processing gas inlet port 83B is purged.

Further, by repeating the steps of FIGS. 35A-35H, the atomic layer growth of the $HfO_2$ film is realized on the substrate 12 to be processed.

Figure 36A:
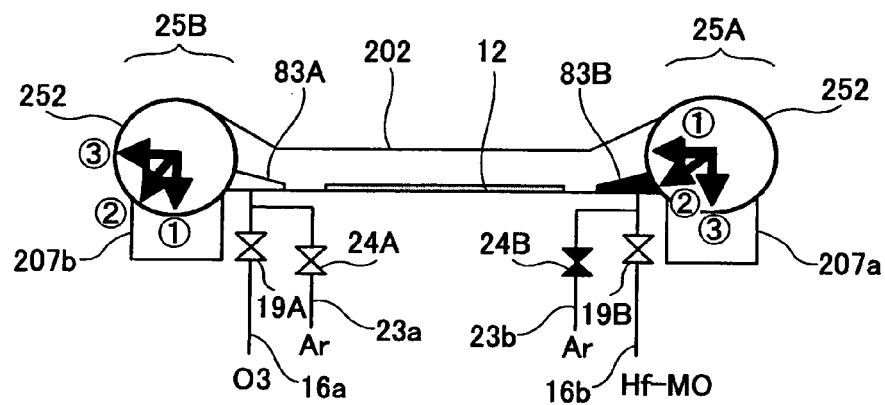
FIGS. 36A and 36B are diagrams showing a modification of the seventh embodiment.

Further, in the present embodiment, it is possible to carry out a nozzle purging step shown in FIG. 36A after the step of FIG. 35B but before the step of FIG. 35F. Further, it is possible to carry out the nozzle purging process shown in FIG. 36B in the next cycle, after the step of FIG. 35F but before the step of FIG. 35B.

Referring to FIG. 36A, the valve body 252 of the high-speed rotary valve 25B is rotated to the position in which none of the openings ①-③ communicates with the processing space in the processing vessel 202, and the valve body 252 is set in the high-speed rotary valve 25A to the position of FIG. 35A.

When the valve 24B is opened in this state, the Ar gas in the purge line 23b is introduced into the processing gas inlet port 83B, while the Ar gas thus introduced flows, as a result of the function of the high-speed rotary valve 25A, through the processing gas inlet port 83B in the direction opposite to the usual gas flow direction in the processing gas inlet port 83B and is evacuated to the evacuation conduit 207a through the openings ② and ③. In the foregoing "usual gas flow direction" noted above, it should be noted that the gas flows from the processing gas inlet port 83B into the processing vessel 202. In the present case, on the other hand, the gas flows in the opposite direction.

Figure 36B:
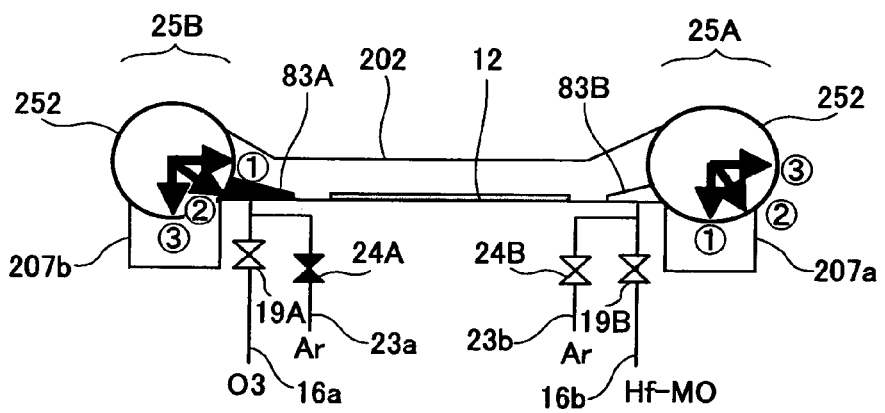

Further, in the example of FIG. 36B, the valve body 252 is rotated in the high-speed rotary valve 25A to the position in which none of the openings ①-③ communicates with the processing space in the processing vessel 202, and the valve body 252 is set to the position of FIG. 35A in the high-speed rotary valve 25B.

When the valve 24A is opened in this state, the Ar gas in the purge line 23a is introduced into the processing gas inlet port 83A, the Ar gas thus introduced flows, due to the function of the high-speed rotary valve 25B, in the direction flows through the processing gas inlet port 83A in the direction opposite to the usual gas flow direction in the processing gas inlet port 83A and is discharged to the evacuation conduit 207b through the openings ② and ③. Again, the foregoing "usual gas flow direction" noted above is defined as the direction of the gas flow from the processing gas inlet port 83A into the processing vessel 202.

Figure 37:
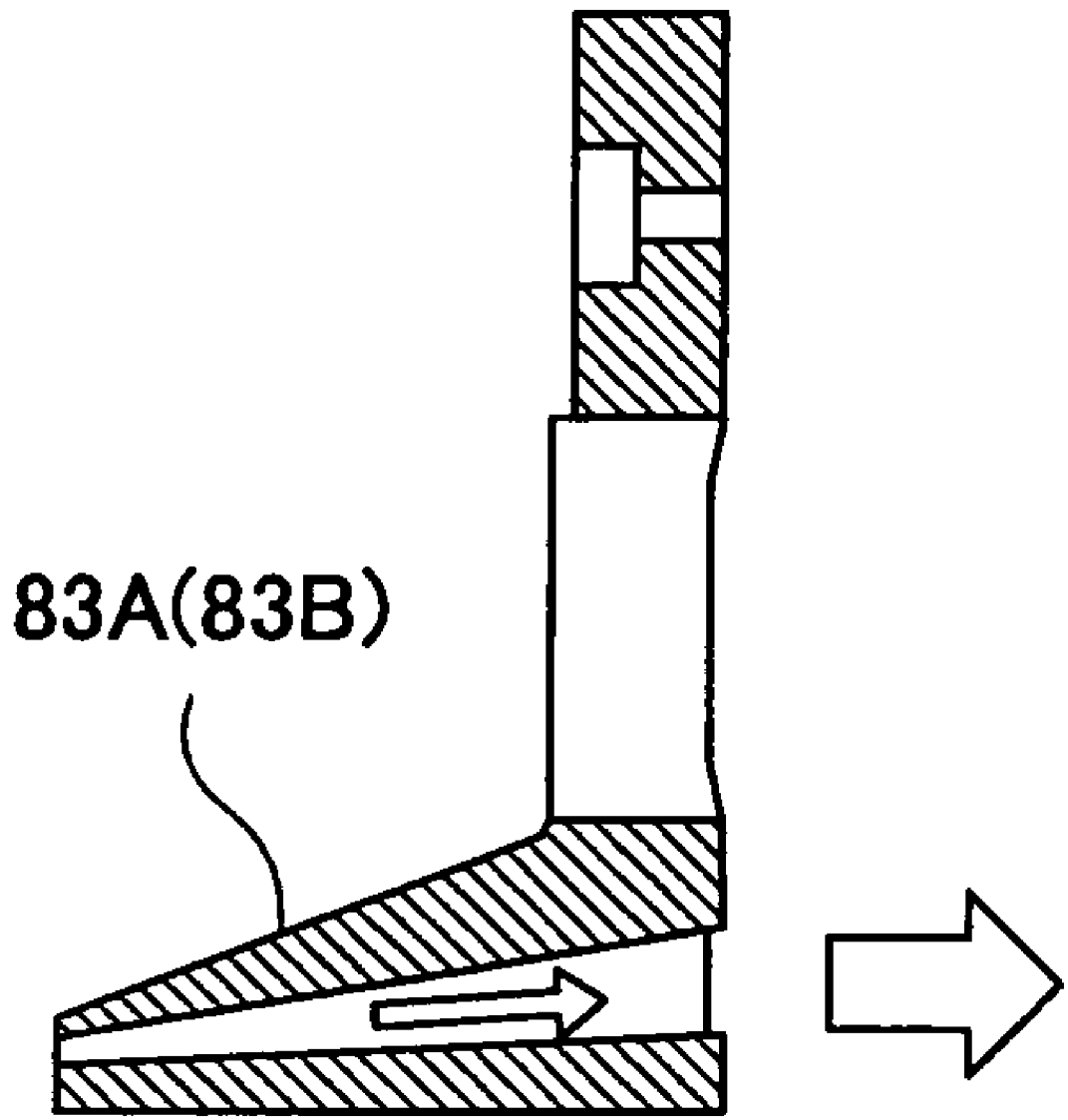
FIG. 37 is a diagram explaining the modification of FIG. 36.

FIG. 37 is a diagram showing the feature of the purging process in the processing gas inlet port 83A or 83B of FIG. 36A or 36B.

Referring to FIG. 37, the purge gas flows from the region of small conductance to the region of large conductance, by causing to flow the purge gas through the processing gas inlet port 83A in the direction opposite to the usual gas flow direction. The definition of the "usual gas flow direction" is given before. As a result, the processing gas inlet port 83A is purged efficiently. In FIG. 37, it should be noted that the small arrow shows the region of small conductance while the large arrow shows the region of large conductance schematically.

Further, it should be noted that the reverse purging process of the nozzle shown in FIG. 37 can be conducted also by opening the valve 24A in the step of FIG. 35C and by introducing an Ar gas into the processing gas inlet port 83A, for example.

Similarly, it is possible to carry out the reverse purging process of the nozzle shown in FIG. 37 by opening the valve 24B with regard to the processing gas inlet port 83B in the step of FIG. 35G and by introducing an Ar gas.

Eighth Embodiment

Figure 38A:
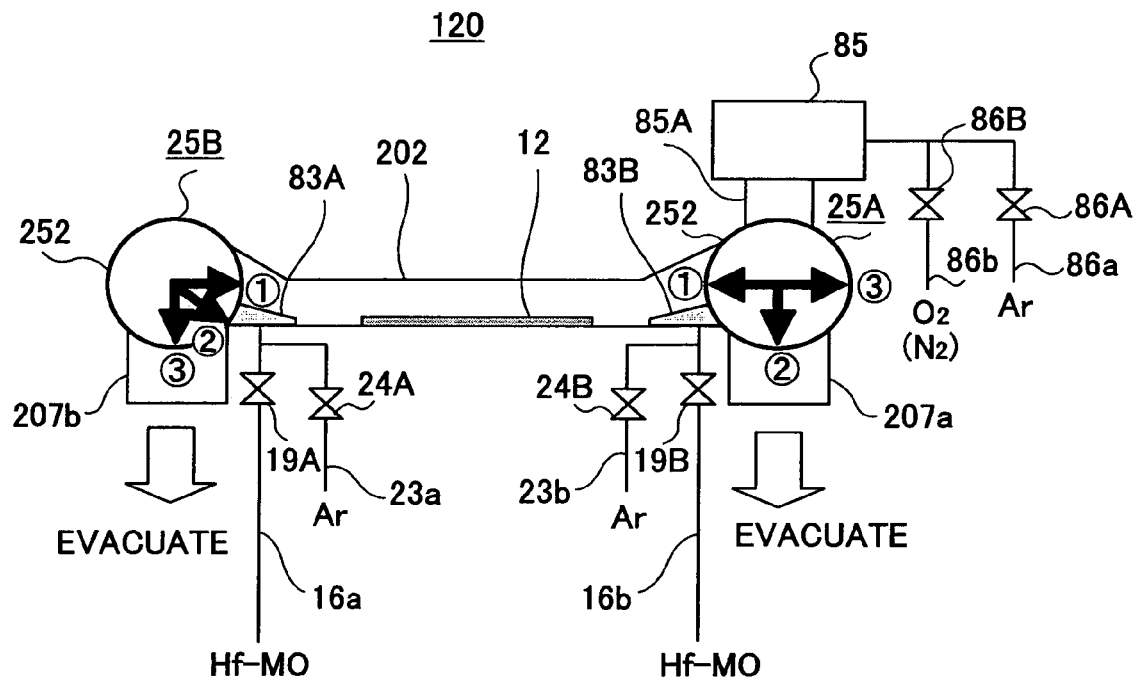
FIGS. 38A-38C are diagrams showing the construction of a deposition apparatus according to an eighth embodiment of the present invention.
Figure 38B:
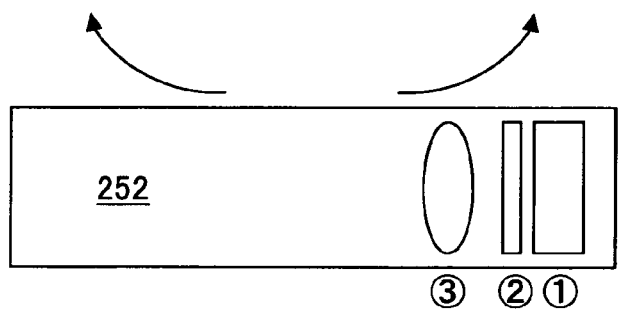
Figure 38C:
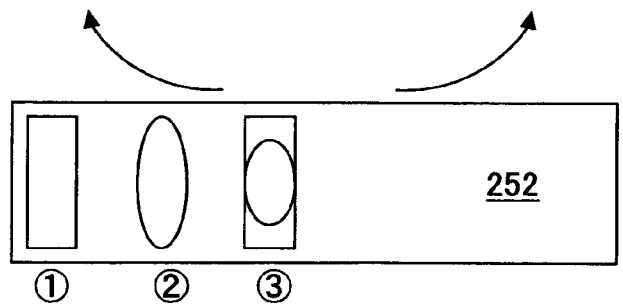

FIGS. 38A-38C show the schematic construction of a substrate processing apparatus 120 according to an eighth embodiment of the present invention, wherein those parts in the drawings explained previously are designated by the same reference numerals and the explanation thereof will be omitted.

Referring to FIG. 38A, the substrate processing apparatus 120 has a construction similar to that of the substrate processing apparatus 100 explained previously, except that the remote plasma source 85 explained with reference to the substrate processing apparatus 80 of FIG. 25 is connected to the high-speed rotary valve 25A via a conduit 85A. Similarly to the embodiment of FIG. 25 or 31, the remote plasma source 85 is provided on the cover plate 201A so as to be opened and closed freely, and an Ar gas is supplied through a valve 86A from a line 86a. Further, an oxygen gas is supplied from a line 83b through a valve 86B. Also, an organic metal source such as Hf, for example, is supplied in the present embodiment from the line 16a through the valve 19A to the processing gas supply opening 83A in place of the ozone gas.

As shown in FIG. 38A, the openings ①-③ shown in the development view diagram of FIGS. 38B and 38C in detail are formed in the high-speed rotary valves 25A and 25B on the respective valve bodies 252 as the valve openings 252A and 252B. More specifically, in the development view diagram of FIG. 38B that corresponds to the high-speed rotary valve 25B, the openings ①-③ are formed such that the opening ② communicates with the gas nozzle 83A and the opening ③ communicates with the evacuation conduit 207b in the state in which the opening ① is communicating with the edge part of the processing vessel 202. Although the opening ③ is formed in a circular or elliptic form, in the illustrated example, it is also possible to form all these openings ①-③ to have a slit form.

On the other hand, in the development view diagram of FIG. 38C corresponding to the high-speed rotary valve 25A, on the other hand, it is necessary that the openings ①-③ can communicate with the radical source 85. Because of this, the distribution thereof is made slightly different over the one shown in FIG. 38B.

Thus, in FIG. 38C, the openings ①-③ are formed such that, the opening ② communicates with the evacuation conduit 207a in the state the opening ① communicates with the edge part of the processing vessel 202 at the side of the evacuation port 25A, and that the opening ② communicates with the radical source 85 in the state in which the opening ③ communicates with the edge part of the processing vessel 202.

In the present embodiment, it should be noted that the source gas is supplied to the gas nozzle 83B while no oxidation gas is supplied. Because of this, there is no need of conducting the purging process for the gas nozzle 83B in the reverse direction as in the case of the previous embodiment. On the other hand, it is also possible to increase the width of the opening ① such that the opening ① communicates with the gas nozzle 83B in the case the opening ① has communicated with the edge part of the processing vessel 202. In this state, the opening ③ communicates with the evacuation conduit 207a. In the construction of FIG. 38C, the openings ① and ② are formed to have a slit form and the opening ③ is formed to have a circular or elliptic form, while it is also possible to form all of the openings ①-③ to have the slit form.

Hereinafter, the process of formation of an $HfO_2$, for example, by using the substrate processing apparatus 120 of FIGS. 38A-38C will be described with reference to FIGS. 39A-39H.

Figure 39A:
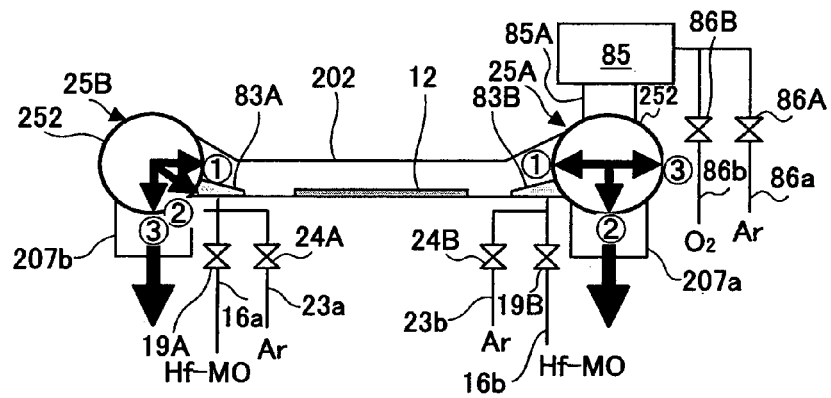
FIGS. 39A-39H are diagrams showing the film formation process carried out by using the deposition apparatus of FIG. 38A.

Referring to FIG. 39A, the high-speed rotary valves 25A and 25B are in the position explained previously with reference to FIG. 35A and the processing space inside the processing vessel 202 is evacuated.

Figure 39B:
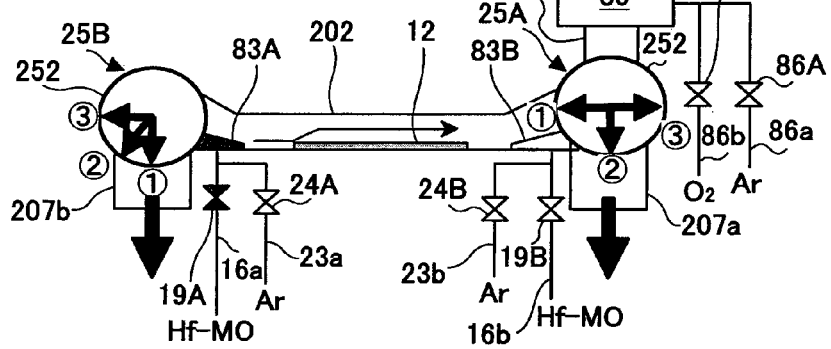

Next, in the step of FIG. 39B, the high-speed rotary valve 25A is held in the state of FIG. 39A, and the valve body 252 inside the high-speed rotary valve 25B is rotated to the position in which the opening ① communicates with the evacuation conduit 207b but none of the openings ② and ③ communicates with the processing space. In this state, the valve 19A is opened and an organic metal source of Hf is introduced into the processing space from the processing gas inlet port 83A.

The organic metal Hf source thus introduced flows through the processing space along the surface of substrate 12 to be processed to the high-speed rotary valve 25A and the molecules of the organic metal source of Hf are absorbed upon the surface of the substrate 12 to be processed. Thereby, the excessive source gas is evacuated to the evacuation conduit 207a from the opening ① of the high-speed rotary valve 25A through the opening ②.

Figure 39C:
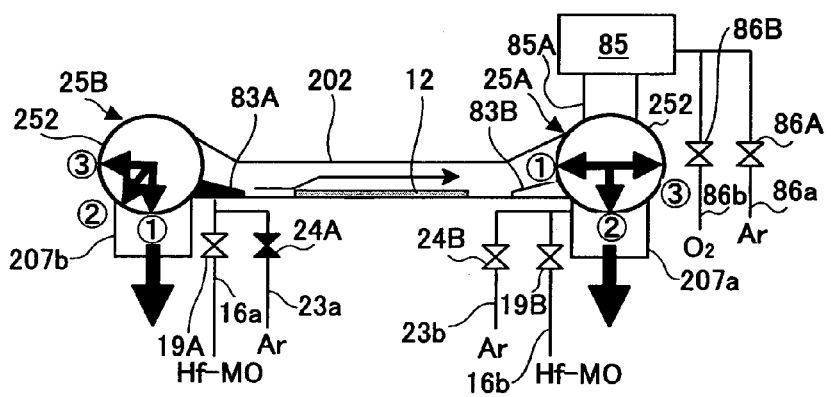

Next, in the step of FIG. 39C, the valve 19A is closed and the valve is 24A opened while holding the high-speed rotary valve 25A in the state of FIGS. 39A and 39B and also holding the state of the high-speed rotary valve 25B as it is. As a result, the Ar gas in the line 23a is introduced into the processing gas inlet port 83A, and the Ar gas thus introduced flows through the processing space along the surface of the substrate 12 to be processed to the high-speed rotary valve 25A. The Ar gas is then evacuated to the evacuation opening 207a from the opening ① of the valve 25A through the opening ②, and with this, the processing gas inlet port 83A is purged.

Figure 39D:
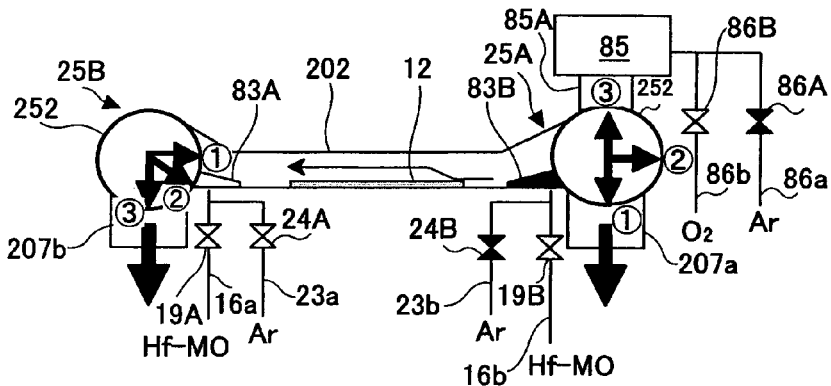

Next, in the step of FIG. 39D, the high-speed rotary valve 25B is returned to the state of FIG. 39A, and the valve body 252 in the high-speed rotary valve 25A is rotated such that the opening ① formed on the valve body communicates with evacuation conduit 207a via the evacuation opening 255 and such that the opening ③ communicates with the conduit 85A of the remote plasma source 85. Further, the valve 86A is opened simultaneously, and the Ar gas in the line 86a is supplied to the remote plasma source 85.

Further, the valve 24B is opened also in the step of FIG. 39D and the Ar gas in the purge line 24b is supplied to the processing gas supply port 83B. With this, purging of the processing gas supply port 83B is achieved. The Ar gas thus introduced from the processing gas inlet port 83B flows through the processing space to the high-speed rotary valve 25B and is evacuated to the evacuation conduit 207b from the opening ① or opening ② via the opening ③.

Figure 39E:
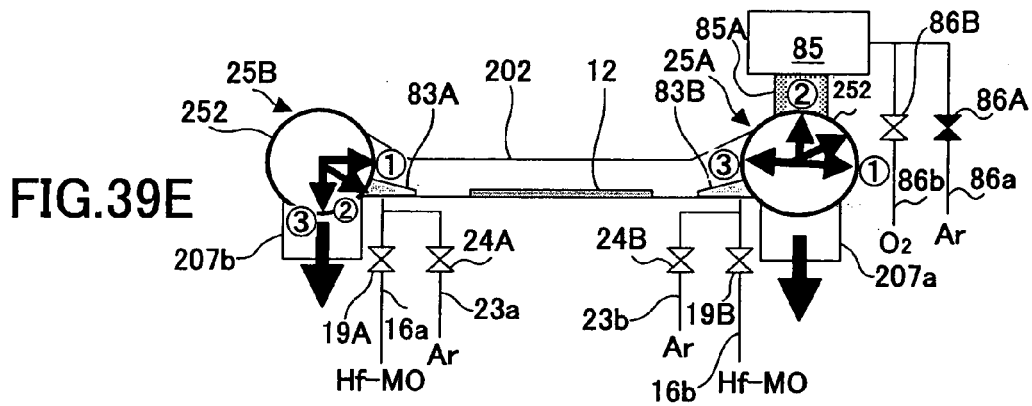

Next, in the step of FIG. 39E, the state of the high-speed rotary valve 25B is maintained as it is, and the valve body 252 in the high-speed rotary valve 25A is rotated such that the opening ② formed on the valve body 252 communicates with the conduit 85A of the remote plasma source 85 and that the opening ③ communicates with the processing space. As a result, the Ar gas including the Ar radicals activated with the remote plasma source 85 is caused to pass through the openings ② and ③ introduced into the processing space.

Figure 39F:
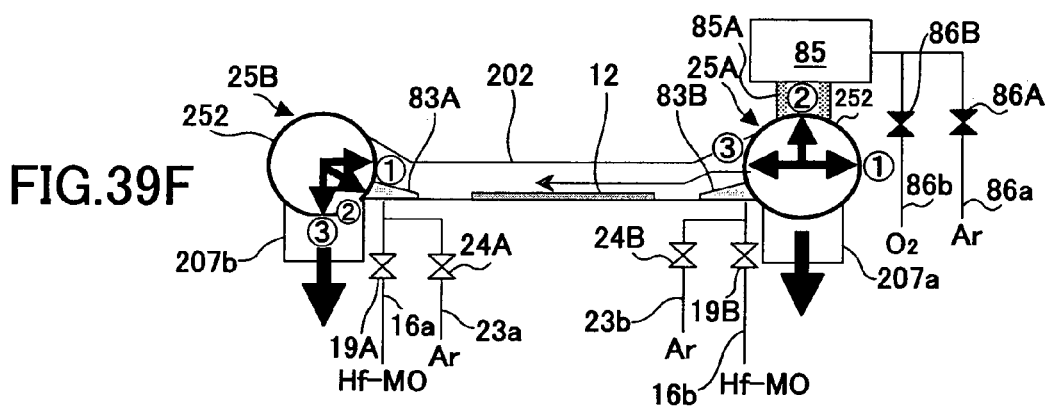

Next, in the step of FIG. 39F, the state of the high-speed rotary valve 25B is maintained as it is, and the state of the high-speed rotary valve 25A is maintained also as it is, and the valve 86B is opened in addition to the valve 86A. With this, an oxidizing gas such as an oxygen gas, for example, in the line 86b is introduced to the remote plasma source 85 together with the Ar gas in the line 86a, and the oxygen gas thus introduced is activated. As a result of activation of the oxygen gas in the remote plasma source 85, there are formed oxygen radicals O* in the remote plasma source 85, and the oxygen radicals O* thus formed are introduced into the processing space in the high-speed rotary valve 25A from the opening ② through the opening ③. The oxygen radicals O* thus formed flows along the surface of the substrate 12 to be processed and cause oxidation in the source molecules absorbed upon the surface of the substrate 12. As a result, there is formed an $HfO_2$ film on the surface of the substrate 12 to be processed in the form of one molecular layer.

Figure 39G:
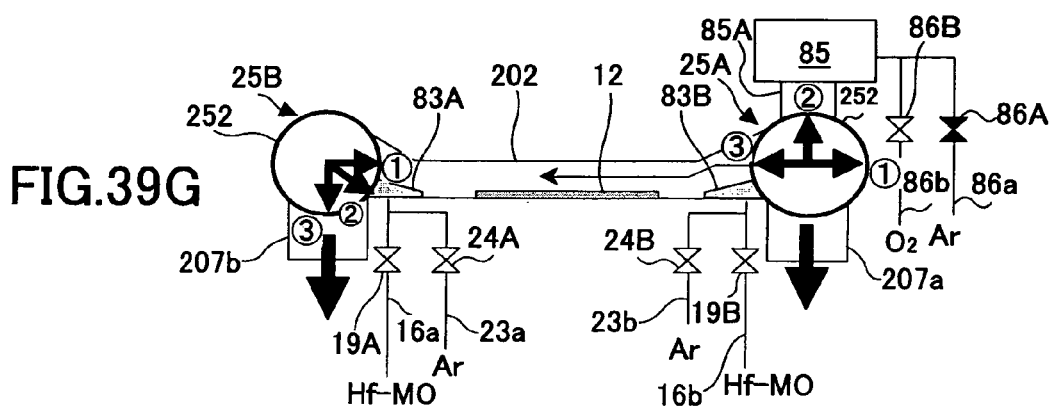

Next, in the step of FIG. 39G, the state of the high-speed rotary valves 25A and 25B is held as it is, and the valve 86B is closed, the plasma resource 85 is stopped, and the valve 86A is closed after the Ar gas is caused to flow for a predetermined period.

Figure 39H:
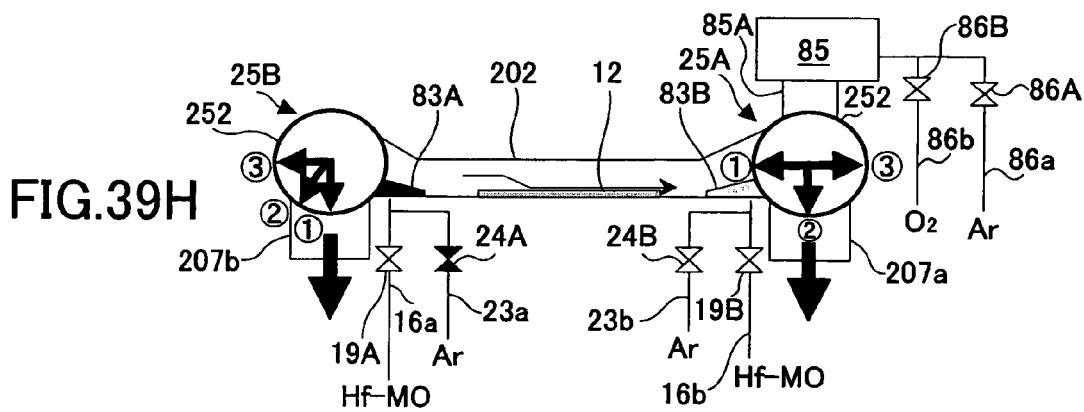

Further, in the step of FIG. 39H, the state of the high-speed rotary valve 25A is returned to the state of FIG. 39A, and the high-speed rotary valve 25B is set to the state of FIG. 39B. Further, the valve 24A is opened in this state and the Ar gas is introduced into the processing gas inlet port 83A from the purge line 23a. With this, purging of the processing gas inlet port 83A is achieved.

Further, by repeating the process of FIGS. 39A-39H, an $HfO_2$ film is formed on the surface of the substrate 12 to be processed molecular layer by one molecular layer.

According to the present embodiment, it becomes possible to suppress the interfusion of impurity such as C into the film thus formed to 1% or less, by causing oxidation in the molecules of the organic source of metal such as Hf absorbed upon the substrate to be processed by using the oxygen radicals having strong oxidation power. Further, it becomes possible to suppress the adhesion of oxidizer upon the surface of the processing vessel 202 as compared with the case of using other oxidizer such as $H_2O$ or $O_2$. With this, switching of the processing gas can be achieved efficiently by using a simple purging process. As a result, the process throughput of the ALD process is improved. Further, because oxygen radicals are used for the oxidation of the source molecules, the time needed for the oxidation processing is reduced and the processing throughput of the substrate is improved further.

In the present embodiment, too, it is possible to carry out the reverse nozzle purging process explained previously with reference to FIG. 37.

Ninth Embodiment

Figure 40:
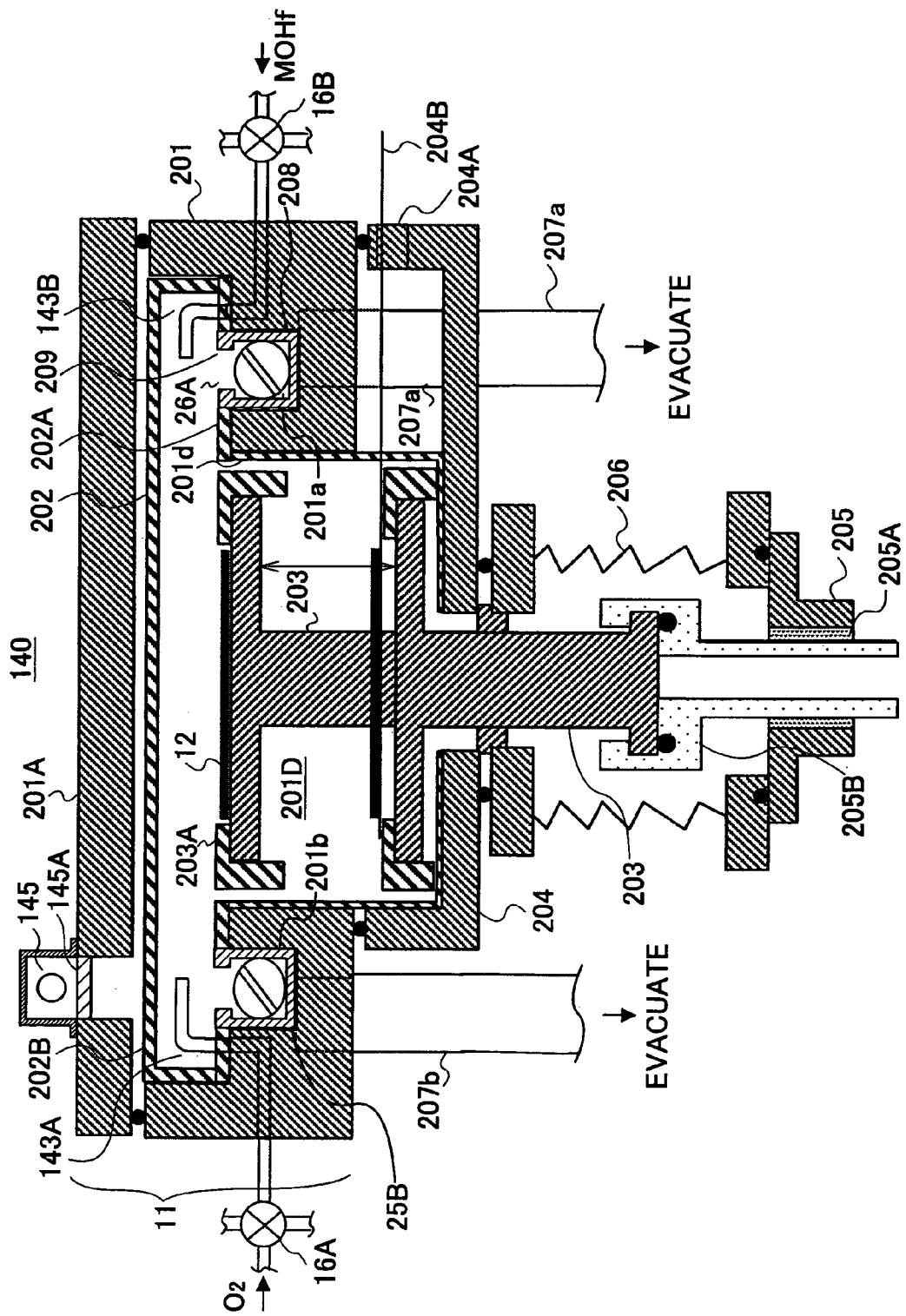
FIG. 40 is a diagram showing the construction of a deposition apparatus according to a ninth embodiment of the present invention.

FIG. 40 shows the construction of a substrate processing apparatus 140 according to a ninth embodiment of the present invention, wherein those parts in the drawing corresponding to the parts explained previously are designated with the same reference numerals and the description thereof will be omitted.

Figure 41:
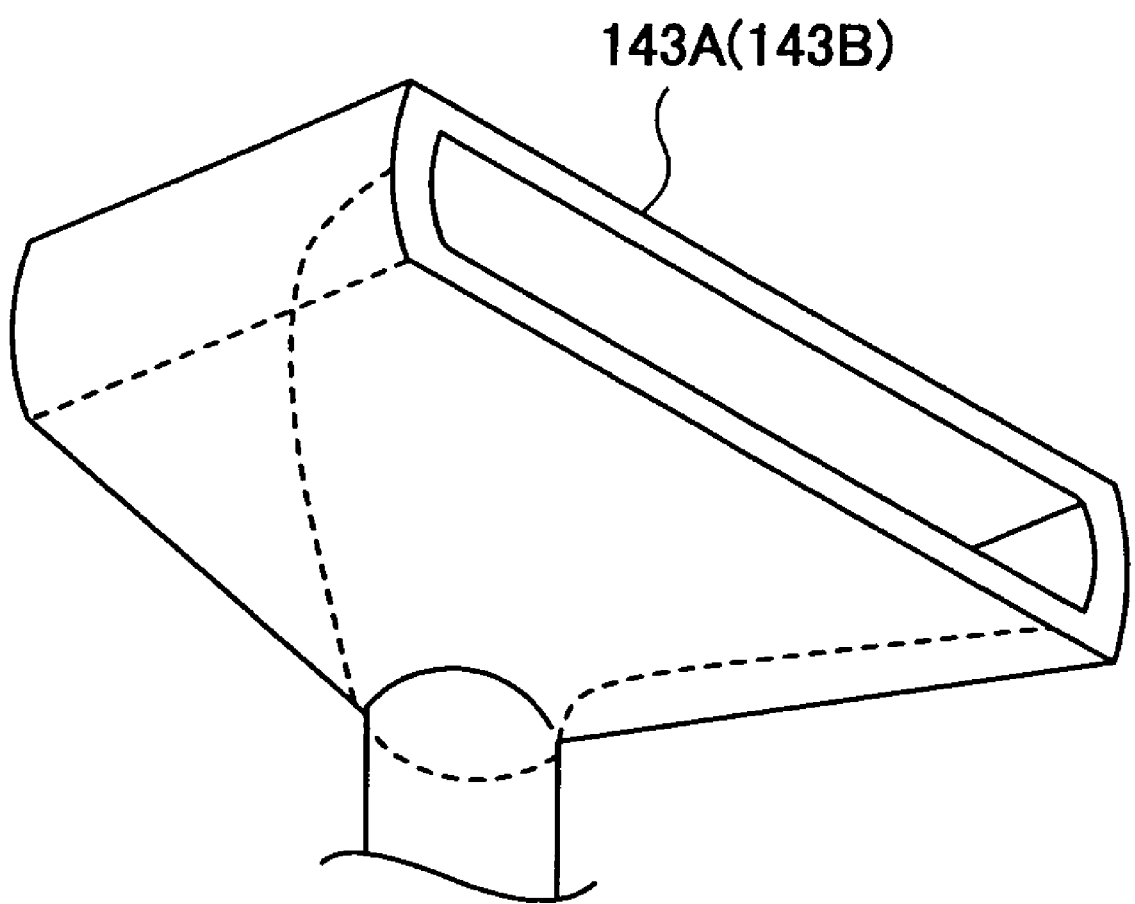
FIG. 41 is a diagram showing the construction of the nozzle used with the embodiment of FIG. 40.

Referring to FIG. 40, the substrate processing apparatus 140 has a construction similar to that of the substrate processing apparatus 40 explained previously with reference to FIG. 7, except that there are provided quartz nozzles 143A and 143B shown in FIG. 41 in place of the processing gas inlet port 13A or 13B. Further, there is formed an opening 201a having a quartz window 145A in the cover plate 201A in correspondence to the quartz nozzle 143A, and a ultraviolet source 145 is formed on the cover plate 201A in correspondence to the opening 201a.

Referring to FIG. 41, each of the quartz nozzles 143A and 143B has a flat form at a distal end part thereof and shows the characteristics in which the conductance decreases gradually toward the slit-form opening at the gas outlet side. By using the nozzle of such a construction, the processing gas is supplied to the processing space in the desired form of sheet forming a laminar flow. It should be noted that this structure is basically the one called bird's beak type gas nozzle and has the feature that the space inside the gas nozzle forms a unitary space and only the cross-sectional area in the gas outlet direction is decreased toward the direction of the gas outlet.

Thus, in the construction of FIG. 41, oxygen radicals O* are formed by supplying an oxidizing gas such as an oxygen gas, for example, to the quartz nozzle 143A and further by driving the ultraviolet optical source 145 in this state, as a result of excitation of the processing gas in the quartz nozzle 143A.

Thus, by oxidizing the molecules of the source material such as an organic metal of such as Hf, and the like, for example, adsorbed upon the surface of the substrate 12 to be processed, by using the oxygen radicals O* thus formed, it becomes possible to form a high quality film little of impurity C with the thickness of one molecular layer.

Furthermore, by providing a hot filament to the gas passage inside the quartz nozzles 143A and 143B of FIG. 41, or alternatively by coating the inner wall of the gas passage with an insolating material such as an $Al_2O_3$ film or a $TiO_2$ film, it becomes possible to facilitate excitation of radicals.

Tenth Embodiment

Next, explanation will be made on a substrate processing apparatus 150 according to a tenth embodiment of the present invention with reference to FIG. 43, in which optimization is made in the substrate processing apparatus 80 of FIG. 25 with regard to the gap G between the quartz reaction vessel 202 and the bottom plate 202A, and thus, the gap with regard to the surface of the substrate 12 to be processed 12.

Figure 43:
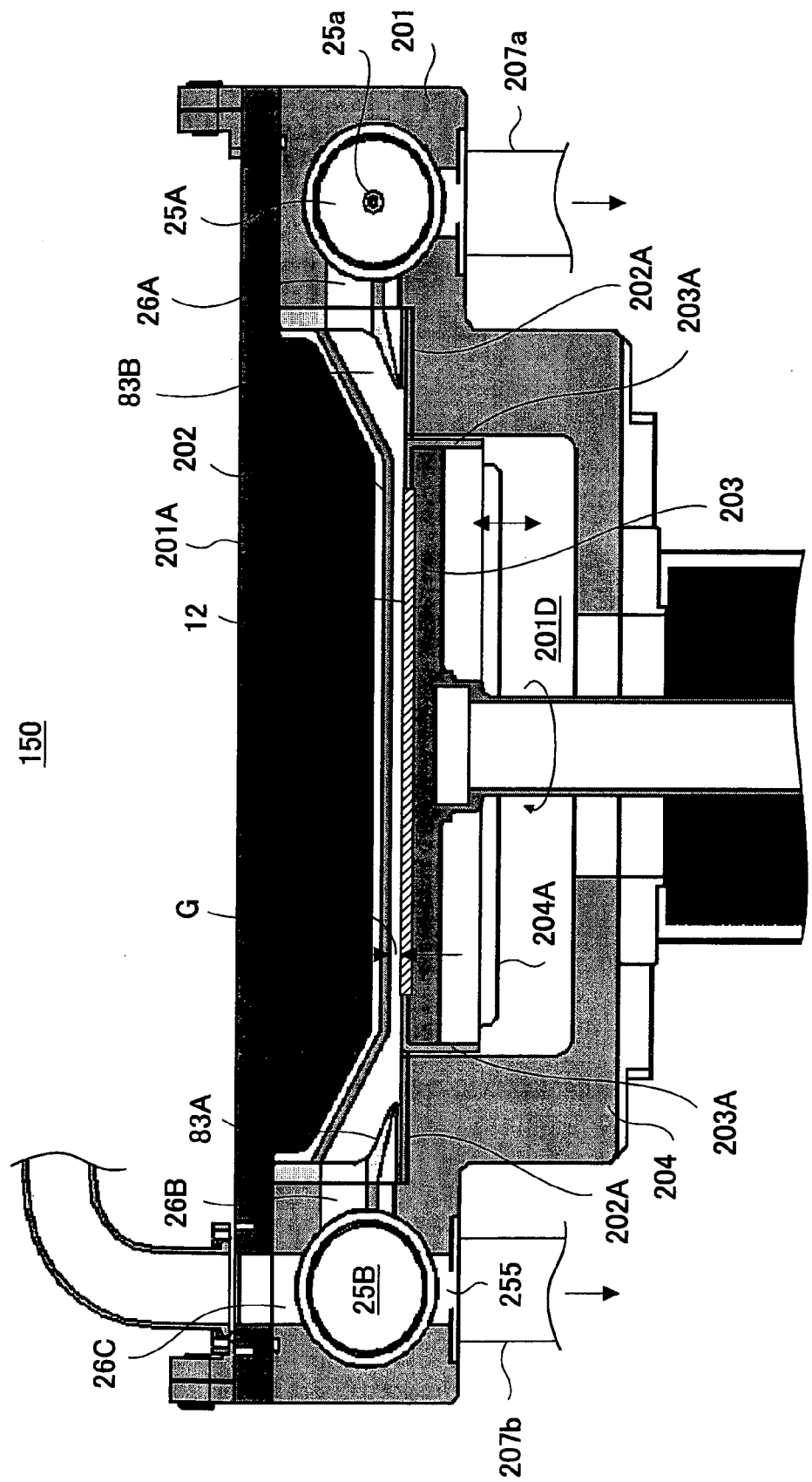
FIG. 43 is a diagram showing the construction of a deposition apparatus according to a tenth embodiment of the present invention.

Referring to FIG. 43, the object of the present embodiment is to optimize the efficiency of utilization of the source gas supplied to the processing space inside the quartz reaction vessel 202, and hence to reduce the operational cost of the substrate processing apparatus, by optimizing the foregoing gap G.

Figure 44:
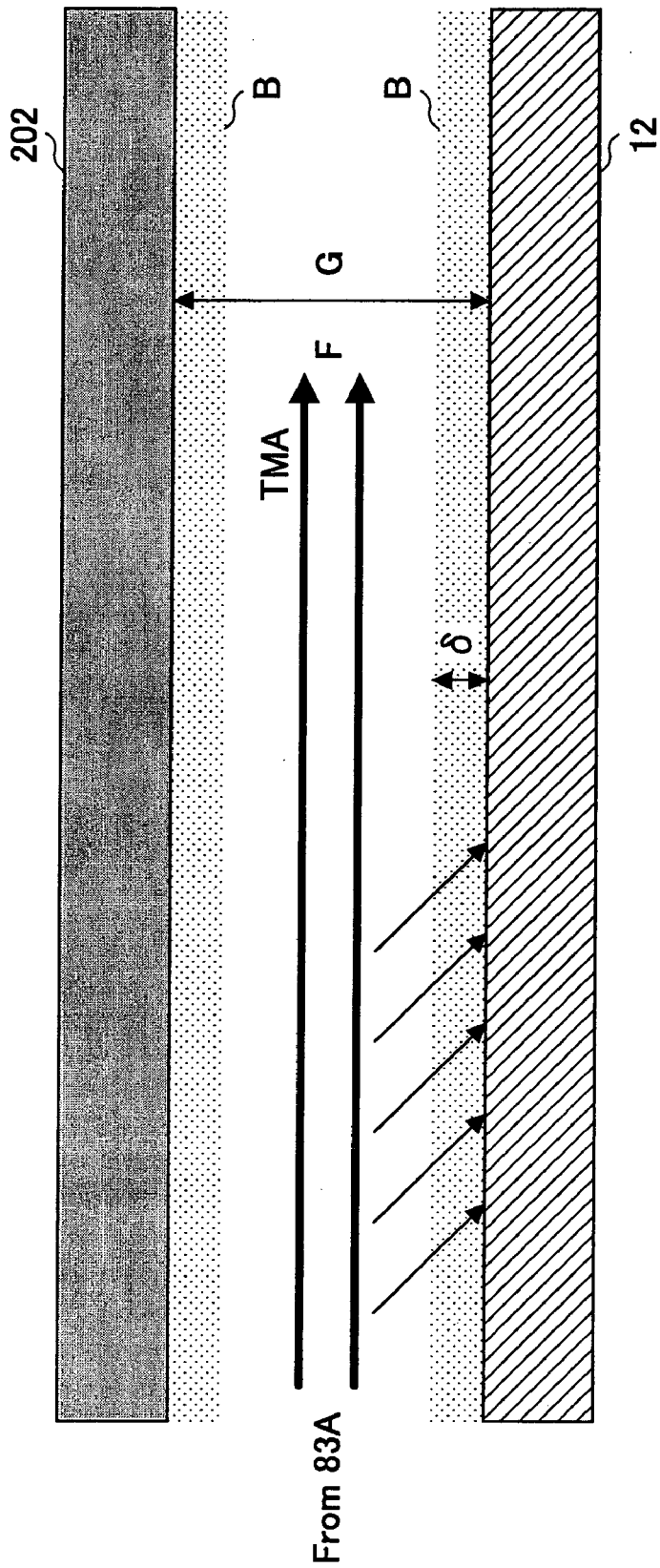
FIG. 44 is a diagram explaining the operation of the deposition apparatus of FIG. 43.

FIG. 44 shows the part of the substrate processing apparatus 150 of FIG. 43 that includes the quartz reaction vessel 202 and the substrate 12 in an enlarged scale, wherein FIGS. 43 and 44 show the state in which the surface of the substrate 12 to be processed is located at the processing position forming a flush surface with the quartz bottom plate 202A.

Referring to FIG. 44, there is formed a boundary layer B in such structure at the surface of the substrate 12 to be processed and also at the surface of the quartz reaction vessel 202 in the case a processing gas flow F of TMA, and the like, for example, supplied from the nozzle 83A, is caused to flow through the narrow space between the quartz reaction vessel 202 and the substrate 12 to be processed, wherein the processing gas molecules, such as the molecules of TMA, transported along the processing gas flow F in the form of being carried by the carrier gas, reach the surface of the substrate 12 by causing diffusion through the boundary layer B.

Thereby, the thickness δ of such a boundary layer B changes with the velocity of the TMA gas flow F in such a manner that the thickness δ increases when the fluid velocity is decreased and decreases when the fluid velocity is increased. With decrease in the thickness δ of the boundary layer B, the time for the TMA molecules released from the TMA gas flow F reach the surface of the substrate 12 to be processed by causing diffusion through the boundary layer B is reduced, and more TMA molecules reach the surface of the substrate 12 to be processed within a predetermined time period. As a result, the efficiency of utilization of the source material is improved.

It should be noted that the flow velocity of the TMA gas flow F can be increased by decreasing the height of the processing space, and hence the gap G.

FIG. 45 shows the relationship between the gap G and a TMA gas supplying interval until the surface of the substrate 12 to be processed is saturated with the TMA molecules, wherein the horizontal axis of FIG. 45 shows the volume of the processing space inside the quartz reaction vessel 202. Because the diameter of the processing space is maintained unchanged, the volume of the processing space corresponds to the gap G. On the other hand, the vertical axis of FIG. 45 shows the time of supplying the TMA gas until the surface of the substrate to be processed is saturated with the TMA molecules thus absorbed. The smaller this value is, the shorter becomes the time until the saturation adsorption is achieved. Further, the adsorption rate, which shows the proportion of the supplied TMA gas that has caused the adsorption to the substrate surface, is increased with this.

FIG. 45 shows the result of simulation for the case of setting the bubbler temperature of TMA to 25° C. and the vapor pressure to 1.5 kPa (11 Torr), wherein it can be seen that the adsorption rate of the TMA molecule is 13% in the case that gap G is 40 mm while in the case the gap G is 20 mm, the adsorption rate is improved to 14%. Further, it can be seen that the adsorption rate improves to 30%, n the case that gap G is reduced to 8 mm. In FIG. 45, ① shows the proportion of the TMA molecules absorbed upon the substrate 12 to be processed, while ② shows the proportion of the TMA molecules 12 discharged without being absorbed by the substrate 12 to be processed.

Thus, it is confirmed that the thickness δ of the boundary layer B formed on the surface of the substrate 12 to be processed is decreased in the processing space by decreasing the gap G, and the efficiency of utilization of the source gas at the time of the film formation process is improved as a result of improvement of the adsorption rate.

On the other hand, in the case the gap G is decreased further and set to about 0.5-1.0 mm, on the other hand, the flow velocity of the source gas can reach the sonic velocity, provided that the vacuum evacuation performance is sufficiently large, and further increase of the speed becomes not possible. Further, in the case that the performance of vacuum evacuation is insufficient, there can be caused a decrease of the gas flow velocity. Thus, although there exists a dependency on the vacuum evacuaton performance, it is generally concluded that there occurs a decrease in the width of the boundary layer with increase of the flow velocity of the source gas with decrease of the gap to the value of about 0.5-1.0 mm. As a result, diffusion of the source gas is increased and the efficiency of absorption is increased. On the other hand, further decrease of the gap cannot provide such improvement of the efficiency of utilization of the source material.

From the situation noted above, it is thought that the height G of the flat processing space preferably set to the range of 0.5-20 mm, preferably 0.5-8 mm, more preferably 0.5-3.5 mm.

Eleventh Embodiment

Figure 46A:
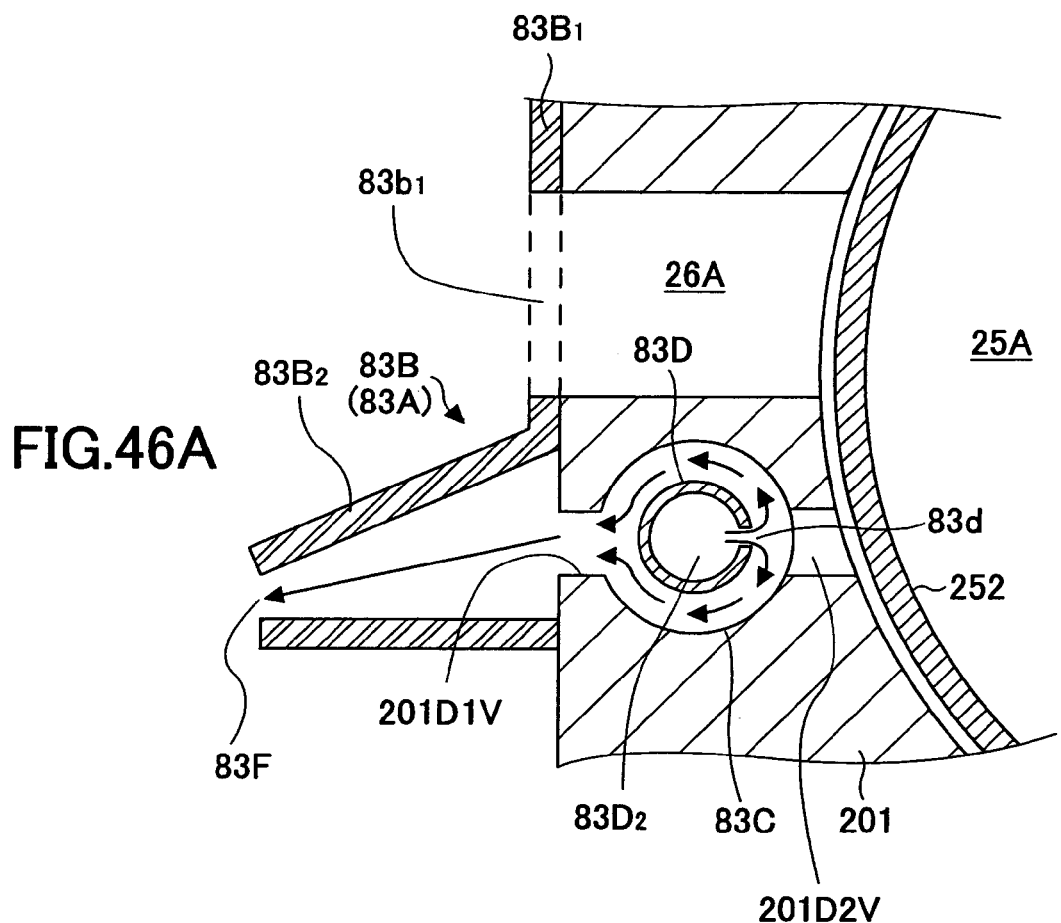
FIGS. 46A and 46B are diagrams showing a part of the deposition apparatus according to an eleventh embodiment of the present invention.
Figure 46B:
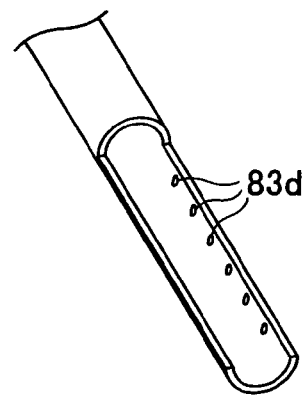

FIGS. 46A and 46B show the construction of the substrate processing apparatus 90 of FIG. 32 for the part in the vicinity of the processing gas inlet port 83B used therein in detail. It should be noted that a similar construction is used also with regard to the processing gas inlet port 83A. However, the explanation of processing gas inlet port 83A will be omitted.

Referring to FIG. 46A, the processing gas inlet port 83B comprises the main body $83B_1$ and the bird's beak-form nozzle part $83B_2$ as explained before with reference to FIG. 33, wherein the main body $84B_1$ is mounted upon the end part of the processing vessel 201 where the high-speed rotary valve 25A is provided such that the opening $83b_1$ therein communicates with the evacuation opening 26A, which is formed in the processing vessel 201 in communication with the high-speed rotary valve 25A.

In the foregoing end part, there is formed a cylindrical space 83C in communication with the high-speed rotary valve 25A via a space $202D_2$, wherein a pipe 83D formed with a large number of minute openings $83d$ as shown in FIG. 46B is inserted into the space 83C.

The pipe 83D is supplied with a purge gas or source gas through the valve 19B or 24B not shown in FIG. 46A at a hollow space $83D_2$ formed therein, and the Gas thus supplied flows out into the space 83C from the openings $83d$, wherein the gas thus supplied flows out from the space 83C via the bird's beak form nozzle 83B into the processing space inside the quartz reaction vessel 202 consecutively through an opening $201D_1$ formed in the processing vessel 201 in communication and in correspondence with the bird's beak form nozzle part $83B_2$, the bird's beak-form nozzle part $83B_2$, and further through a slit-form nozzle opening 83F formed at the tip end of the nozzle part $83B_2$. Thereby, the gas thus discharged into the quartz reaction vessel 202 from the opening 83F forms the desired sheet-like laminar flow.

In FIG. 46A, it should be noted that the openings $83d$ are formed in the pipe 83D at the side away from the opening $201D_1$ and hence the bird's beak form nozzle 83B. With this, the gas discharged from the space $83D_2$ in the pipe 83D is homogenized before it enters into the nozzle part $83B_2$ of the bird's beak nozzle 83B. Further, it is possible to replace the openings $83d$ in the pipe 83D by one or more of slit-like openings.

As mentioned before, the same construction can be used also for the bird's beak nozzle 83A provided at the opposite side of the processing vessel 201.

FIG. 47 is a plan view of the construction of FIG. 46A.

Referring to FIG. 47, the opening $83d$ is formed in the pipe 83D in the direction opposite to the nozzle 83B, and as a result, the gas that has flowed out through the opening $83d$ is homogenized in the cylindrical form space 83C. Thereby, a uniform laminar flow free from fluctuation of flow rate in the axial direction of pipe 83D is obtained from the nozzle 83B.

In the aforementioned explanation, the present invention has been explained for the case of formation of the $HfO_2$ film or $Al_2O_3$ film. However, the present invention is not limited to the film formation process of such a particular system but the application is possible also for the formation of various films such as a $ZrO_2$ film, $HfSiO_4$ film, $ZrSiO_4$ film, $Ta_2O_5$ film, and the like.

Further, while the substrate processing apparatus and the processing method of the present invention explained heretofore is extremely useful in an ALD process in which a film is deposited on the surface of the substrate to be processed one molecular layer by one molecular layer, they are useful also in the film formation process not limited to the atomic layer growth, such as an MOCVD process.

Furthermore, in the case of running the substrate processing apparatus that uses the high-speed rotary valves 25A and 25B explained before, there can occur a waiting time of generally 5 minutes or more between a job for one lot and the job for the next lot.

Meanwhile, because the valve body 252 is rotated at high speed back and forth repeatedly within a specified angular range such as 0 degree to 90 degree in the high-speed rotary valve 25A or 25B, as explained previously, there is a tendency that the bearing part undergoes asymmetric wear.

In order to avoid this problem, it is preferable that the valve body 252 is rotated continuously at low speed of 100 RPM or less, preferably about 10 RPM.

In such idling state of the substrate processing apparatus, it is preferable that the interior of the processing vessel 201 is evacuate to vacuum state, and that the stage 203 is held at the descended transportation position (home position). Further, it is preferable that the stage 203 is held to an ordinary process temperature such as 400° C. in preparation for resumption of the process and flow the purge gas with low flow rate inside the processing vessel 201.

Twelfth Embodiment

Figure 48A:
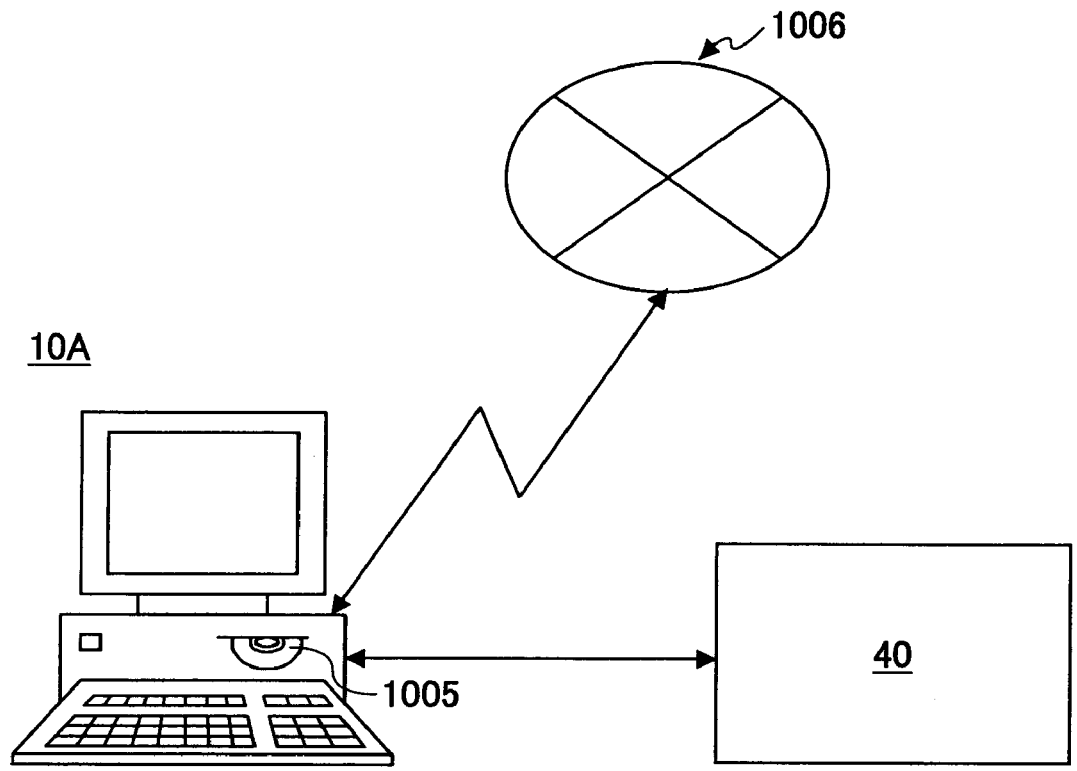
FIGS. 48A and 48B are diagrams showing the construction of a controller according to a twelfth embodiment of the present invention.

FIG. 48A shows a computer used for the controller 10A for controlling the substrate processing apparatus 40 of the present invention.

Figure 48B:
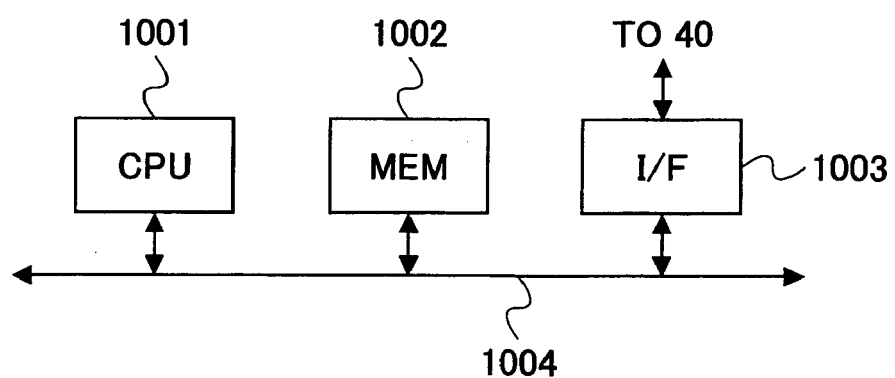

Referring to FIGS. 48A and 48B, the computer 10A includes a CPU 1001, a memory 1002 holding a program and data and an interface unit 1003 connected with each other by a system bus 1004, wherein the computer 10A is provided with a program for controlling the substrate processing apparatus from a recording medium 1005 such as an optical disk or from a network 1006 and controls the substrate processing apparatus 40 of FIG. 13 according to the flowchart of FIG. 14.

Referring to FIG. 13, it can be seen that the computer 10A controls the high-speed rotary valves 25A and 25B and also the switching valves 16A and 16B with the program provided thereto, and the film formation process is achieved as explained with reference to FIG. 14.

Further, the computer 10A of FIGS. 48A and 48B can control the substrate processing apparatus 60 of FIG. 18 with the program provided thereto according to the flowchart of FIG. 19 or the substrate processing apparatus 80 of FIG. 25 according to the flowchart of FIG. 30.

Further, the computer 10A of FIGS. 48A and 48B can control the substrate processing apparatus 90 of FIG. 32 with the program provided thereto such that the substrate processing apparatus carries out the processing of FIGS. 35A-35H or FIGS. 36A and 36B explained previously.

Further, the computer 10A of FIGS. 48A and 48B can control the substrate processing apparatus 120 of FIGS. 38A-38C such that the substrate processing apparatus carries out the processing of FIGS. 35A-35H or FIGS. 36A and 36B explained previously.

Further, the computer 10A of FIGS. 48A and 48B can control the substrate processing apparatus 140 of FIG. 40 or the substrate processing apparatus 150 according to the program provided thereto.

The present invention also includes such a computer configured by the program code means recorded on a processor-readable medium and also the processor readable medium that carries such a program code.

Further, while the present invention has been explained heretofore with regard to preferred embodiments, the present invention is not limited to such a particular embodiment and various variations and modifications may be made within the scope described in the claims.

According to the present invention, the conductance of evacuation opening provided to a processing vessel is controlled, in an ALD deposition apparatus achieves film growth by switching source gases alternately, variably by a high-speed rotary valve provided to the processing vessel. Thereby, a film growth of one molecular layer is achieved stably by controlling the conductance to a specified value. Further, by controlling the conductance to the maximum, it become possible to purge the interior of the processing vessel with high speed, and it becomes possible to perform the film growth efficiently while using an ALD process. Further, according to the present invention, it becomes possible to change the conductance of the evacuation opening continuously, and hence according to the used source gas. Thereby, the ALD process is stabilized further.

According to the present invention, it becomes possible to introduce a processing gas and radicals into a processing vessel alternately and repeatedly by using a high-speed rotary valve having a rotatable valve body provided with plural slit-form openings and by rotating a valve body at high speed. As a result, by applying a radical processing to the processing gas molecules absorbed upon the surface of the substrate to be processed, it becomes possible grow a high quality film on the surface of the substrate to be processed effectively one atomic layer by one atomic layer. Thereby, by providing a bypass line connected to the evacuation system to the radical source, it becomes possible to construct such that the radicals are evacuated to the bypass line in the state in which the processing gas is introduced into the processing vessel and that the radicals are introduced into the processing vessel from the radical source only in the case of conducting a reaction such as oxidation reaction to the processing gas molecules thus absorbed. Thereby, it becomes possible to drive the radical source such as a remote plasma source stably and continuously, and there occurs no problem such as the radical formation becomes unstable even in the case that the cycle time is reduced in the atomic layer CVD processing. As a result, the throughput of the substrate processing is improved.

Further, according to the present invention, it becomes possible to carry out the atomic layer CVD processing efficiently by using an ultraviolet radical oxidation processing apparatus used for the oxide film formation on the silicon substrate surface, by using an ultraviolet optical source that can perform stable ON and OFF operation, for the radical source.

Further, according to the present invention, it becomes possible to clean the interior of the processing vessel efficiently by coupling a radical source of the cleaning gas to a part of the evacuation system connected to the evacuation opening used for evacuating the processing vessel and by introducing the radicals of the cleaning gas into the processing vessel in a reverse manner direction of the evacuation system.

What is claimed is:

1. A substrate processing method in a substrate processing apparatus, said substrate processing apparatus comprising: a processing vessel provided with a stage for holding a substrate to be processed thereon, said processing vessel being evacuated at an evacuation port; and a processing gas supplying system supplying a processing gas to said processing vessel in the form of a laminar flow along a surface of said substrate to be processed, said evacuation port having an evacuation opening extending in a direction generally perpendicular to a direction of said laminar flow, said evacuation port being engaged with a valve having a hollow cylindrical member formed with an opening corresponding to said evacuation opening of said evacuation port wherein said valve has a rotation mechanism that causes a rotation of said hollow cylindrical member, said rotation mechanism changes a position of said opening via said rotation of said hollow cylindrical member for controlling a conductance of said evacuation port when said substrate processing apparatus is carrying out processing of a substrate, said rotation mechanism causing said hollow cylindrical member to rotate continuously when said substrate processing apparatus is in an idling state, said substrate processing method comprising the steps of:

setting said opening to a first position by rotating said hollow cylindrical member with a first rotational angle and evacuating an interior of said processing vessel from said evacuation port; and setting said opening to a second position by rotating said hollow cylindrical member with a second rotational angle smaller than said first rotational angle and supplying a processing gas to said processing vessel from said processing gas supplying system.

2. A substrate processing method in a substrate processing apparatus, said substrate processing apparatus comprising: a processing vessel provided with a stage holding thereon a substrate to be processed; a first processing gas inlet port formed in said processing vessel at a second side of said stage, said first processing gas inlet port supplying a processing gas to said substrate to be processed in the form of a laminar flow; a second processing gas inlet port formed in said processing vessel at a first side different from said first side of said stage, said second processing gas inlet port supplying a second processing gas to said substrate to be processed in the form of a laminar flow; a first evacuation port formed in said processing vessel at said first side, said first evacuation port extending in a direction generally perpendicular to a direction of said laminar flow from said first processing gas supplying port; a second evacuation port formed in said processing vessel at said second side, said second evacuation port extending in a direction generally perpendicular to a direction of said laminar flow form said second processing gas supplying port; a first valve engaging with said first evacuation port and having a first hollow cylindrical member, said first hollow cylindrical member having a first opening corresponding to said first evacuation port; a first rotation mechanism causing rotation of said first hollow cylindrical member; a second valve engaging with said second evacuation port and having a second second hollow cylindrical member, said second hollow cylindrical member having a second opening corresponding to said second evacuation port, and a second rotation mechanism causing rotation of said second hollow cylindrical member, said first opening being movable with respect to said first evacuation port in a direction generally perpendicular to an elongating direction of said first evacuation port as a result of rotation of said first hollow cylindrical member, said second opening being provided movably with respect to said second evacuation port in a direction generally perpendicular to an elongating direction of said second evacuation port as a result of rotation of said second hollow cylindrical member, said first opening changing position thereof as a result of displacement of said first hollow cylindrical member, said second opening changing position thereof as a result of displacement of said second hollow cylindrical member, said substrate processing method comprising the steps of:

evacuating an interior of said processing vessel by said first and second openings to a fully opened position;

introducing said first processing gas into said processing vessel from a first processing gas supplying system by setting said first opening to a first position and by setting said second opening to a second position of smaller conductance than said first opening at said first position;

evacuating an interior of said processing vessel by setting said first and second openings to said fully opened position; and introducing said second processing gas into said processing vessel from a second processing gas supplying system by setting said second opening to a third position and by setting said first opening to a fourth position smaller conductance than said second opening at said third position, wherein said first opening is moved back and forth between said fully opened position, said first position and said fourth position and said second opening is moved back and forth between said fully opened position, said second position and said third position when said substrate processing apparatus is carrying out processing of said substrate, said first and second hollow cylindrical members are caused to rotate continuously when said substrate processing apparatus is in an idling state.

* * * * *